(12) United States Patent
Kim et al.

(10) Patent No.: US 10,069,080 B2
(45) Date of Patent: Sep. 4, 2018

(54) ORGANIC LIGHT EMITTING DISPLAY DEVICE

(71) Applicant: LG DISPLAY CO., LTD., Seoul (KR)

(72) Inventors: Dohan Kim, Goyang-si (KR); Jungkeun Kim, Seoul (KR); Jeongdae Seo, Incheon (KR)

(73) Assignee: LG DISPLAY CO., LTD., Seoul (KR)

(*) Notice: Subject to any disclaimer, the term of this patent is extended or adjusted under 35 U.S.C. 154(b) by 98 days.

(21) Appl. No.: 15/139,074

(22) Filed: Apr. 26, 2016

(65) Prior Publication Data
US 2017/0148995 A1    May 25, 2017

(30) Foreign Application Priority Data
Nov. 25, 2015    (KR) .................. 10-2015-0165741

(51) Int. Cl.
*H01L 51/00* (2006.01)
*H01L 51/50* (2006.01)

(52) U.S. Cl.
CPC ...... *H01L 51/0067* (2013.01); *H01L 51/0052* (2013.01); *H01L 51/0054* (2013.01); *H01L 51/0056* (2013.01); *H01L 51/0058* (2013.01); *H01L 51/5044* (2013.01); *H01L 51/5072* (2013.01); *H01L 51/5076* (2013.01)

(58) Field of Classification Search
CPC ............................ H01L 51/00; H01L 51/0067
USPC ....................................................... 428/690
See application file for complete search history.

(56) References Cited

U.S. PATENT DOCUMENTS

2013/0146850 A1    6/2013   Pieh et al.

FOREIGN PATENT DOCUMENTS

| | | |
|---|---|---|
| CN | 103165817 A | 6/2013 |
| CN | 104507927 A | 4/2015 |
| CN | 104716268 A | 4/2015 |
| JP | 2012-82136 A | 4/2012 |
| WO | WO 2015/152633 A1 | 10/2015 |

*Primary Examiner* — Duc Truong
(74) *Attorney, Agent, or Firm* — Birch, Stewart, Kolasch & Birch, LLP

(57) ABSTRACT

An organic light emitting display device is discussed. The organic light emitting display device may include at least one light emitting part between an anode and a cathode, the light emitting part including at least one organic layer and a light emitting layer, wherein the organic layer includes an organic compound, and the organic compound includes a triazine compound having a substituent with a steric effect.

11 Claims, 2 Drawing Sheets

ORGANIC LIGHT EMITTING DISPLAY DEVICE

This application claims the priority benefit of Korean Patent Application No. 10-2015-0165741 filed on Nov. 25, 2015, which is incorporated herein by reference for all purposes as if fully set forth herein.

BACKGROUND

Field of the Invention

The present disclosure relates to an organic light emitting display device, and more particularly, to an organic light emitting display device which can reduce operating voltage and improve quantum efficiency and lifetime.

Discussion of the Related Art

Image displays used for displaying a variety of information on the screen are one of the core technologies of the information and communication era. Such image displays have been developed to be thinner, lighter, and more portable, and furthermore to have high performance. With the development of the information society, various demands for display devices are on the rise. To meet these demands, research on panel displays such as liquid crystal displays (LCD), plasma display panels (PDP), electroluminescent displays (ELD), field emission displays (FED), organic light emitting diodes (OLED), etc. is actively under way.

Among these types of flat panel displays, the OLED devices are advantageous in that they can be fabricated on a flexible substrate such as plastic, operate at a low voltage of 10 V or less, have lower power consumption, and deliver vivid color reproduction, as compared with plasma display panels or inorganic light emitting displays. Also, the organic light emitting display devices are spotlighted as the next-generation display devices that provide rich colors for its ability to render full color images using three colors—red, green, and blue.

An organic light emitting display device can be formed by sequentially stacking an anode, a hole injection layer, a hole transport layer, a light emitting layer, an electron transport layer, an electron injection layer, and a cathode. An exciton is formed by the recombination of electrons and holes injected from the two electrodes. A singlet exciton is involved in fluorescence, and a triplet exciton is involved in phosphorescence. Recently, a shift from fluorescent materials to phosphorescent materials is taking place. This is because the fluorescent materials can only use about 25% singlet excitions formed in a light emitting layer to generate light, with 75% triplet excitons lost as heat, whereas the phosphorescent materials have a luminescence mechanism that converts all the excitons into light.

A luminescence process of a phosphorescence light emitting diode will be explained briefly. Holes injected from the anode and electrons injected from the cathode meet at the host material of the light emitting layer. That is, electron and hole pairs mostly meet at the host because of the high concentration of the host although some of them meet at the dopant. In this instance, the singlet excitons formed at the host undergo an energy transition to a singlet or triplet state of the dopant, and the triplet excitons undergo an energy transition to a triplet state of the dopant.

Because the excitons transferred to the singlet state of the dopant are then transferred to the triplet state of the dopant by intersystem crossing, the first destination for all the excitons is a triplet level of the dopant. These excitons formed are transferred to a ground state and generate light. In this case, if the triplet energy of a hole transport layer or electron transport layer adjacent to the front or back of the light emitting layer is lower than the triplet energy of the dopant, a reverse energy transition takes place from the dopant or host to the hole transport layer or electron transport layer, which results in a significant decrease in efficiency. Accordingly, the triplet energy of the hole/electron transport layers, as well as that of the host material of the light emitting layer, plays a highly important role in phosphorescent light emitting diodes.

In order to stably run an organic light emitting display device, it is important that holes injected from the anode and electrons injected from the cathode form excitons while maintaining charge balance in the light emitting layer. However, an excess of holes are left after the exciton formation because the holes have faster mobility than the electrons, and this excess of holes generate charged polarons in the light emitting layer or electron transport layer, thus making the device unstable due to exciton-polaron quenching, etc. In this regard, there are ongoing studies to improve the efficiency and lifetime of organic light emitting display devices by maintaining charge balance in the light emitting layer.

SUMMARY

Accordingly, the present disclosure is directed to an organic light emitting display device which can improve its efficiency and lifetime.

To achieve these and other advantages and in accordance with the purpose of the disclosure, as embodied and broadly described, an exemplary embodiment of the present disclosure provides an organic light emitting display device comprising at least one light emitting part between an anode and a cathode and comprising at least one organic layer and a light emitting layer, wherein the organic layer comprises an organic compound, and the organic compound includes a triazine compound having a substituent with a steric effect.

The organic layer includes an electron transport layer. The organic compound has an asymmetrical substitution form around the triazine compound. The substituent includes an aryl group of at least 10 or more carbon atoms.

The light emitting part comprises at least two or more light emitting parts, and one of the light emitting parts is a blue light emitting part and the another one of the light emitting parts is a yellow-green light emitting part.

The organic compound is represented by the following Chemical Formula 1:

[Chemical Formula 1]

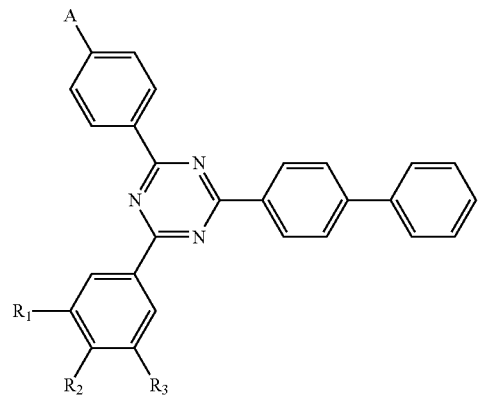

wherein A includes one among hydrogen and a phenyl group, $R_1$ to $R_3$ include independently one among hydrogen and an aryl group of 10 to 30 carbon atoms, with at least one among $R_1$ to $R_3$ being an aryl group, except for the case that $R_1$ to $R_3$ are all hydrogen.

Further, $R_1$ to $R_3$ include independently one among the following compounds:
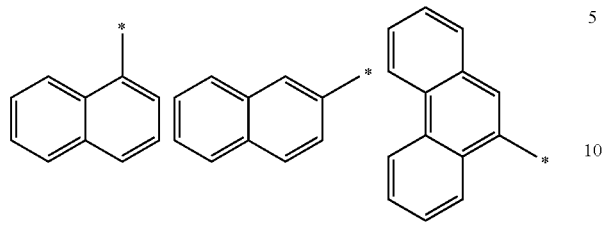
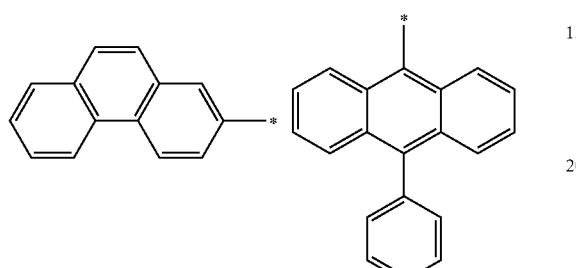
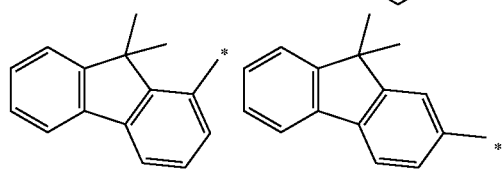
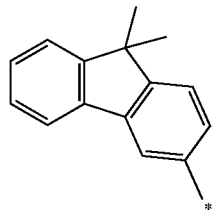
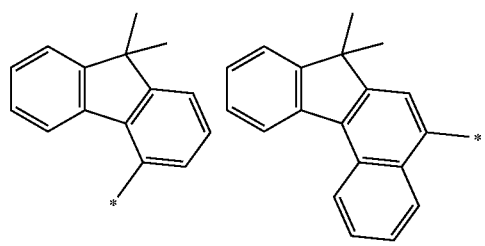
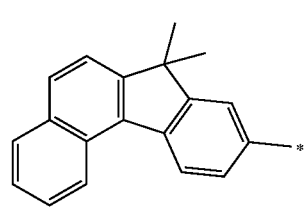
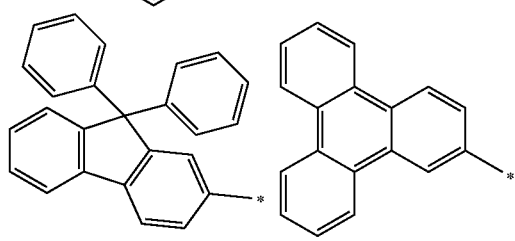
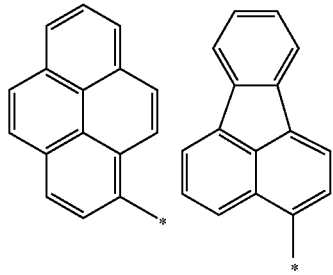
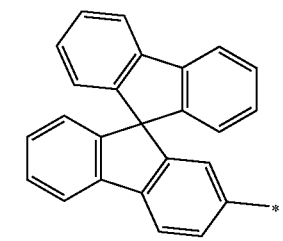 [SMILES: *c1ccc2c(c1)C1(c3ccccc3-c3ccccc31)c1ccccc1-2]
The organic compound represented by Chemical Formula 1 includes one among the following compounds:
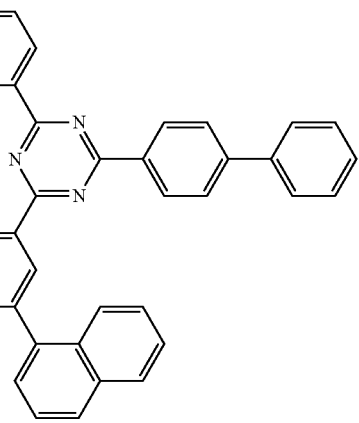

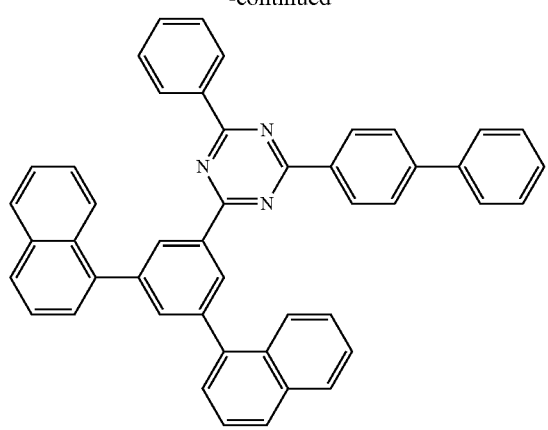
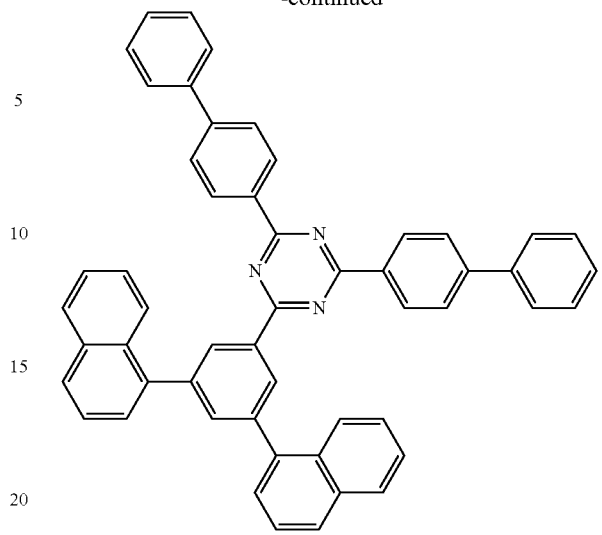
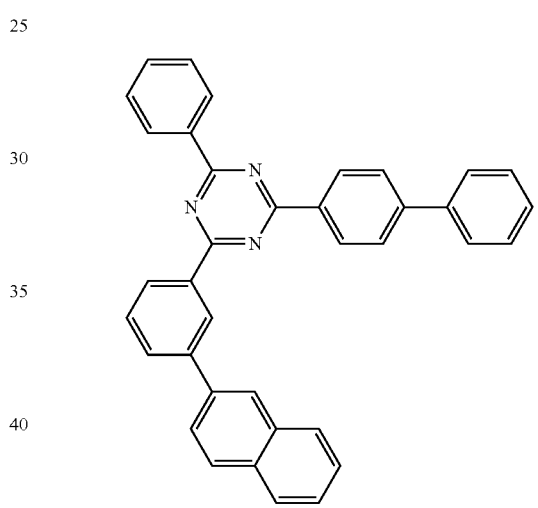
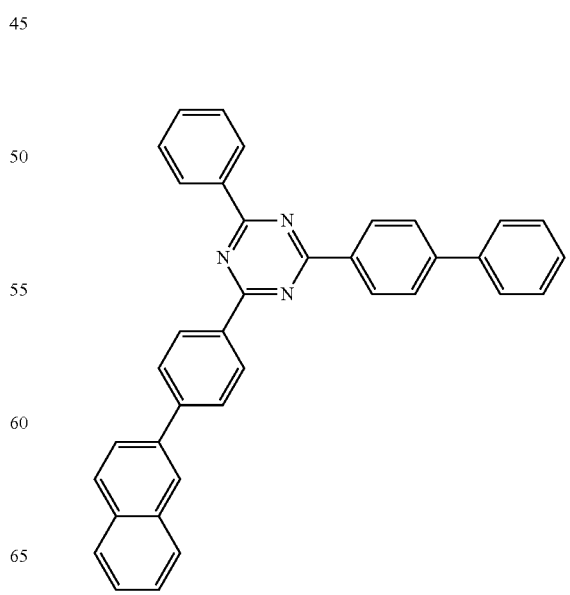

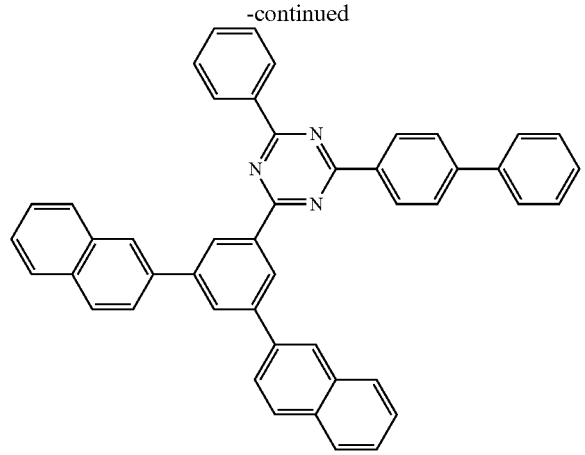
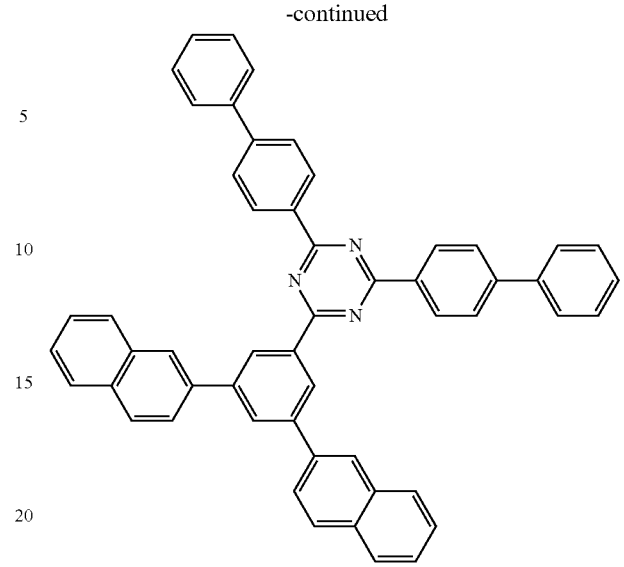
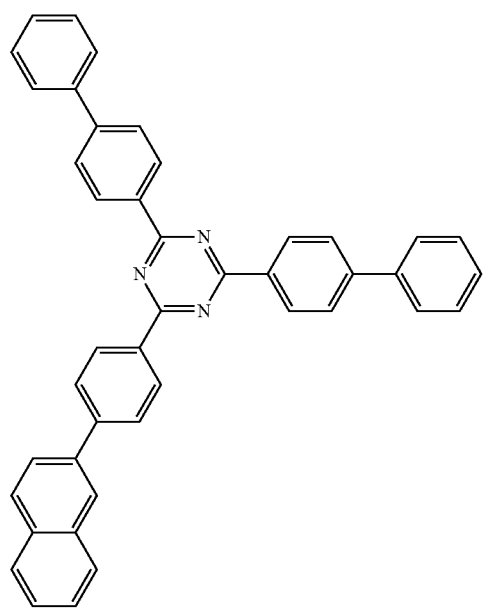

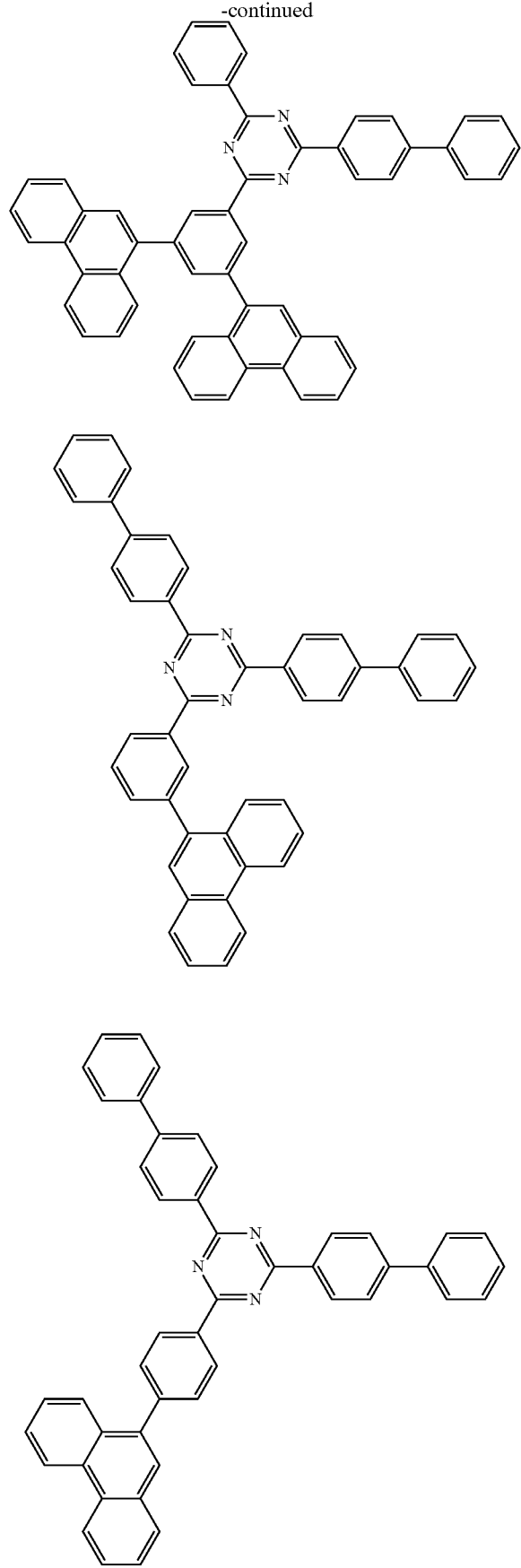
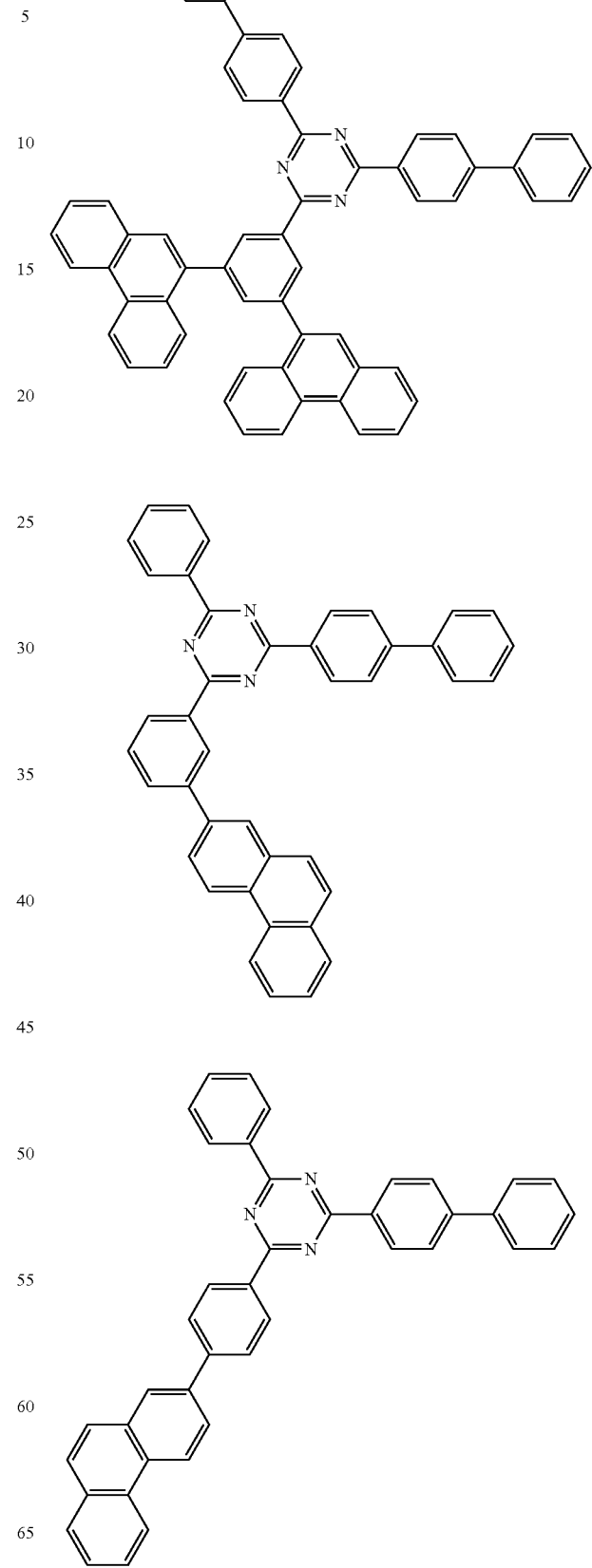

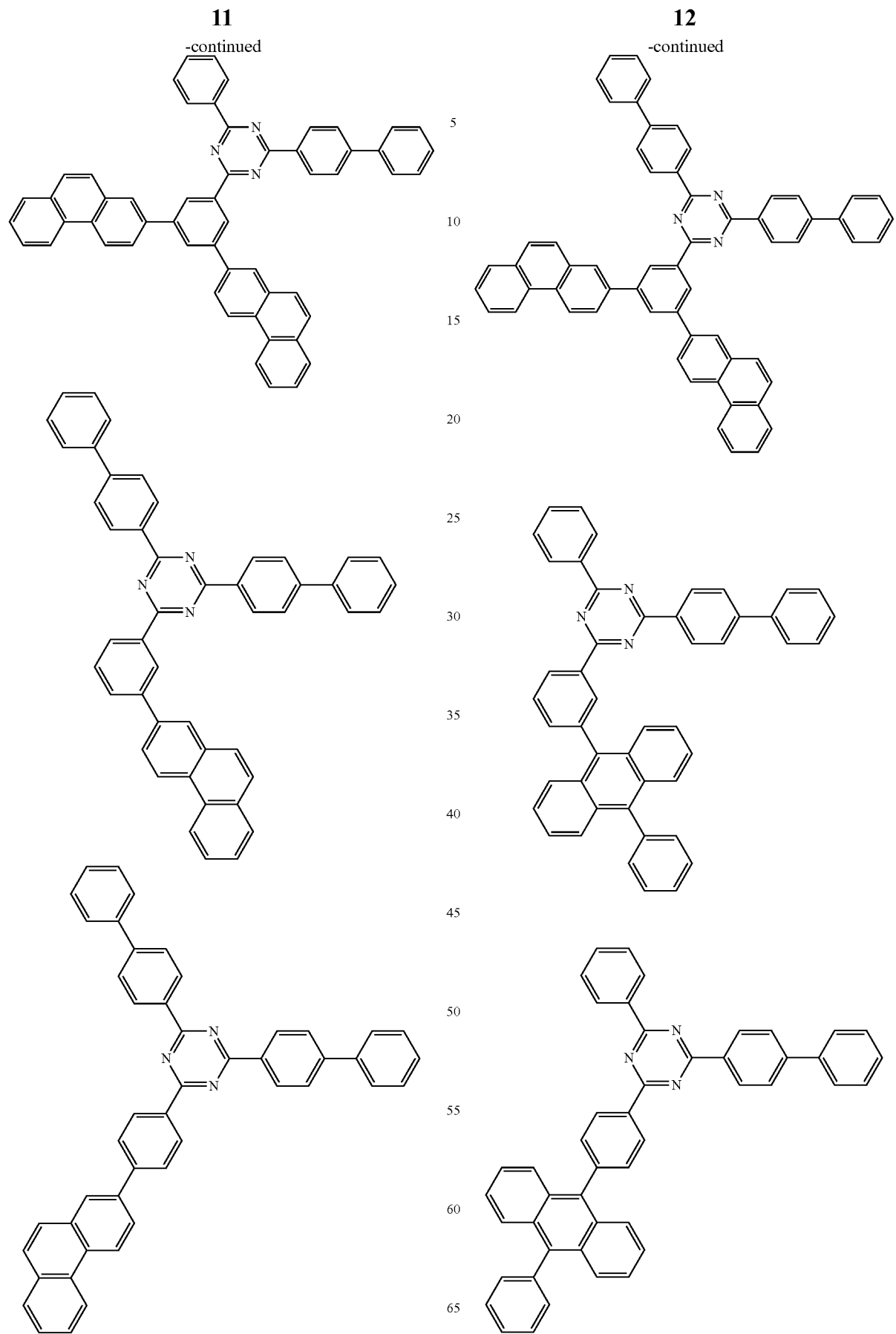

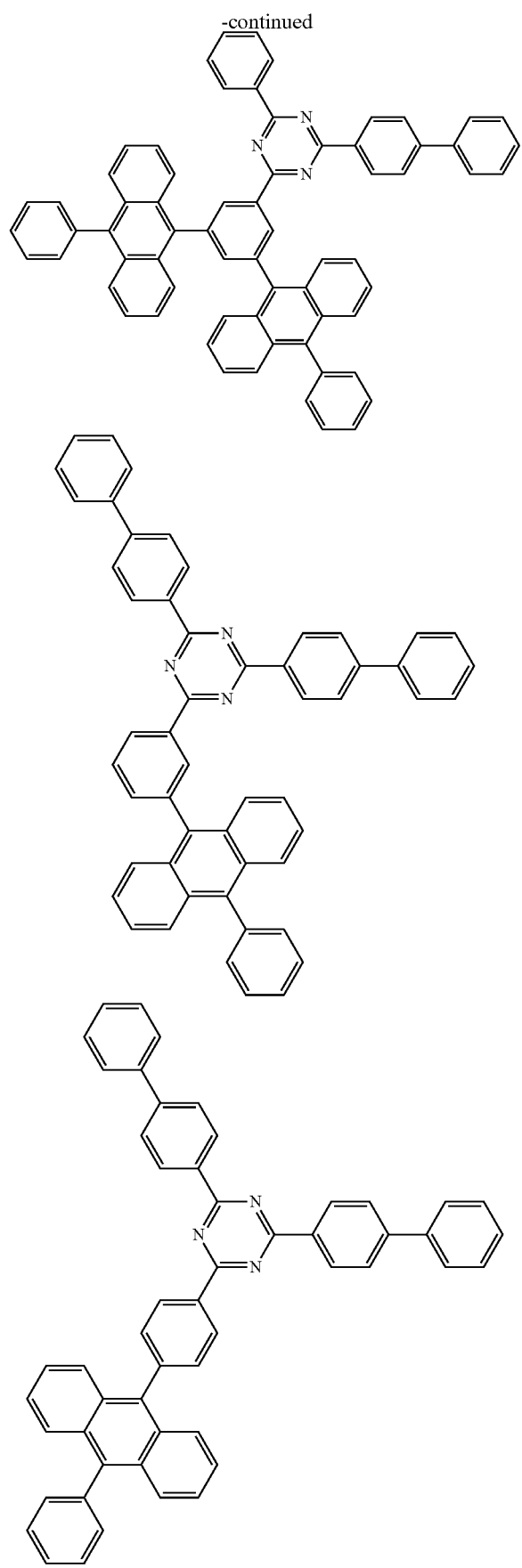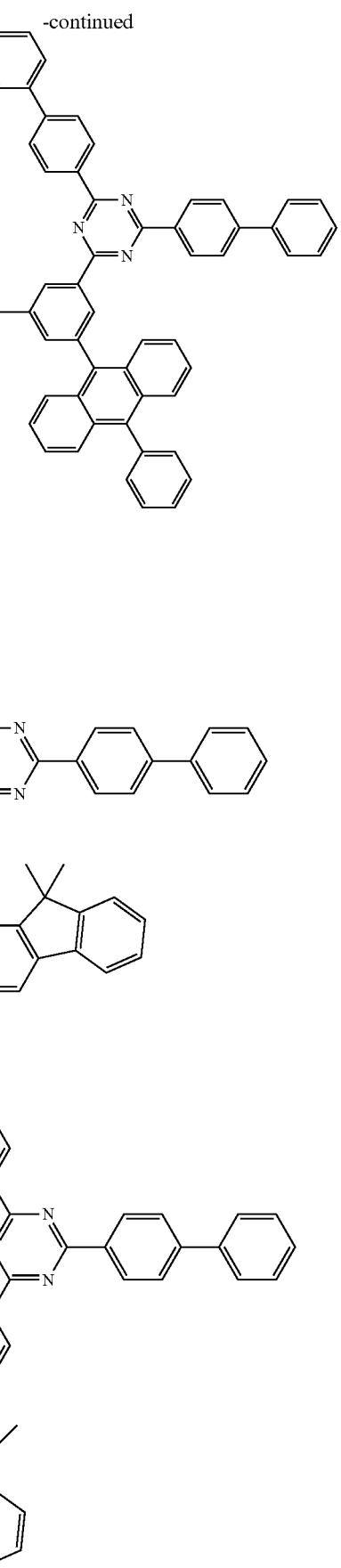

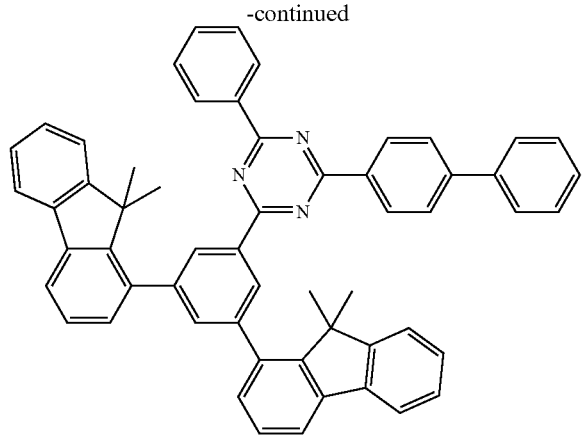
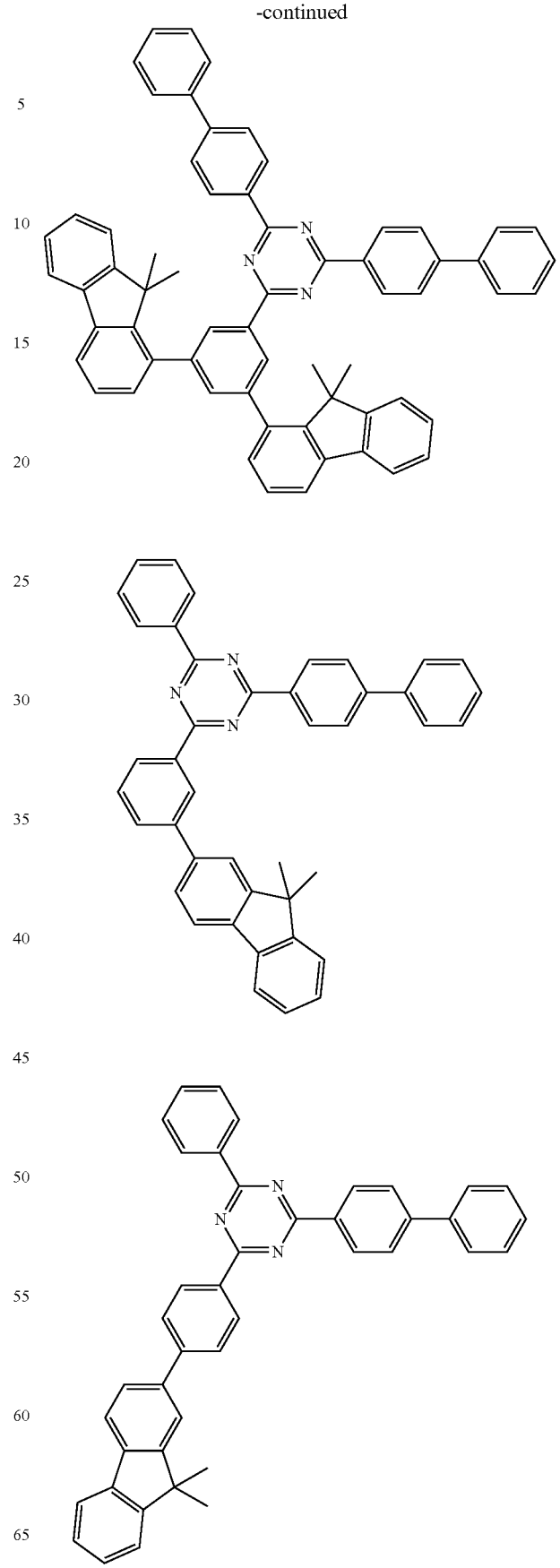

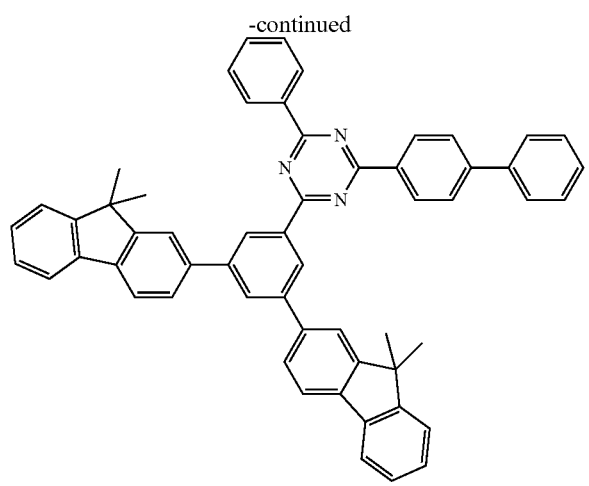
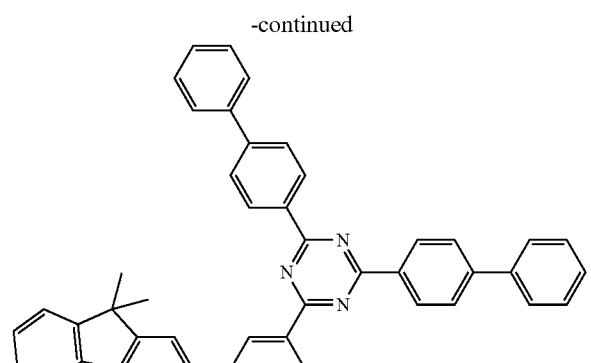
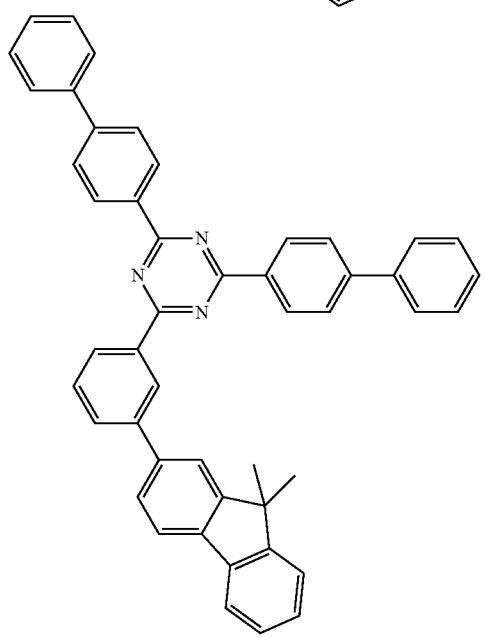
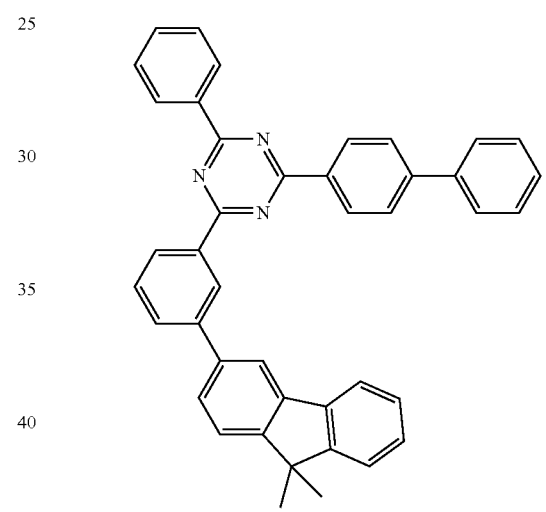
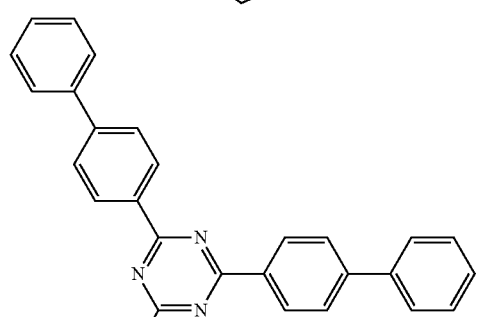
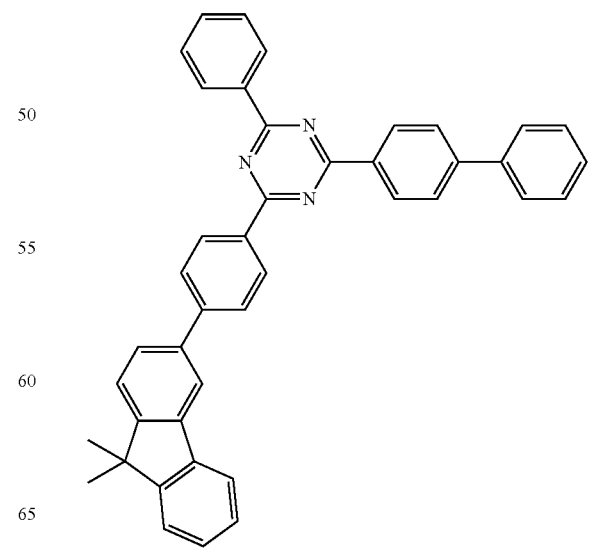

-continued
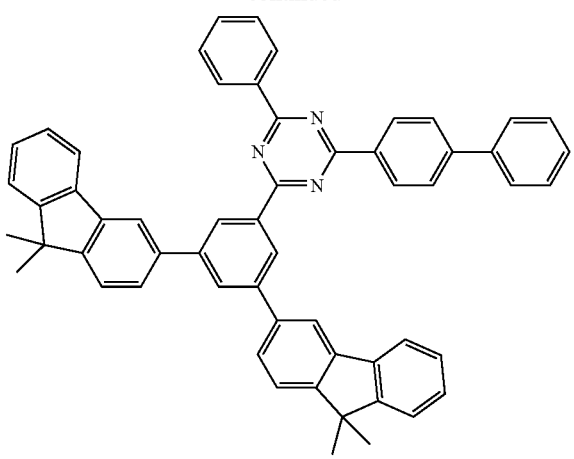
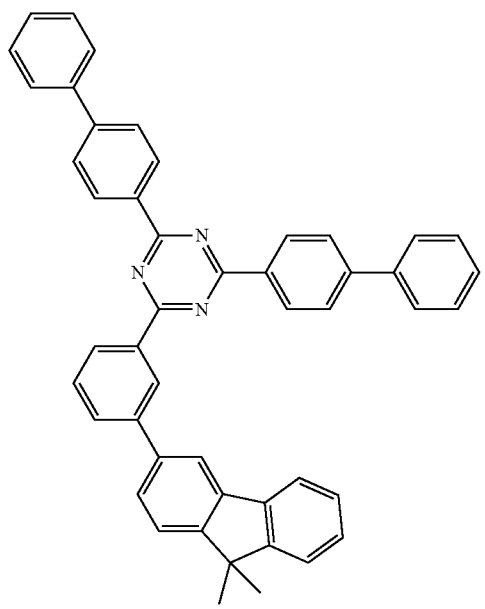
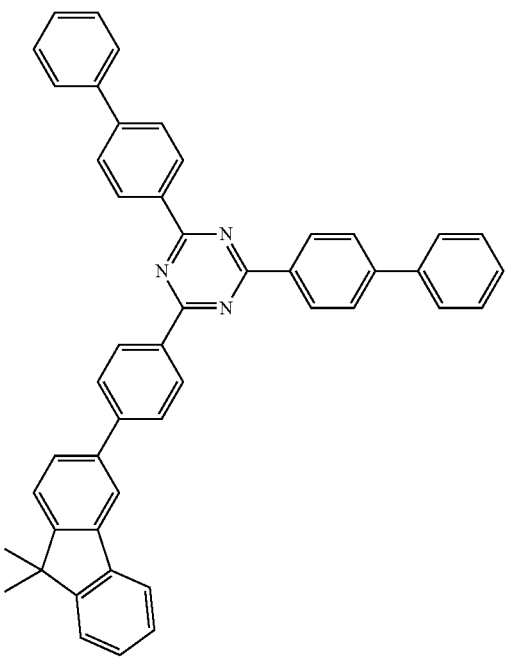
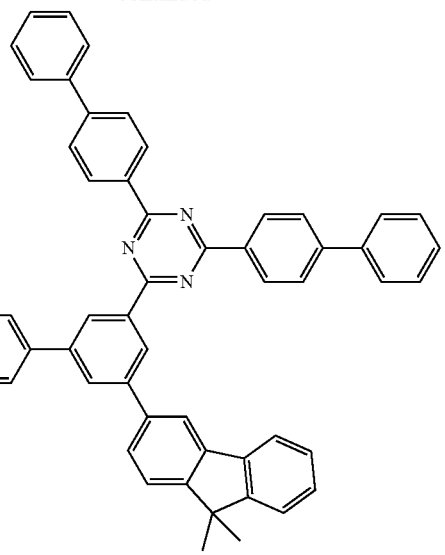
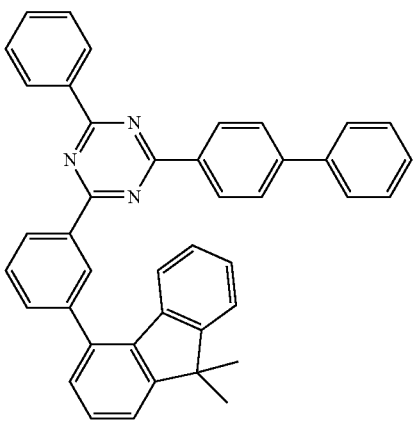
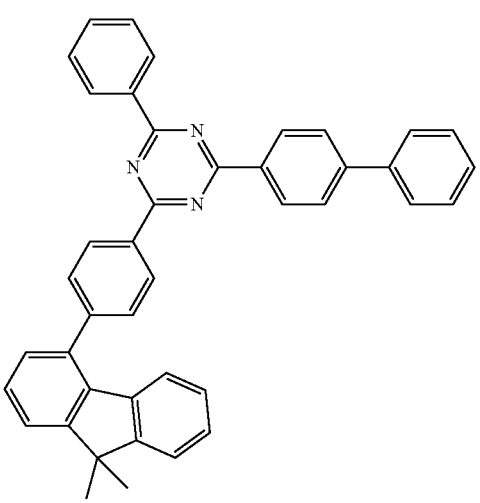

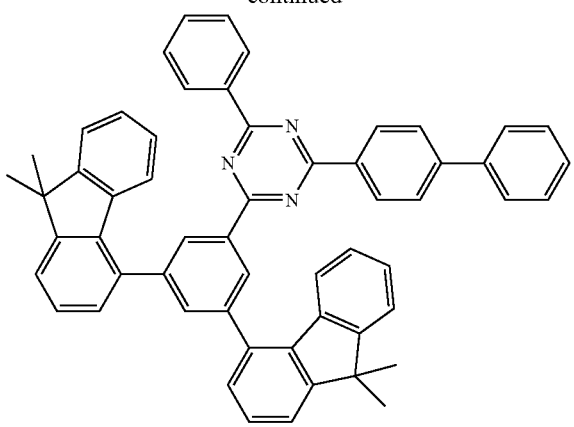
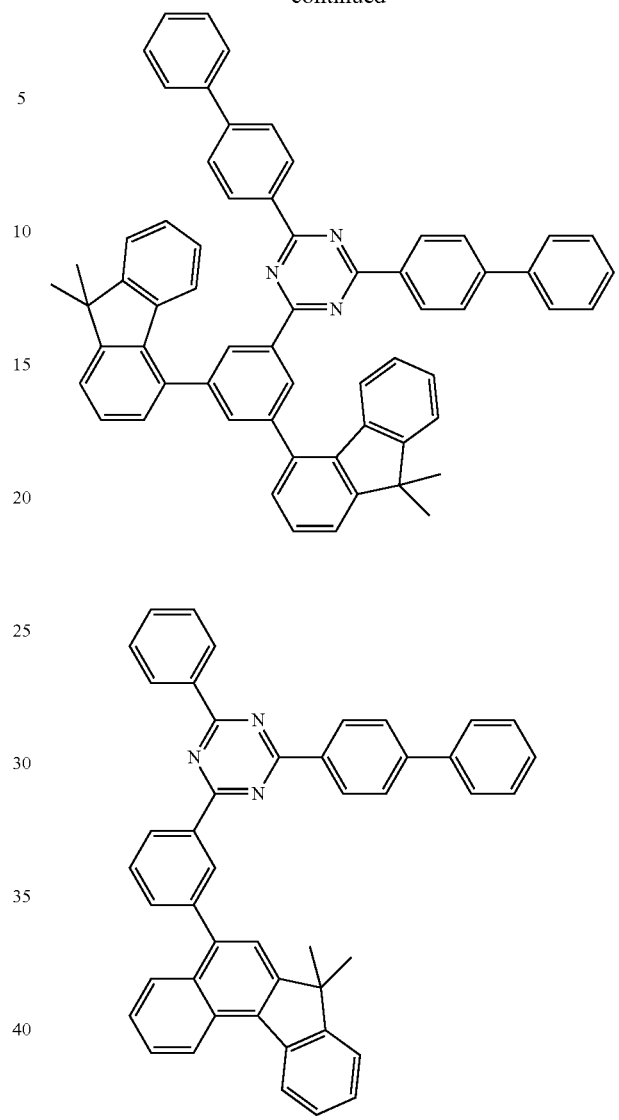
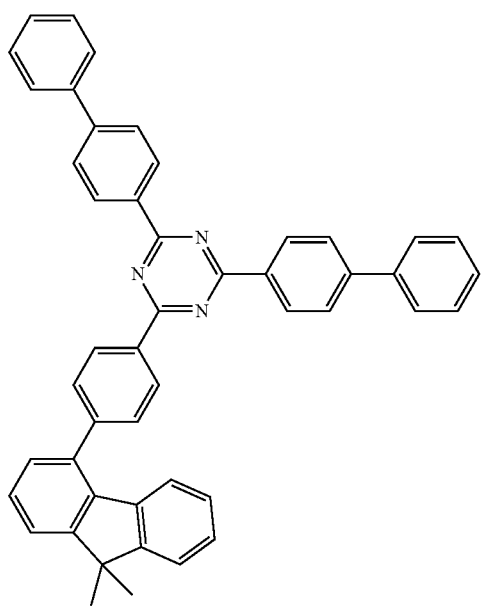

-continued
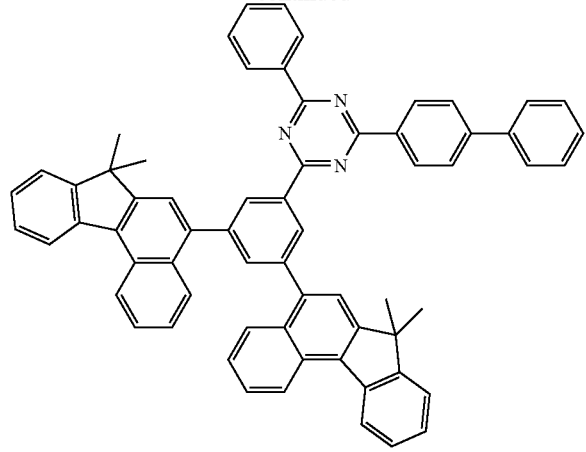
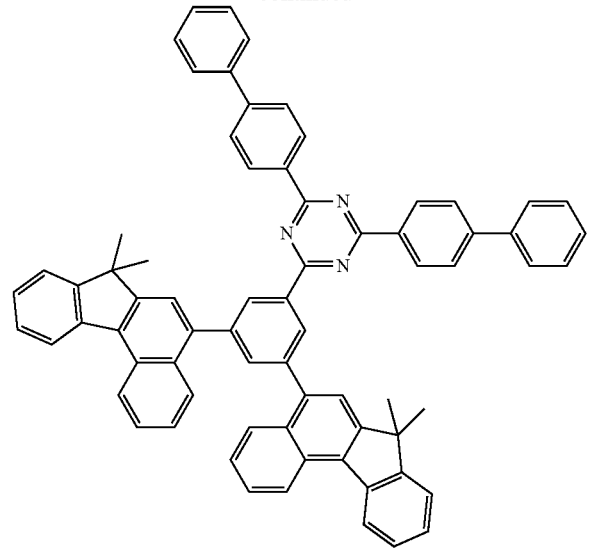
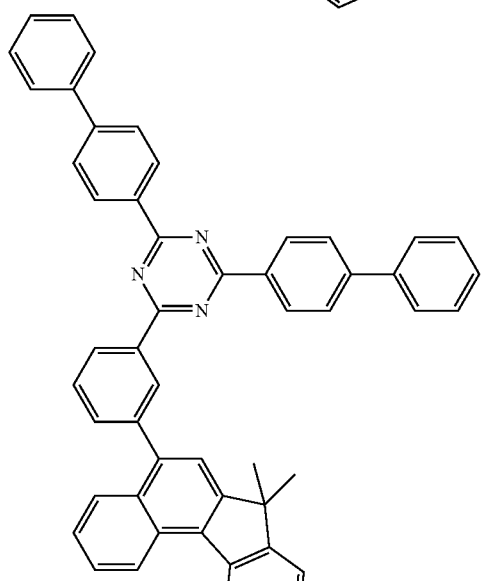
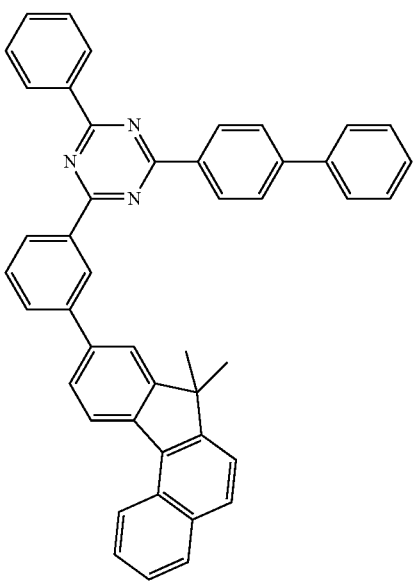
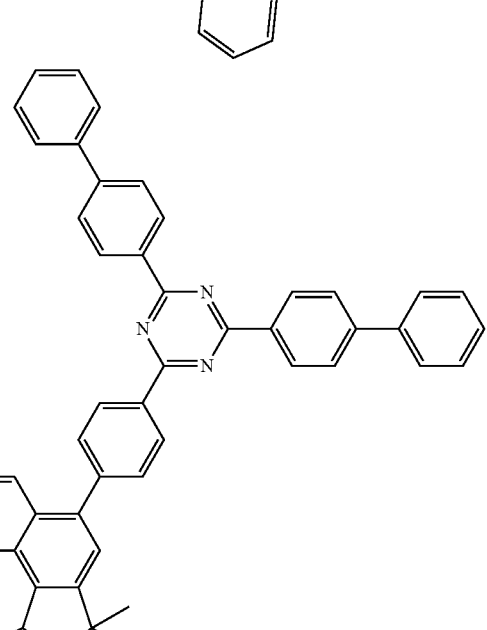
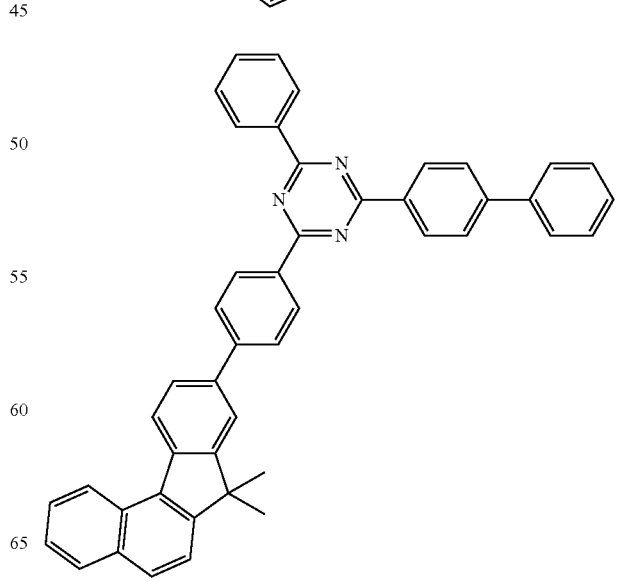

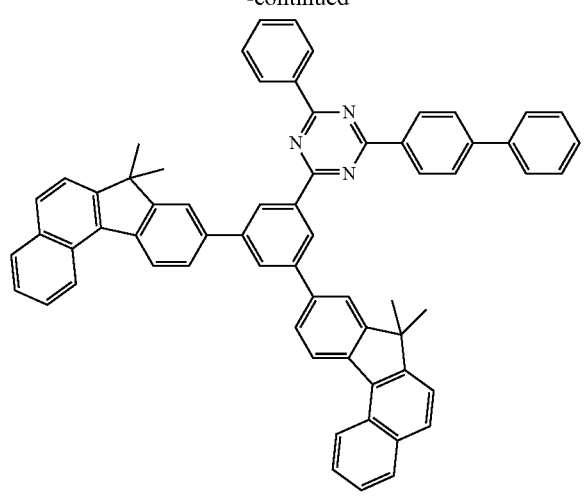
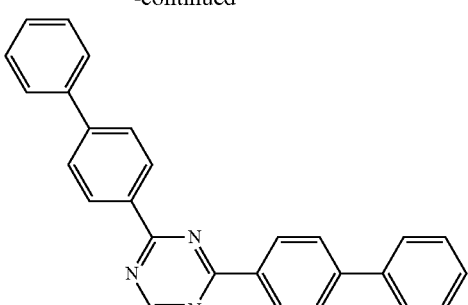
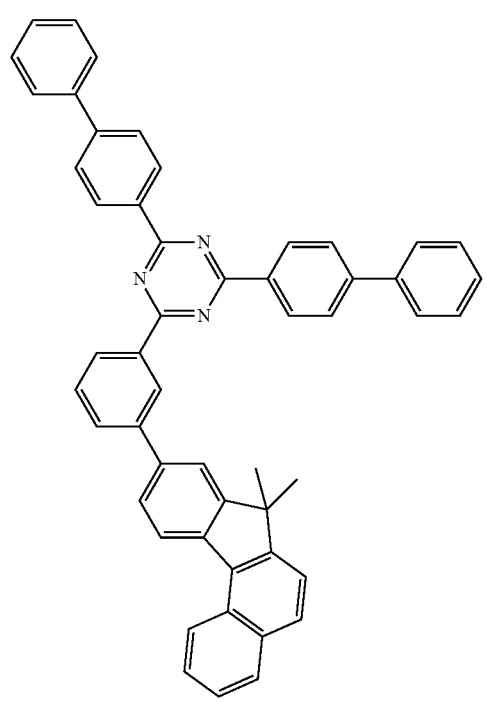

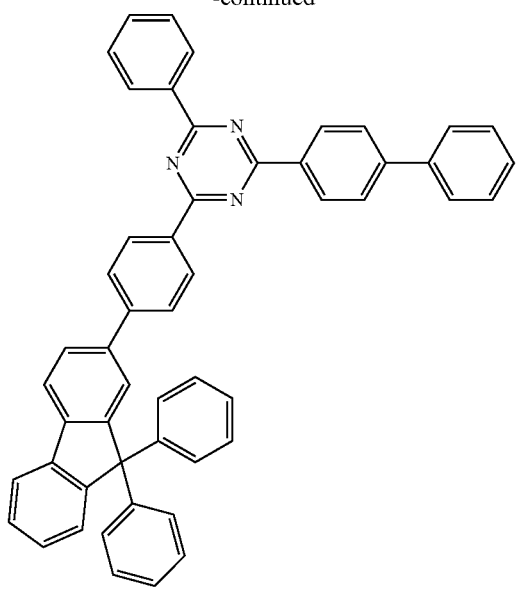
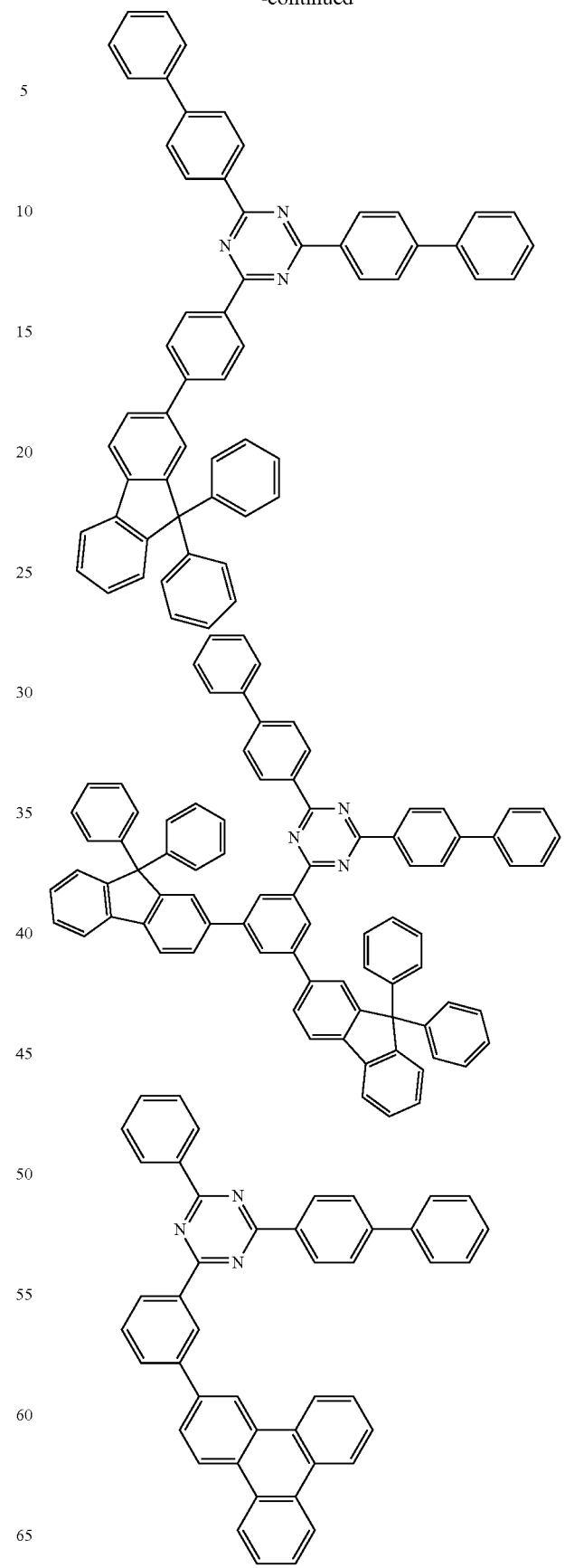

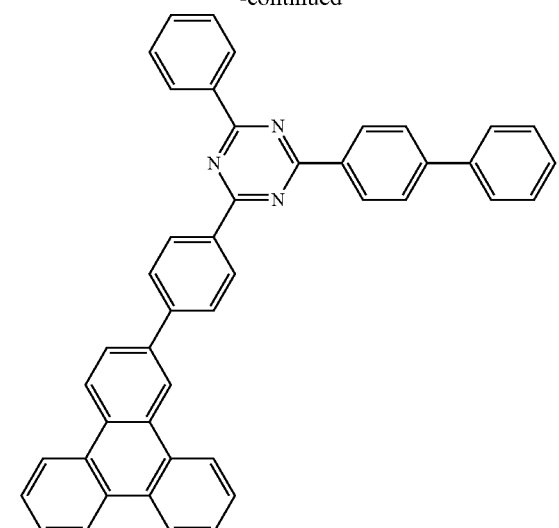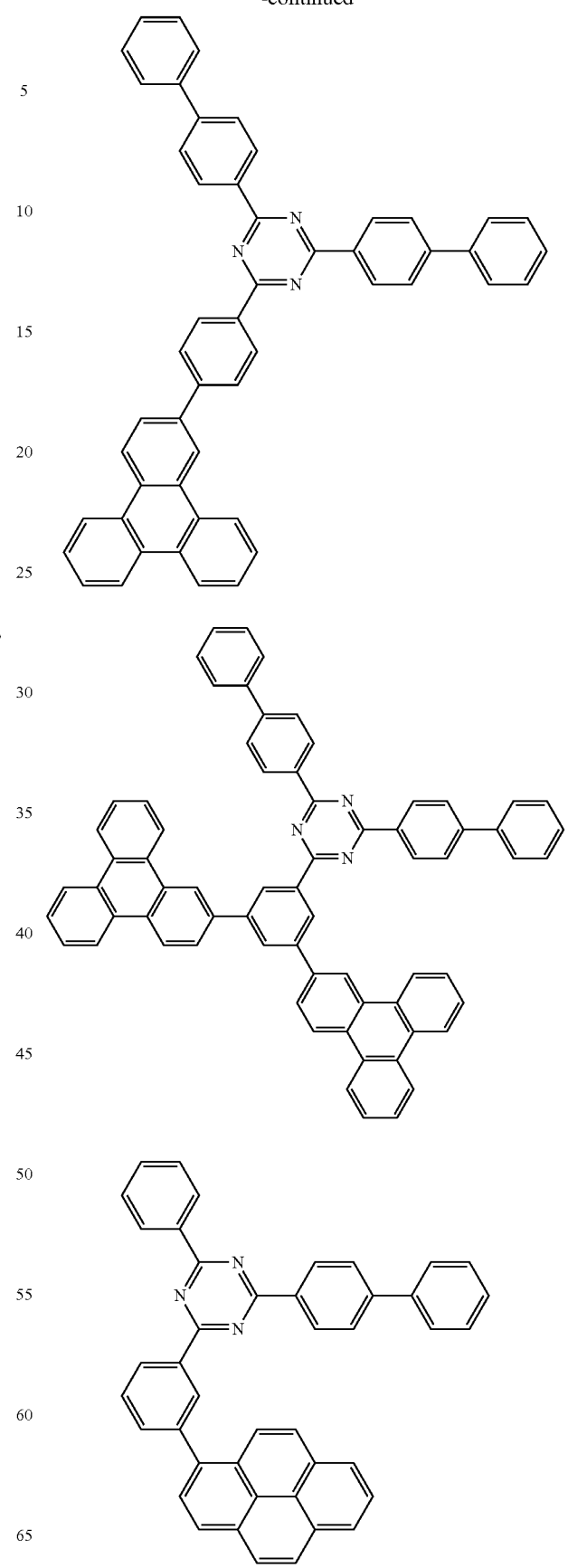

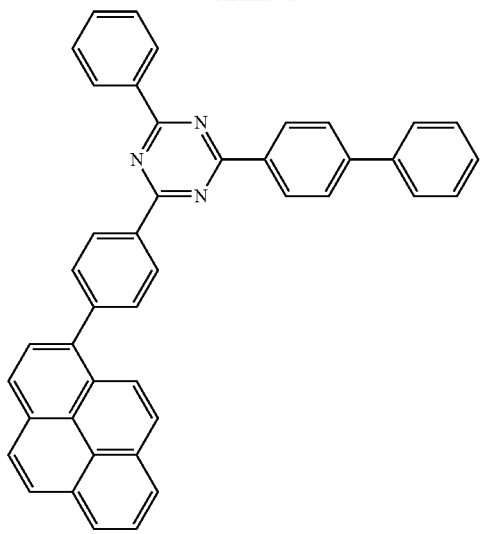
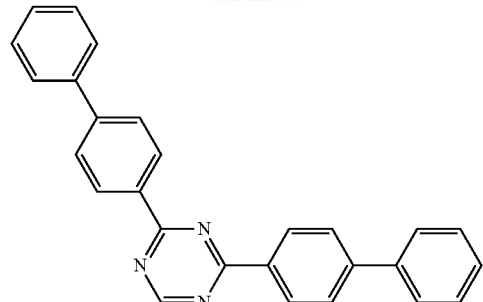
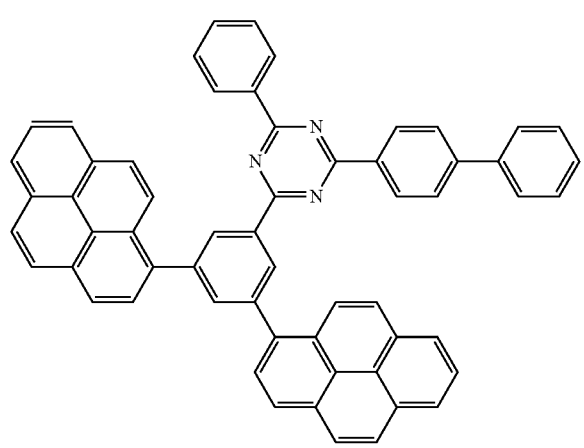
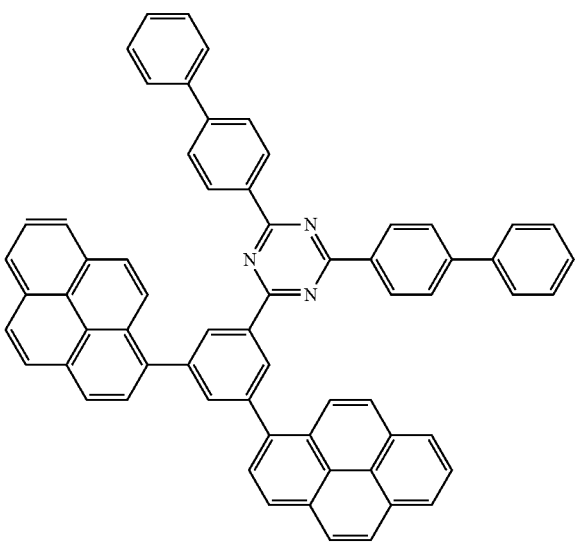
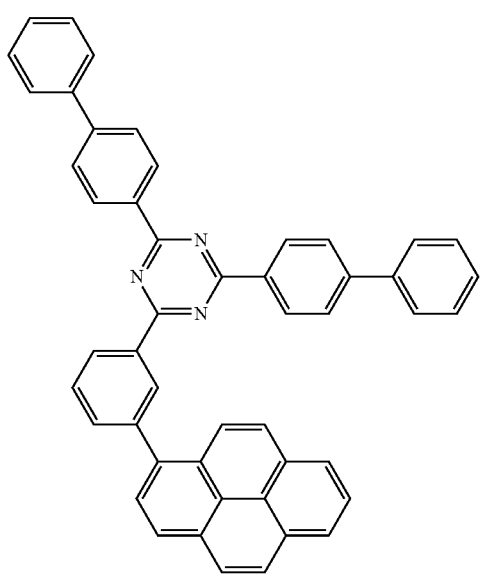

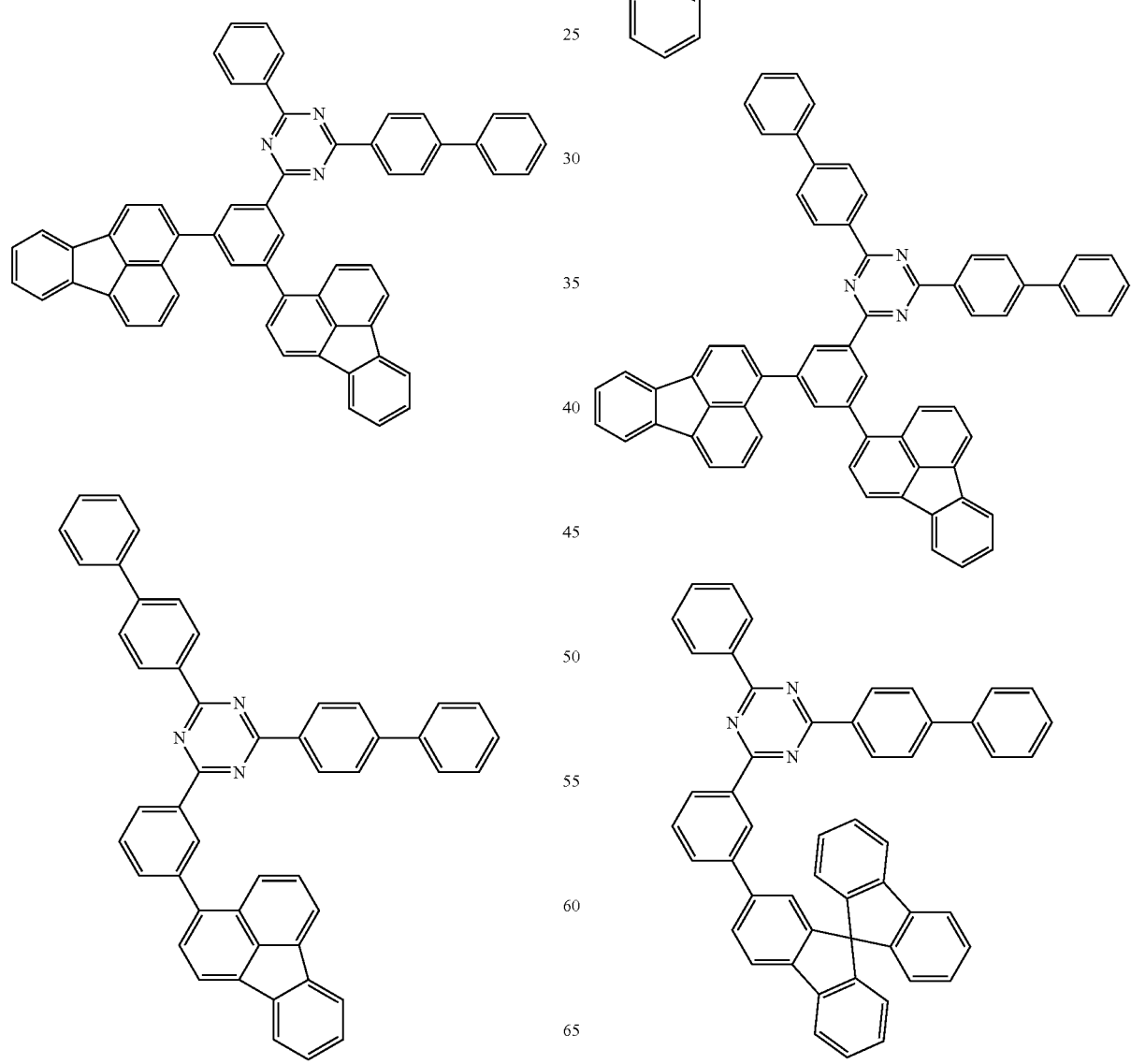

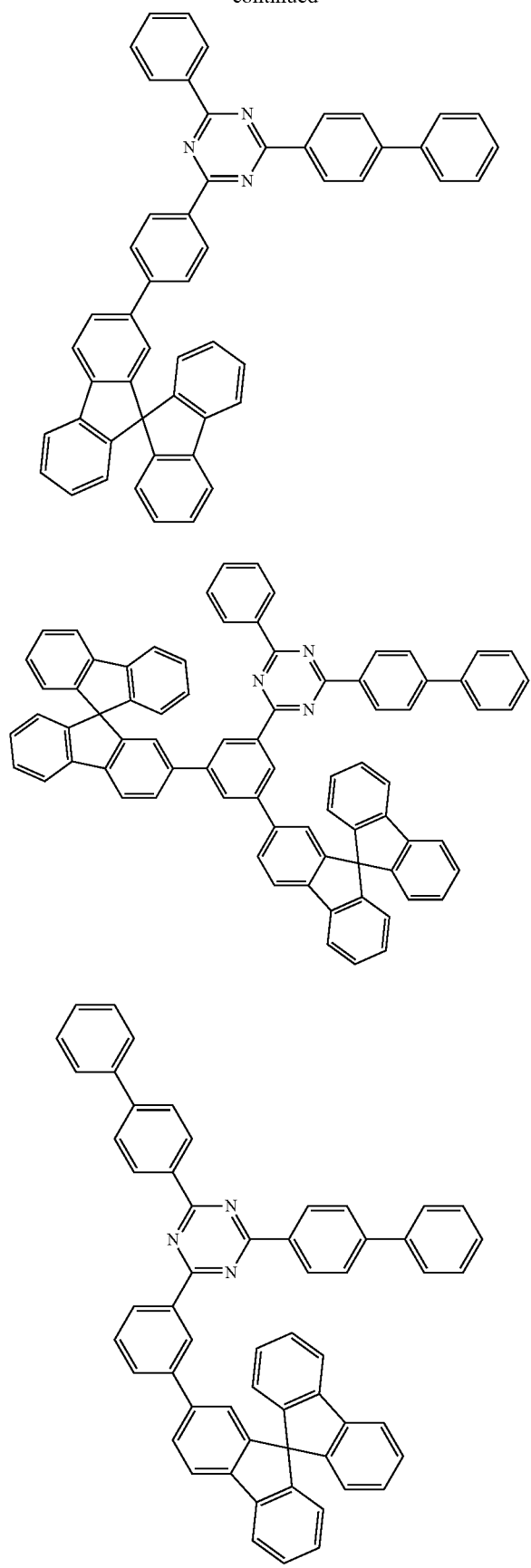

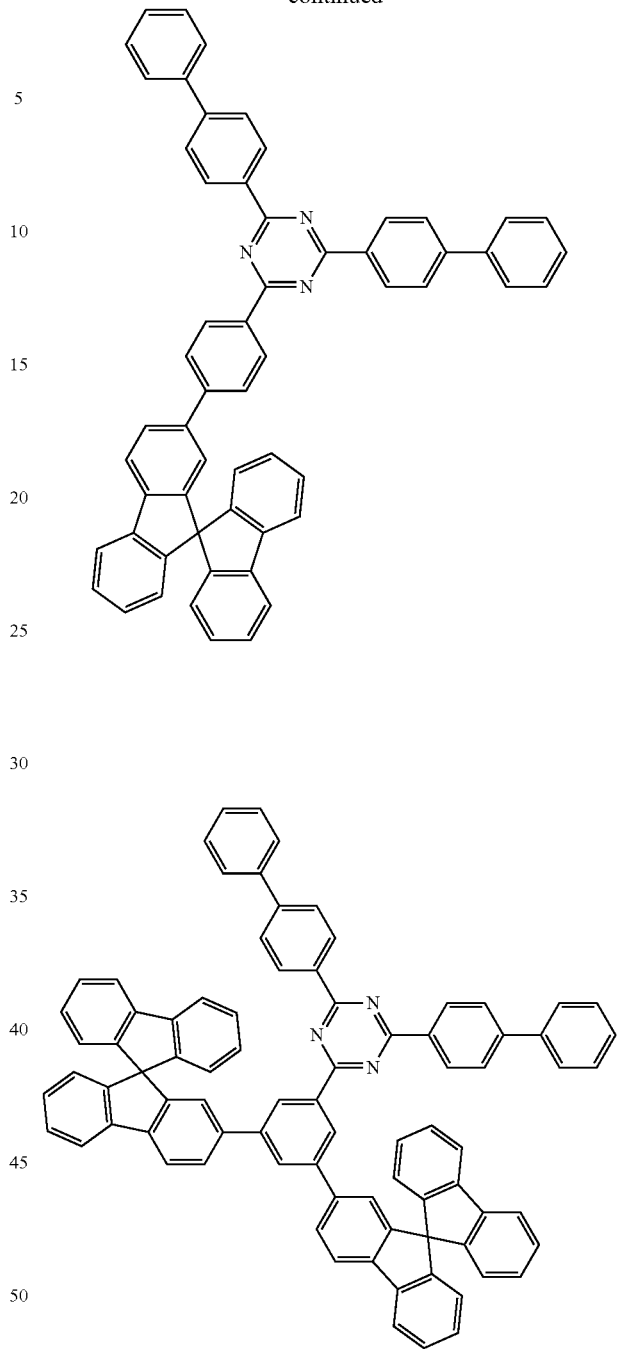

The electron transport layer further includes a dopant, and the dopant includes one among an alkali metal, an alkali earth metal, an alkali metal compound, an alkali earth metal compound, an organic complex of alkali metals, or an organic complex of alkali earth metals.

At least one light emitting part between an anode and a cathode may include at least one organic layer and a light emitting layer, wherein the organic layer comprises an organic compound represented by the following Chemical Formula 1:

[Chemical Formula 1]

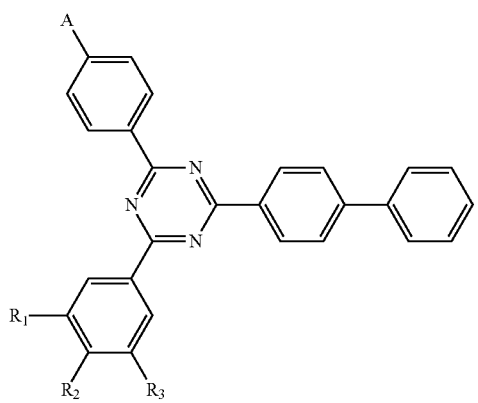

wherein A includes one among hydrogen and a phenyl group, $R_1$ to $R_3$ include independently one among hydrogen and an aryl group of 10 to 30 carbon atoms, with at least one among $R_1$ to $R_3$ being an aryl group, except for the case that $R_1$ to $R_3$ are all hydrogen.

Further, $R_1$ to $R_3$ include independently one among the following compounds:

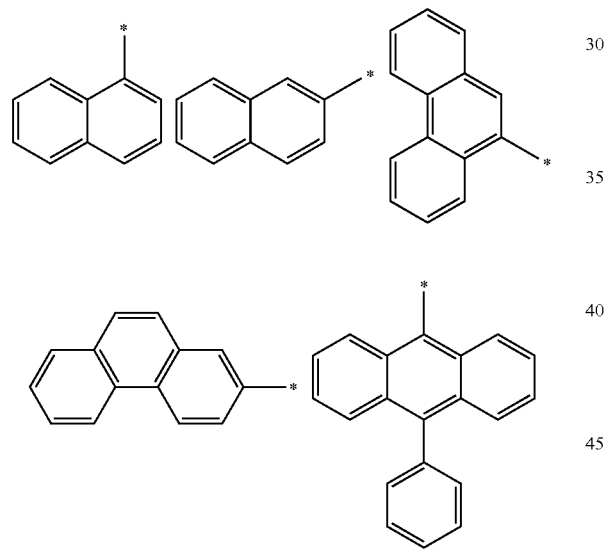

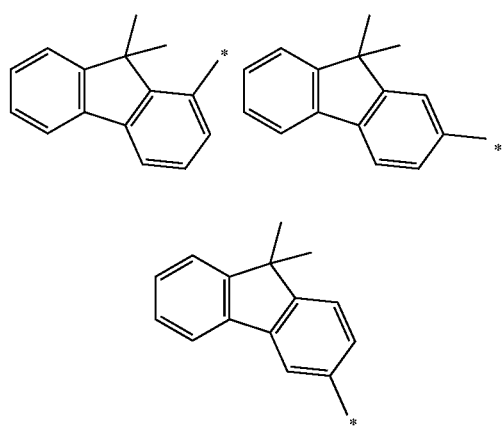

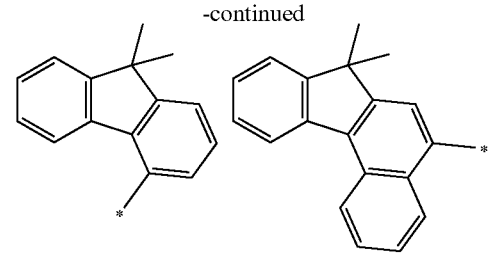

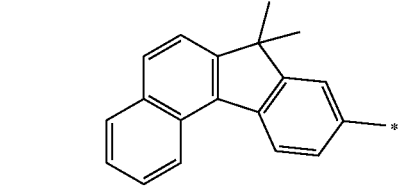

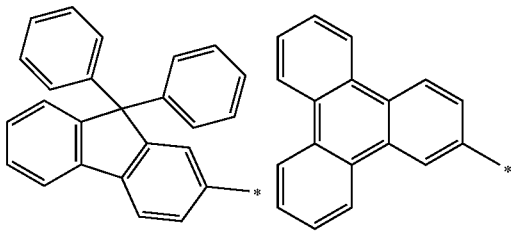

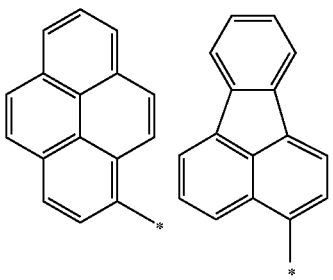

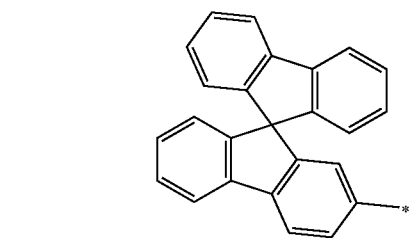

The organic compound represented by Chemical Formula 1 includes one among the following compounds:

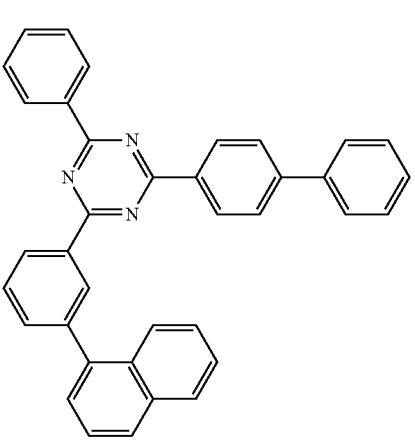

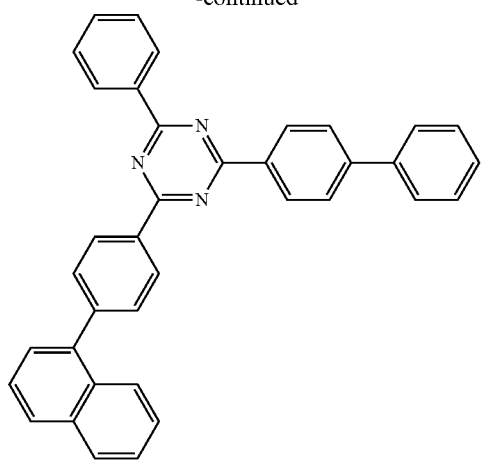
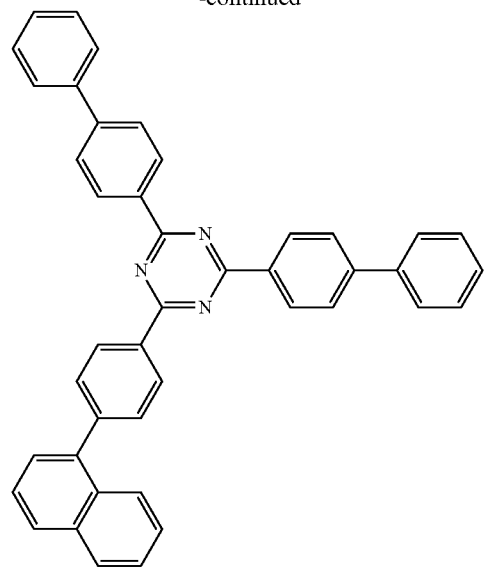
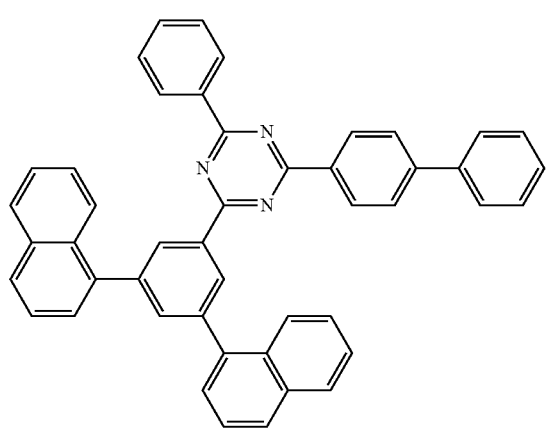
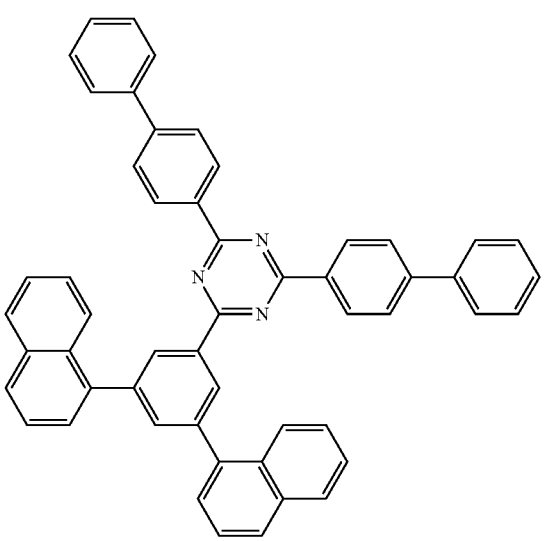
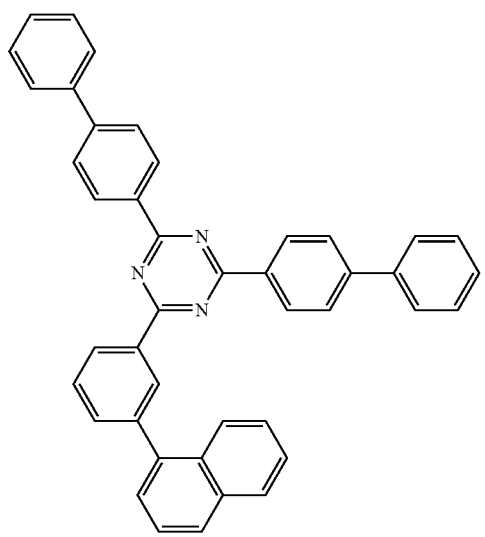
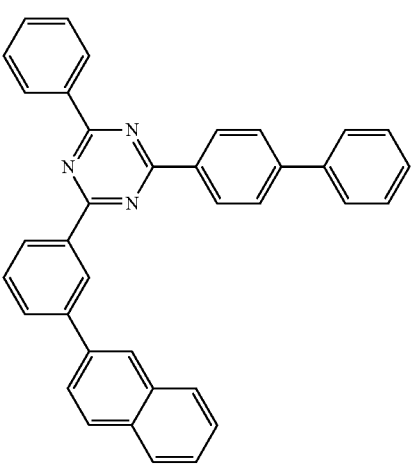

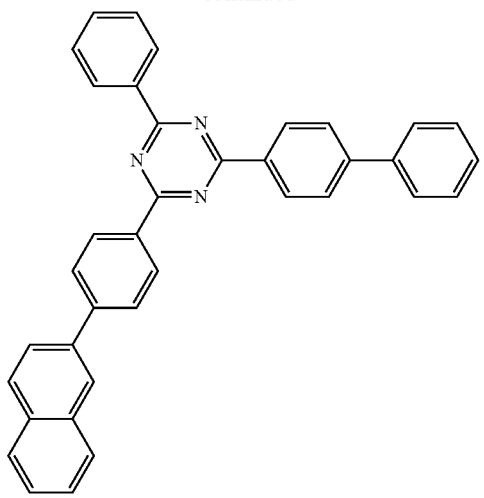
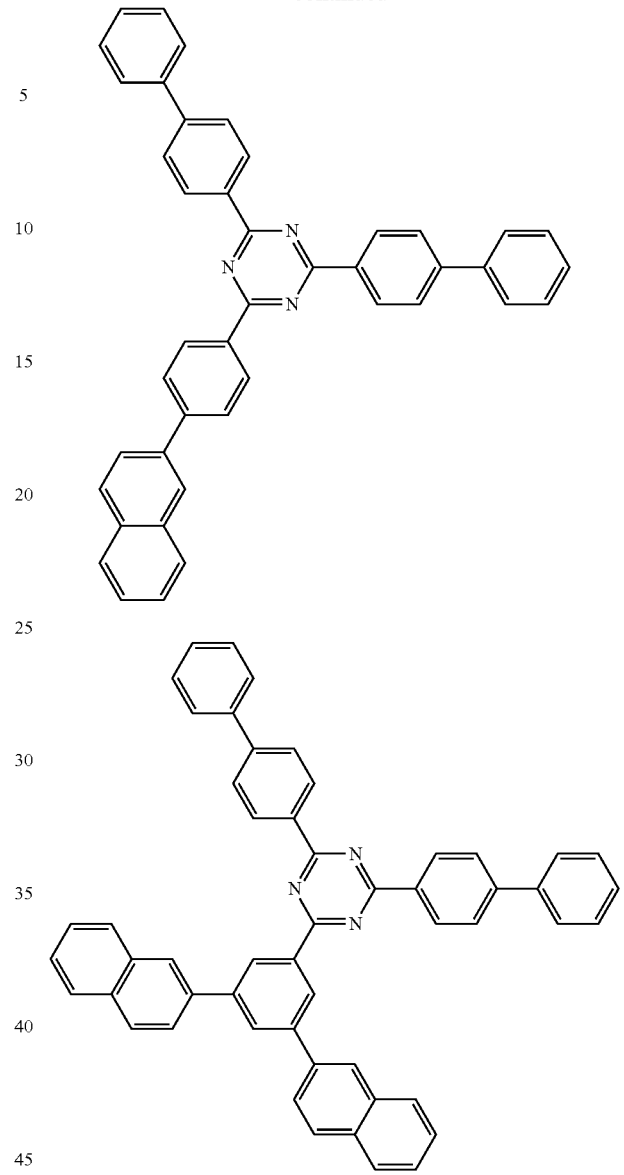
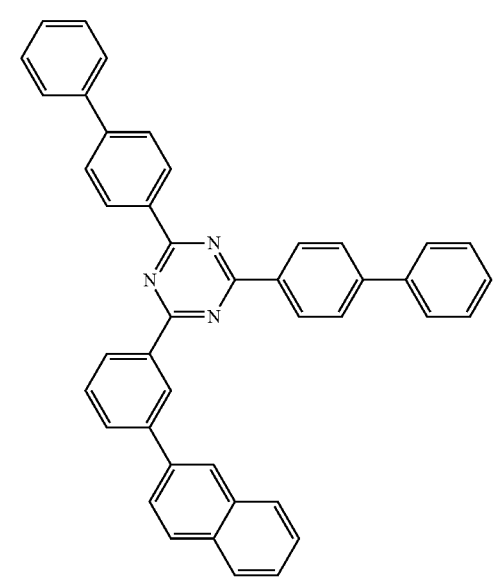
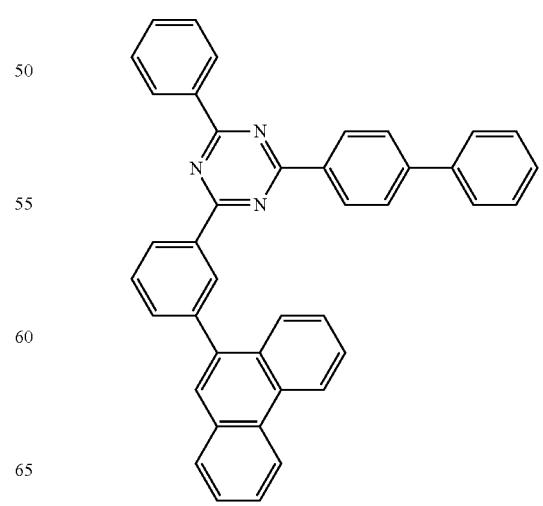

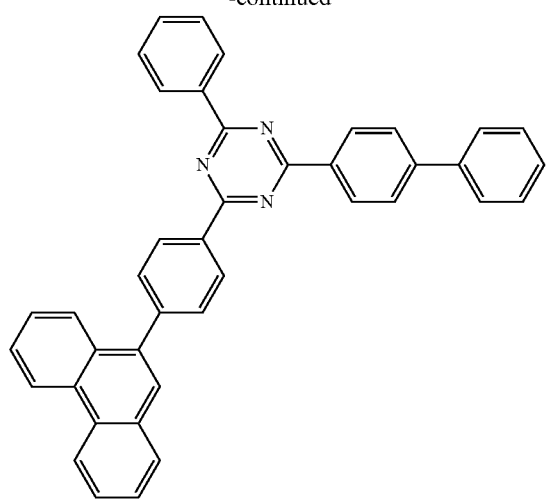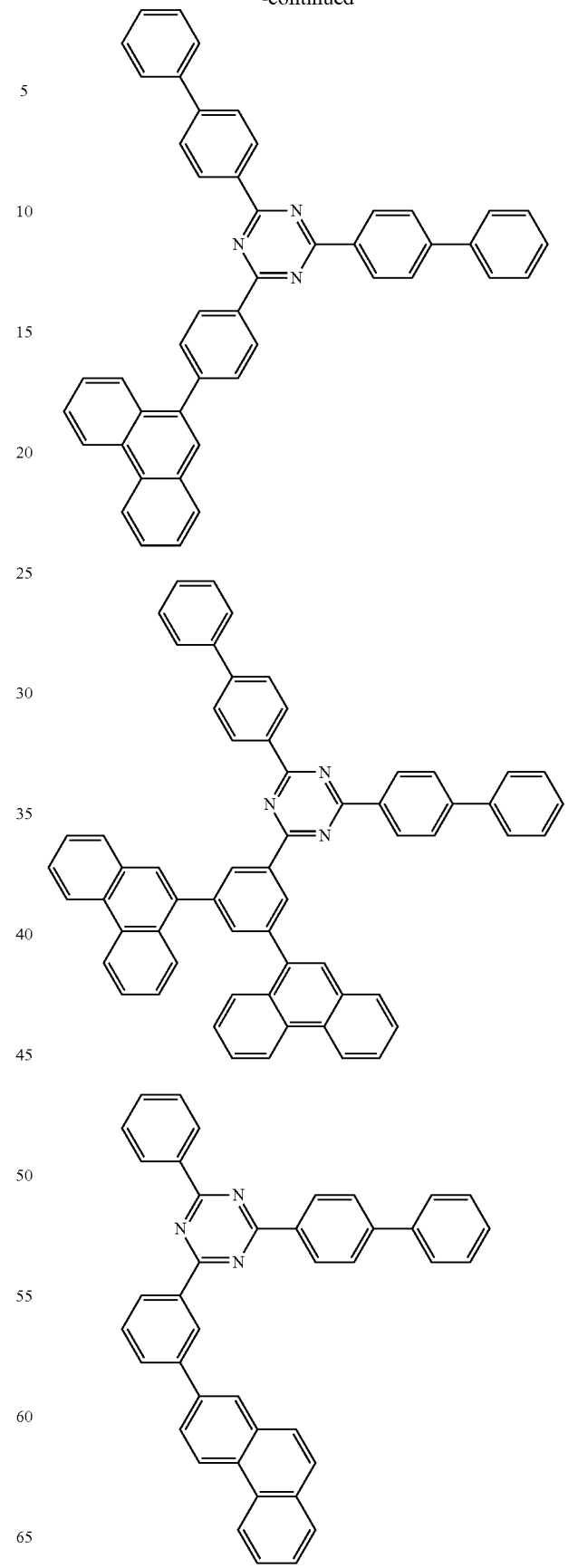

-continued
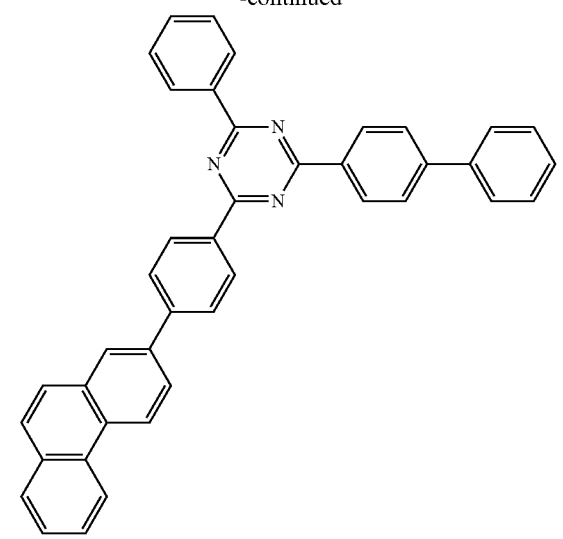
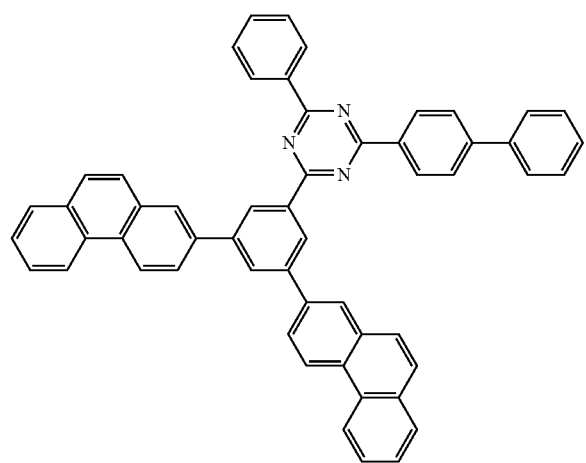
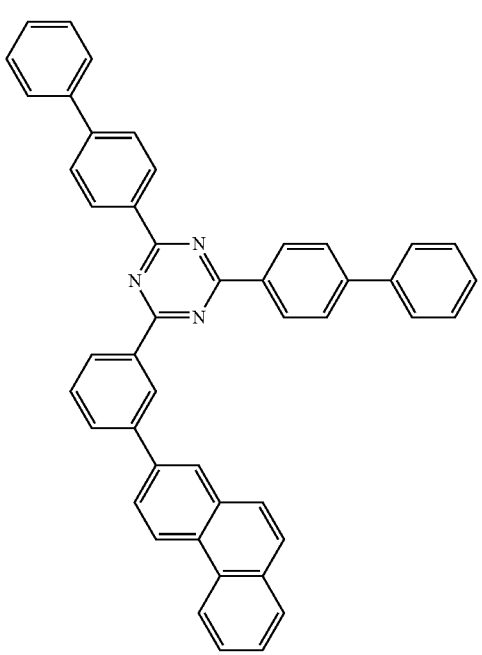
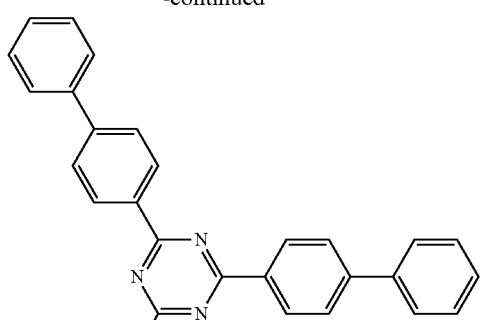
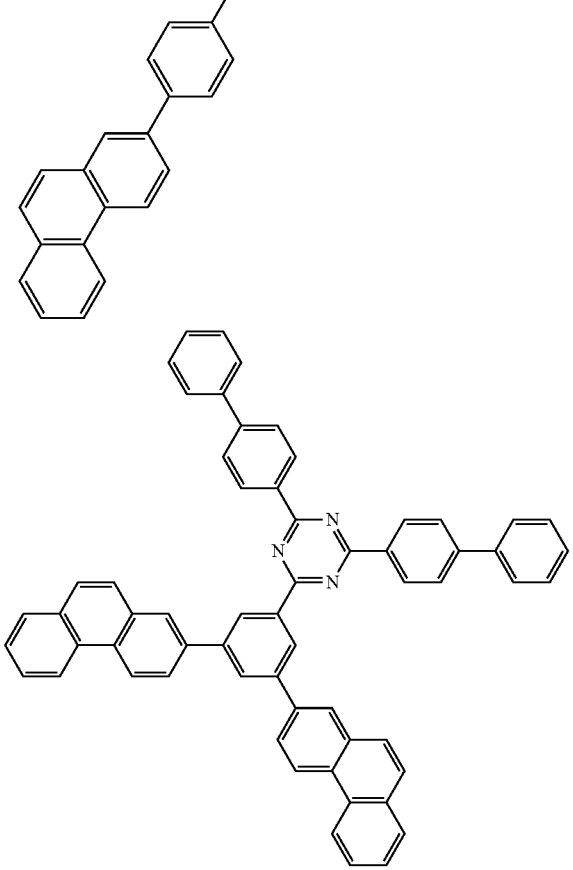
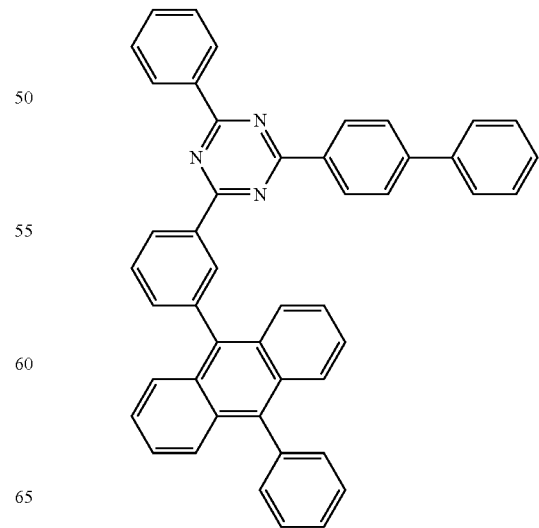

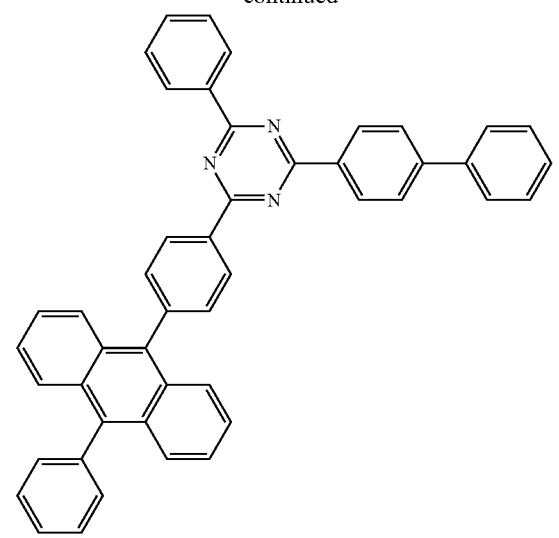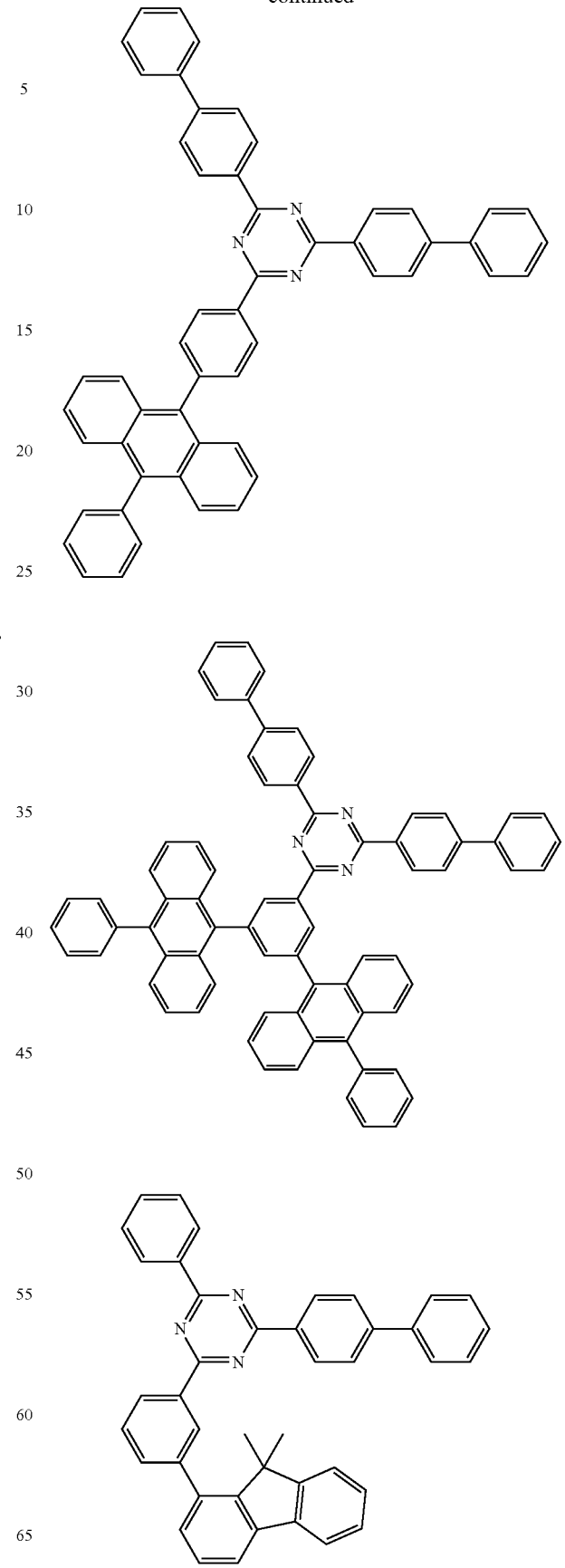

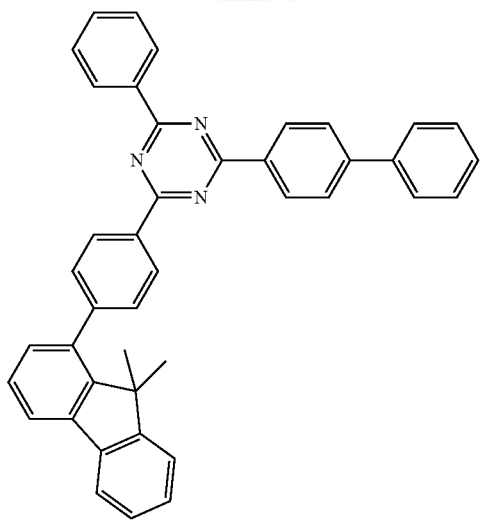
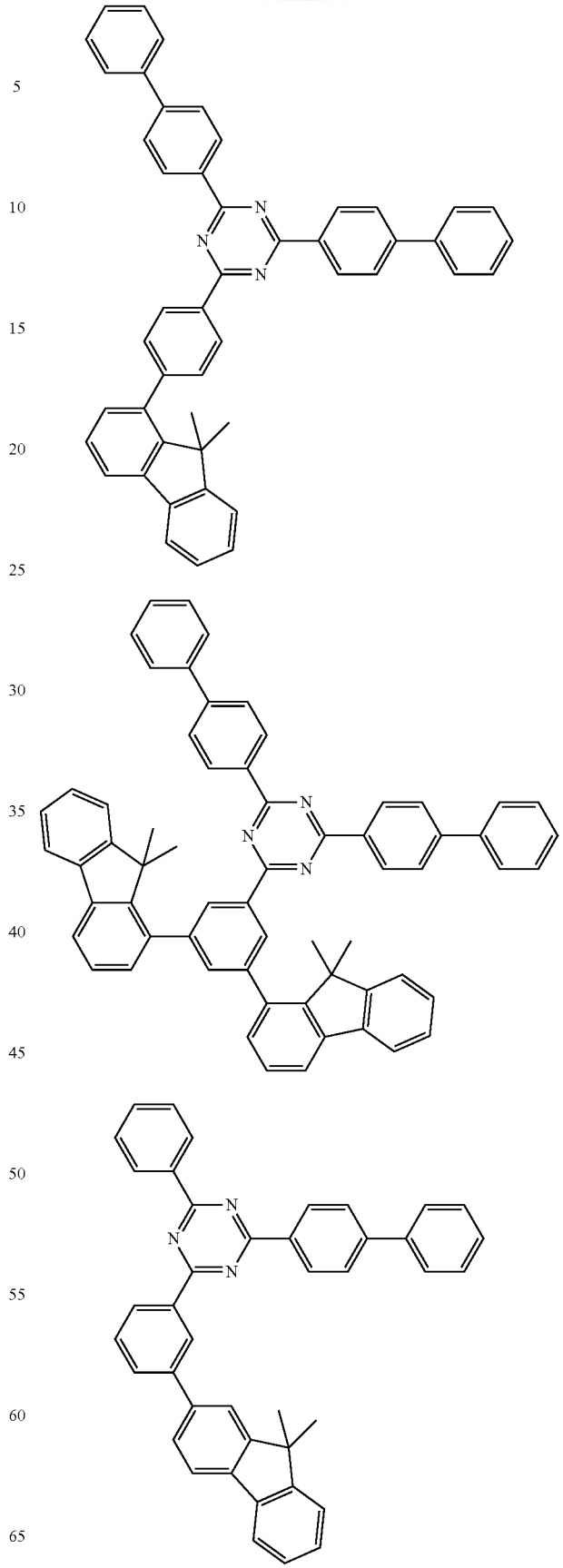

51
-continued
52
-continued
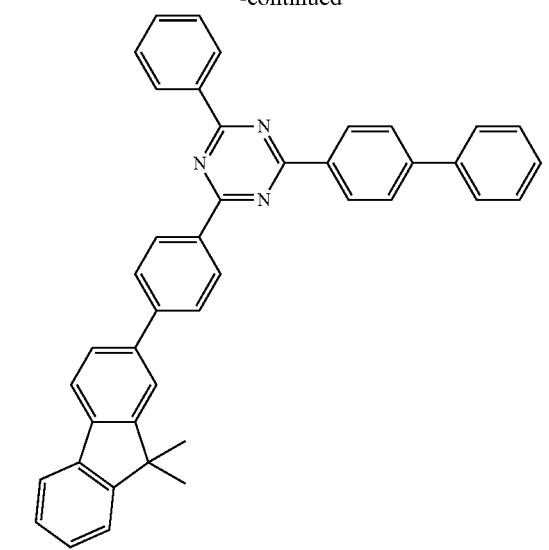
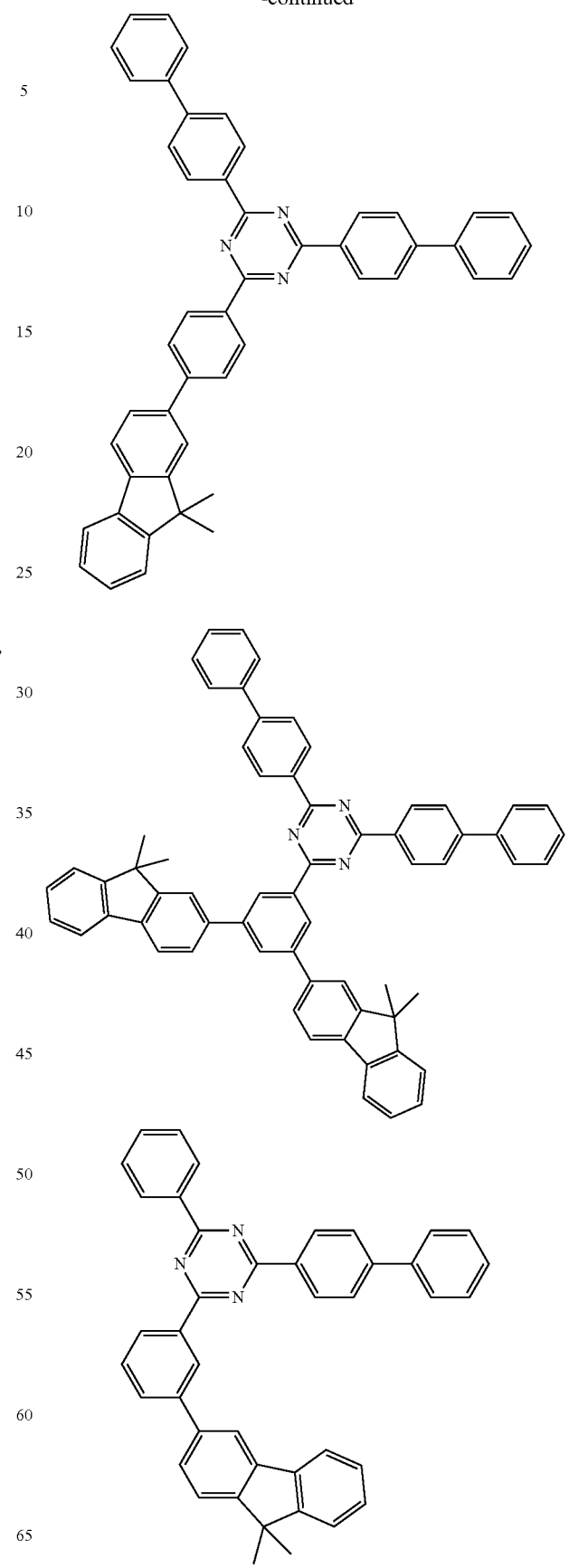

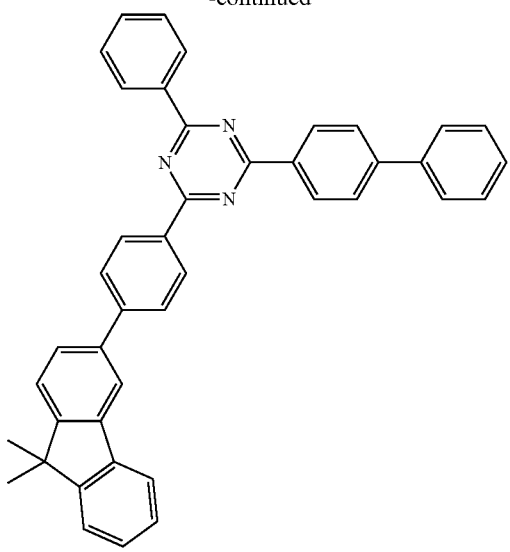
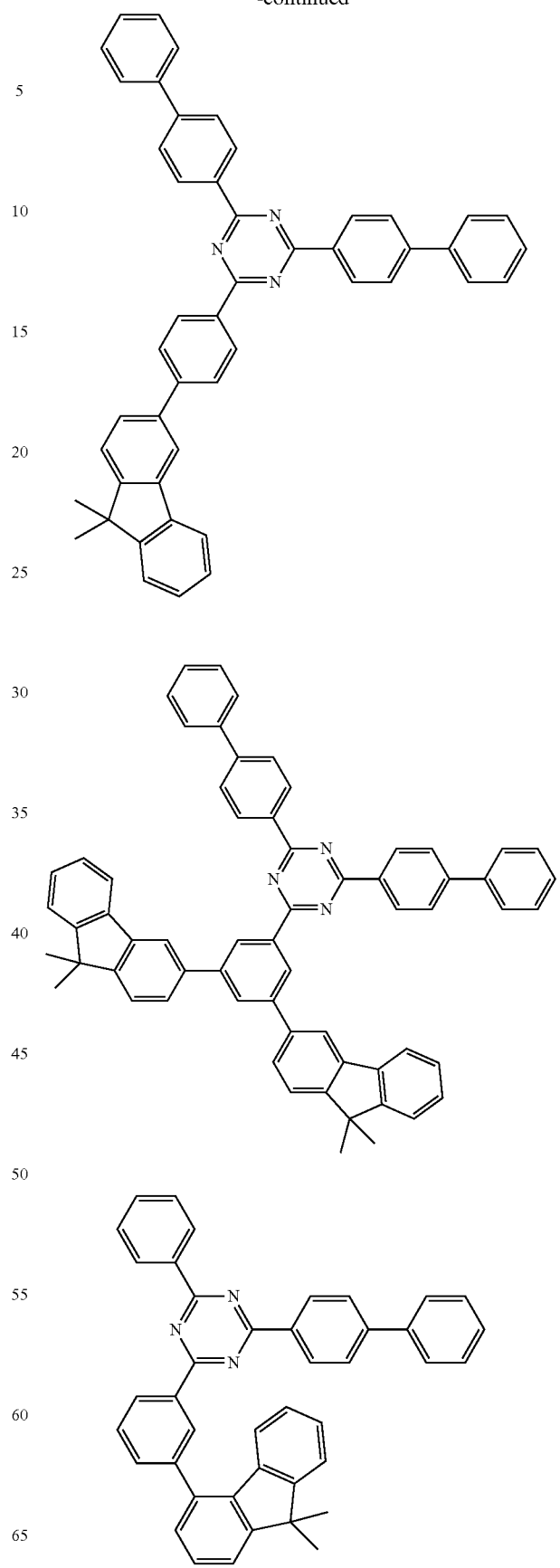

55
-continued
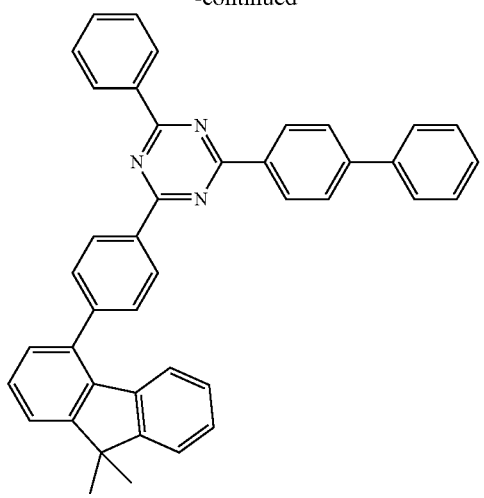
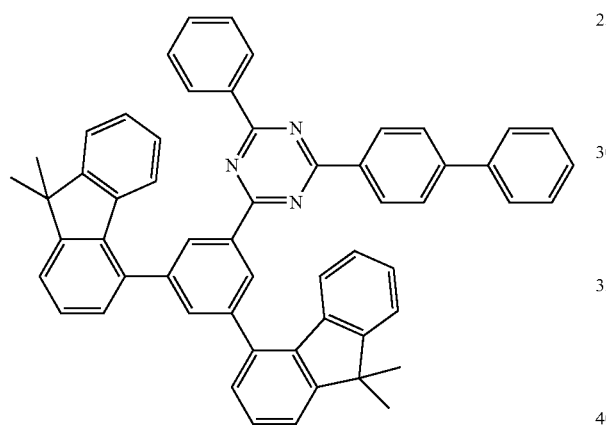
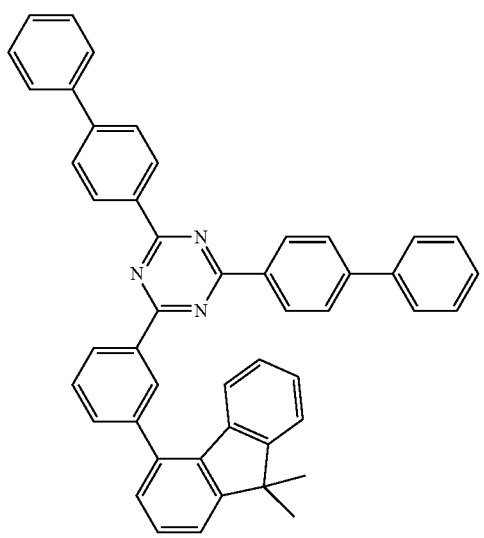
56
-continued
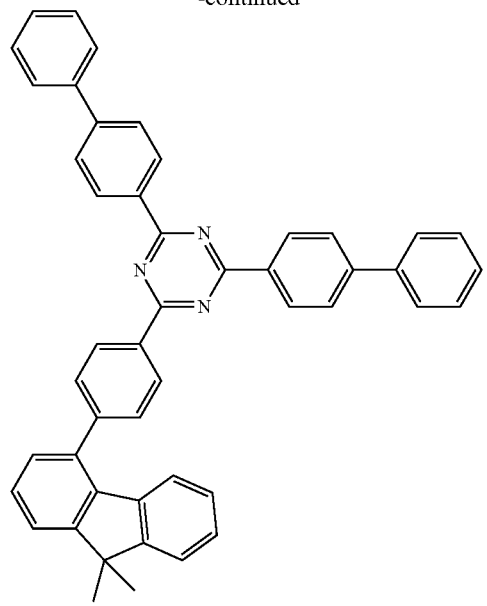
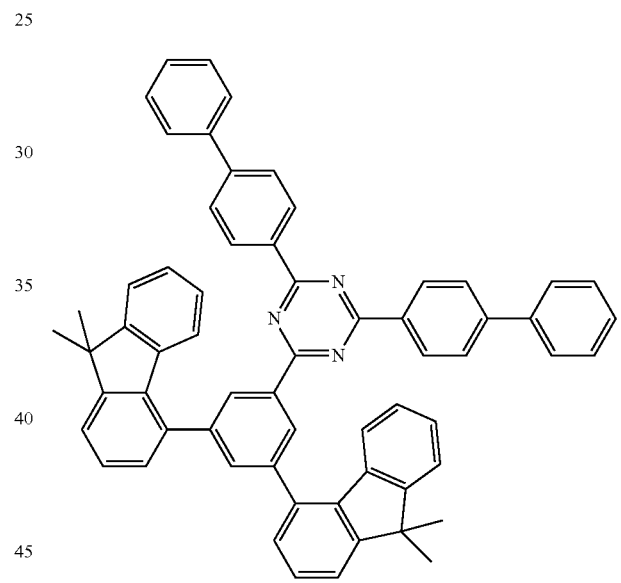
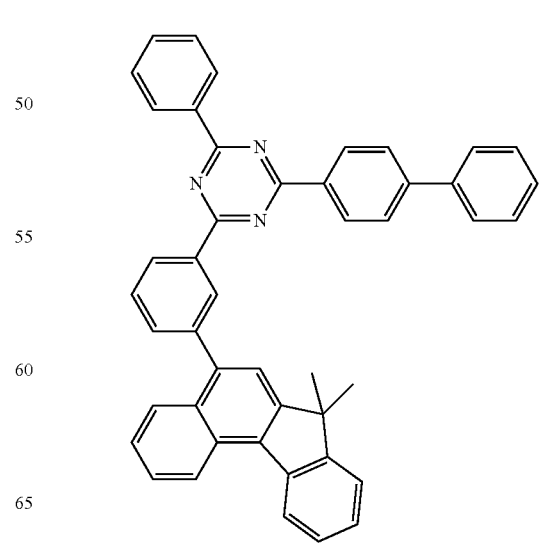

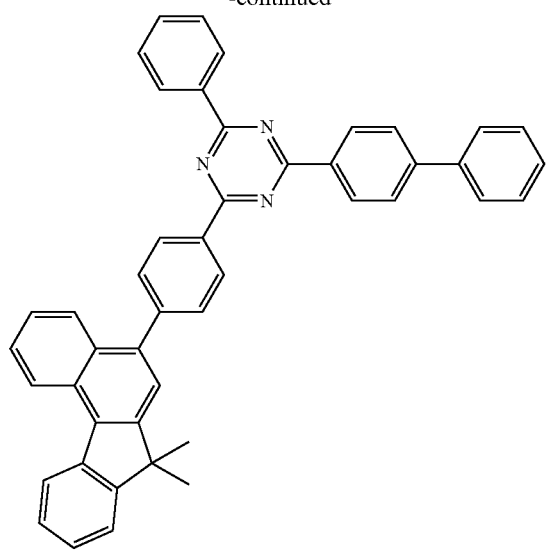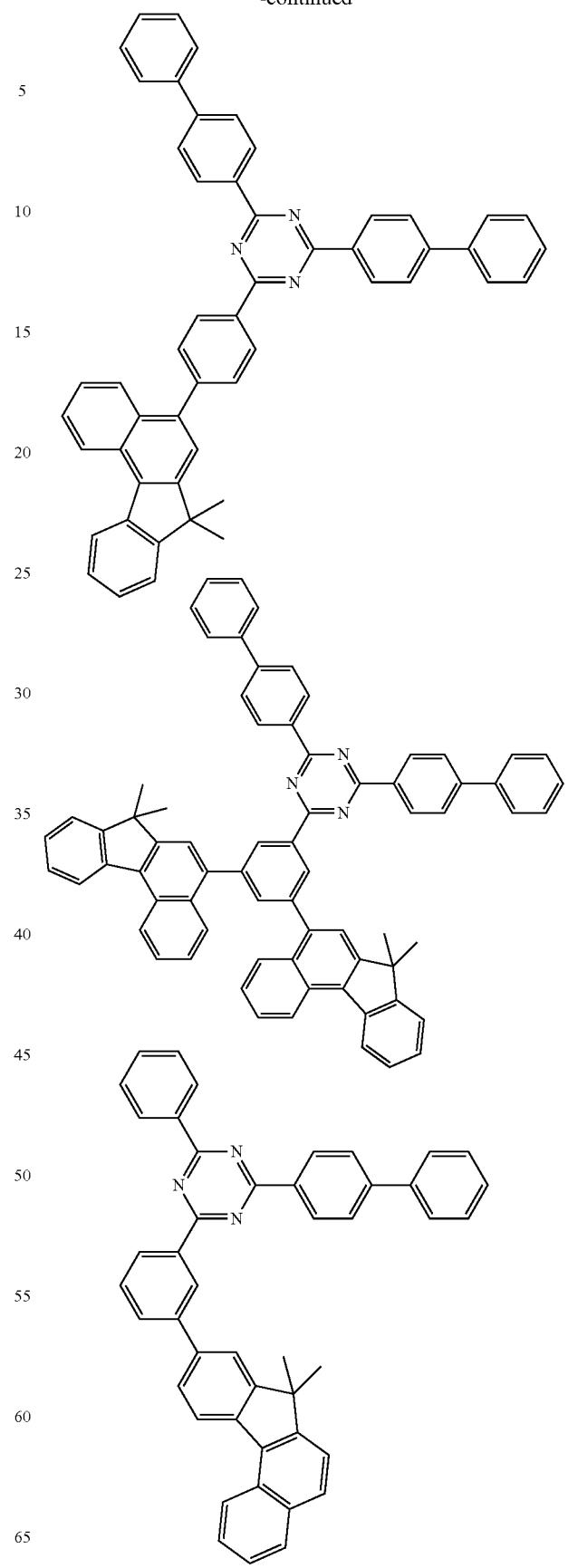

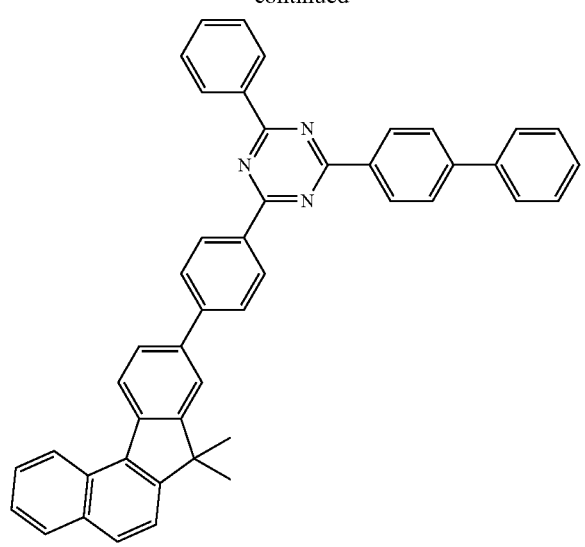
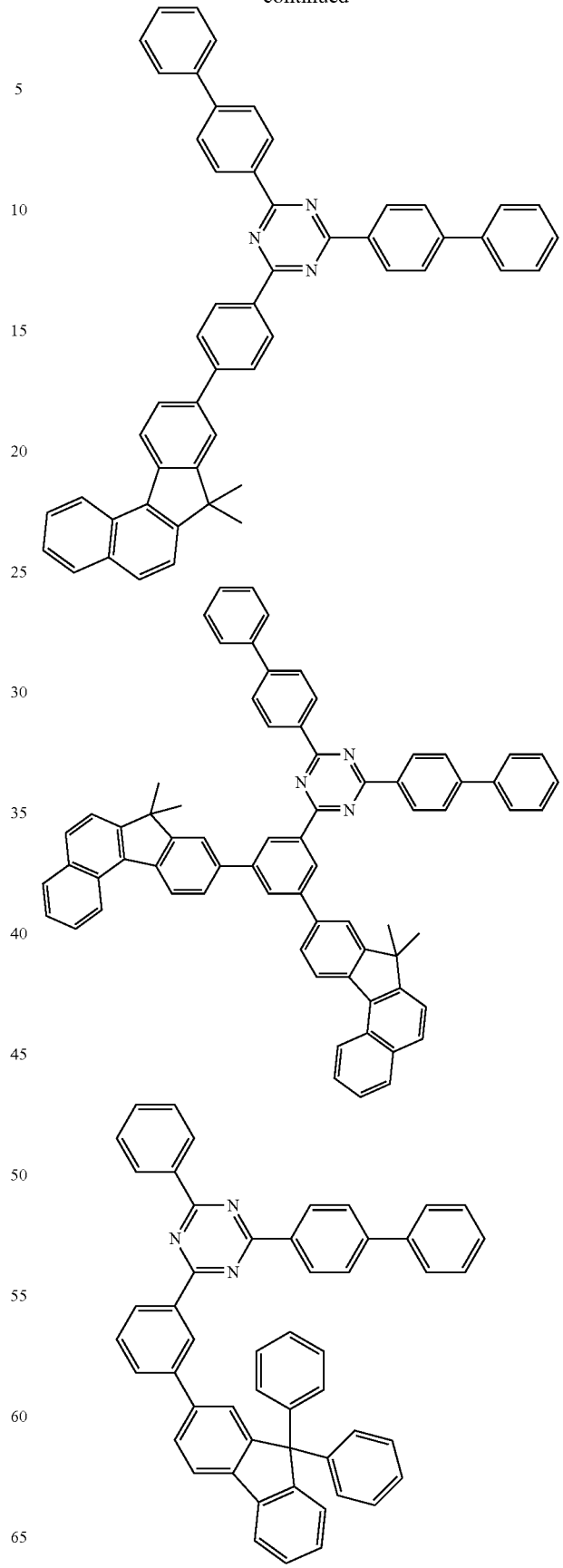

61
-continued
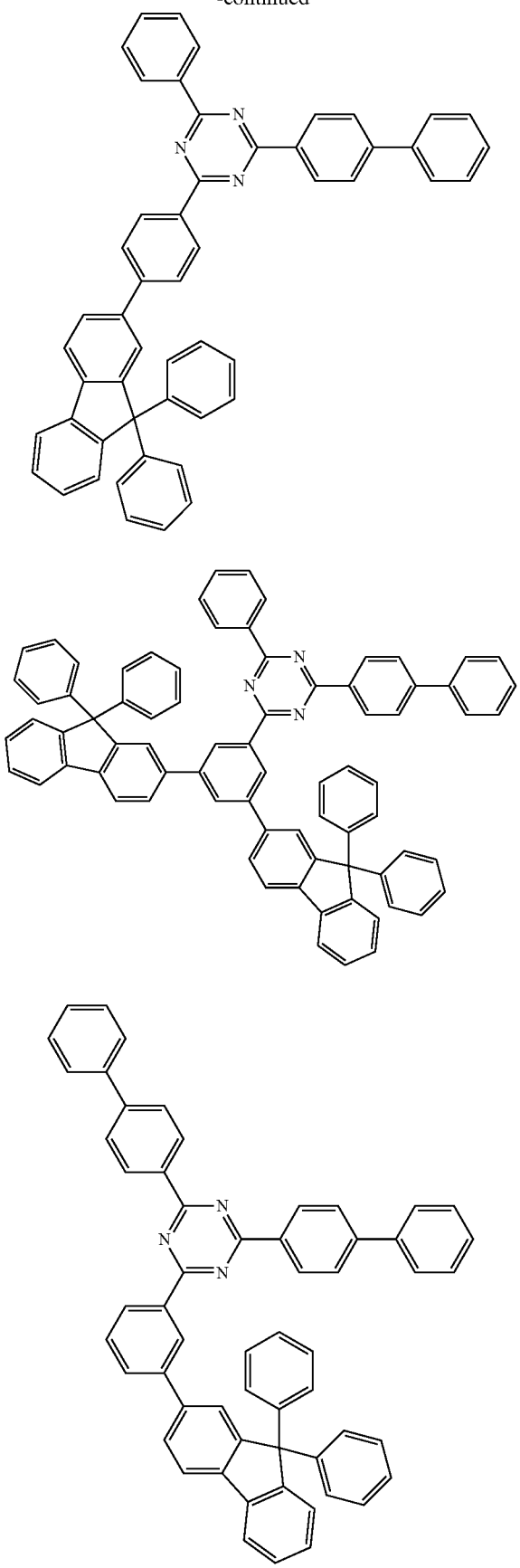
62
-continued
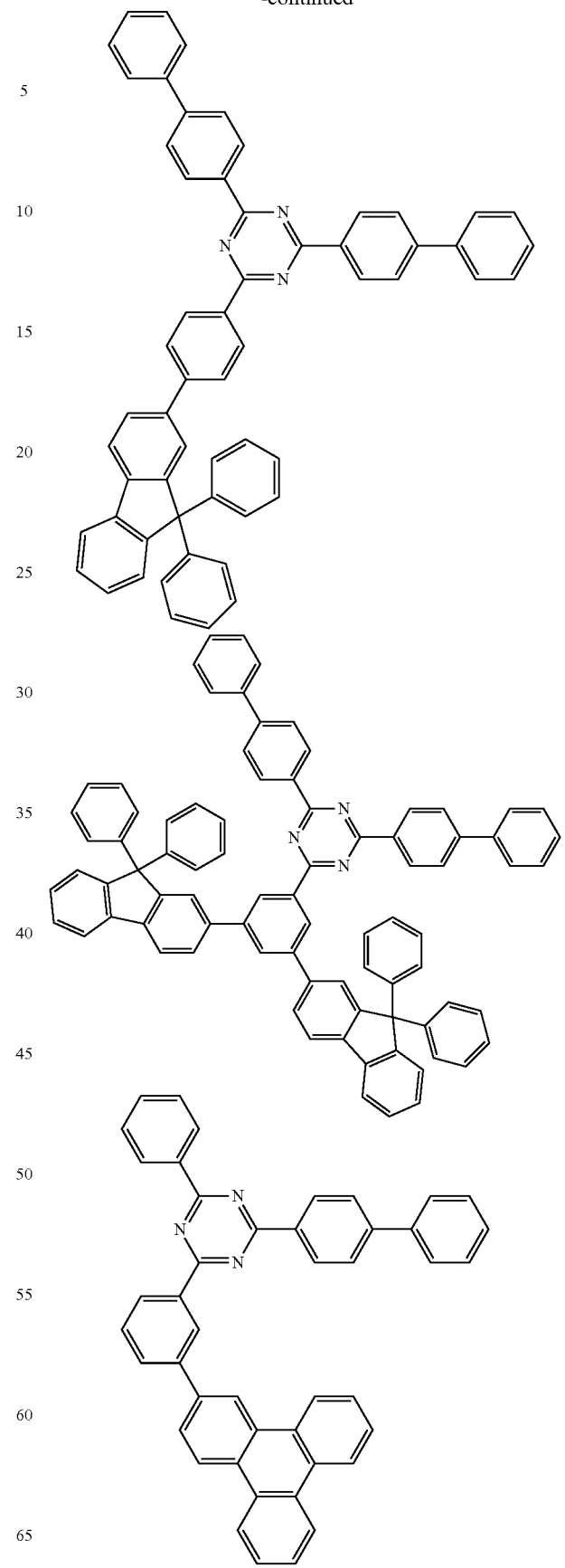

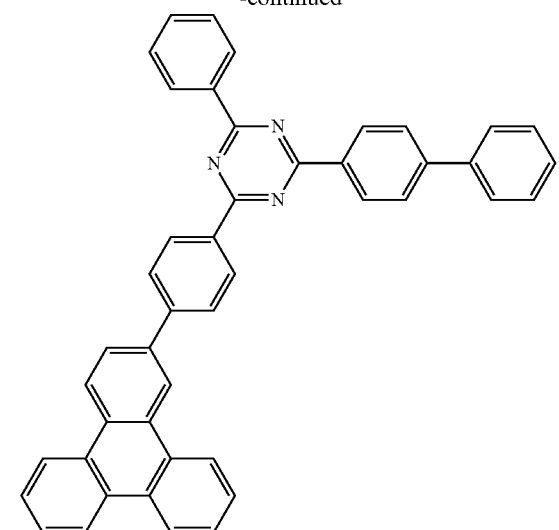
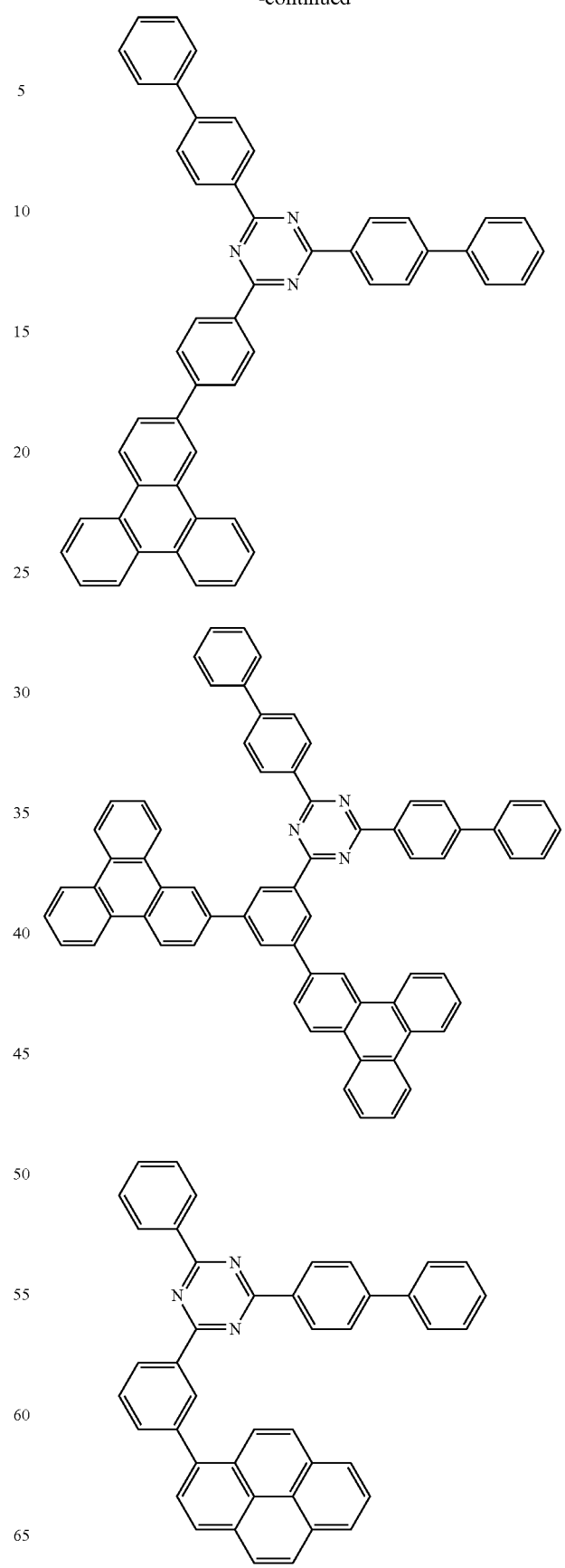

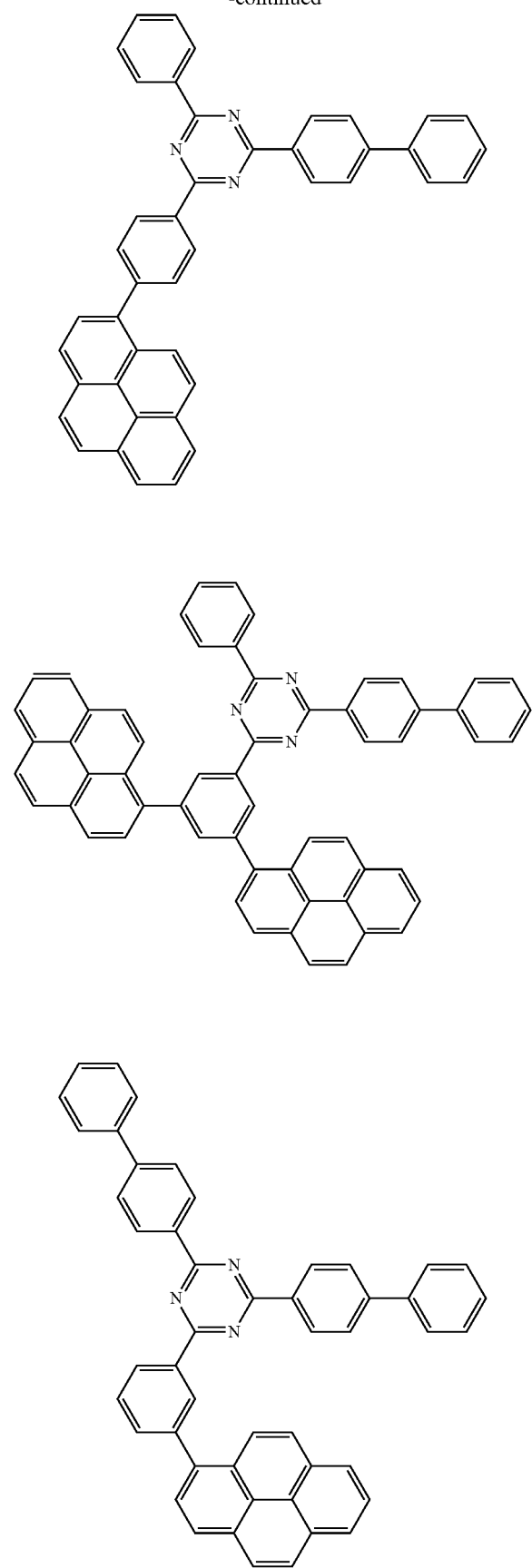
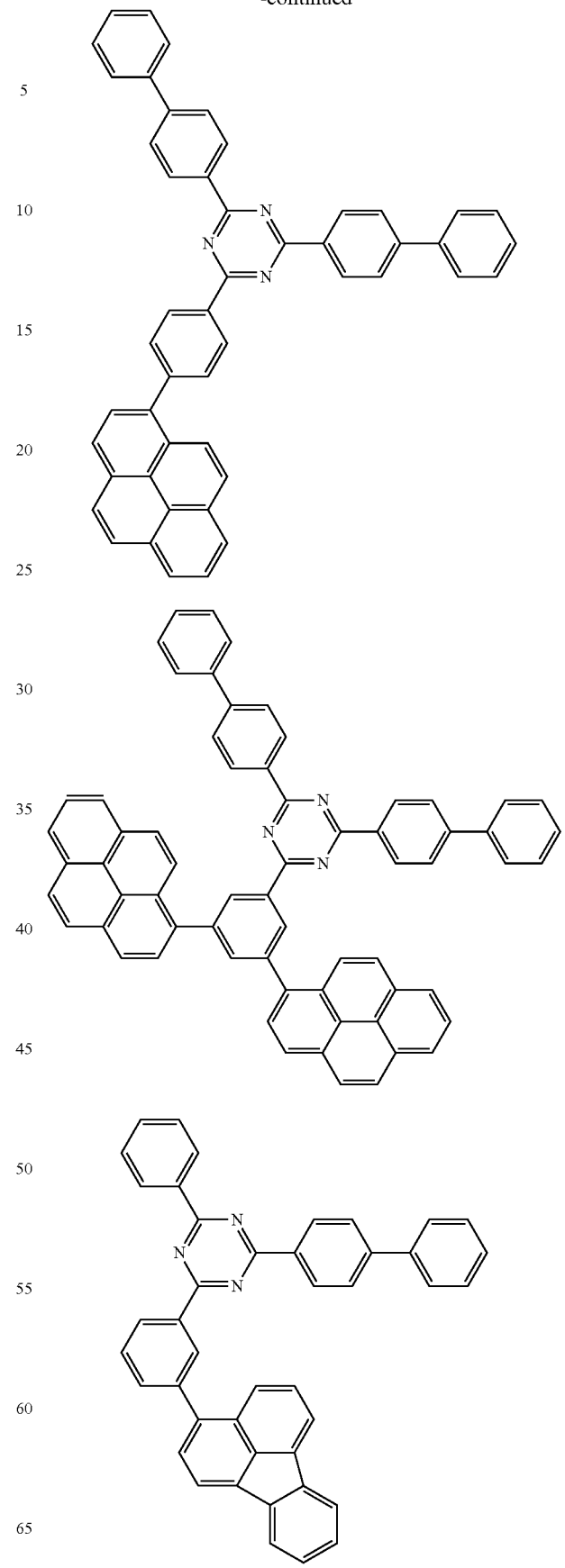

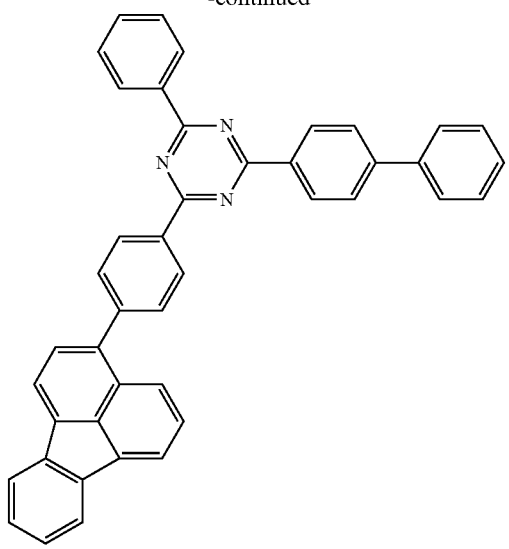
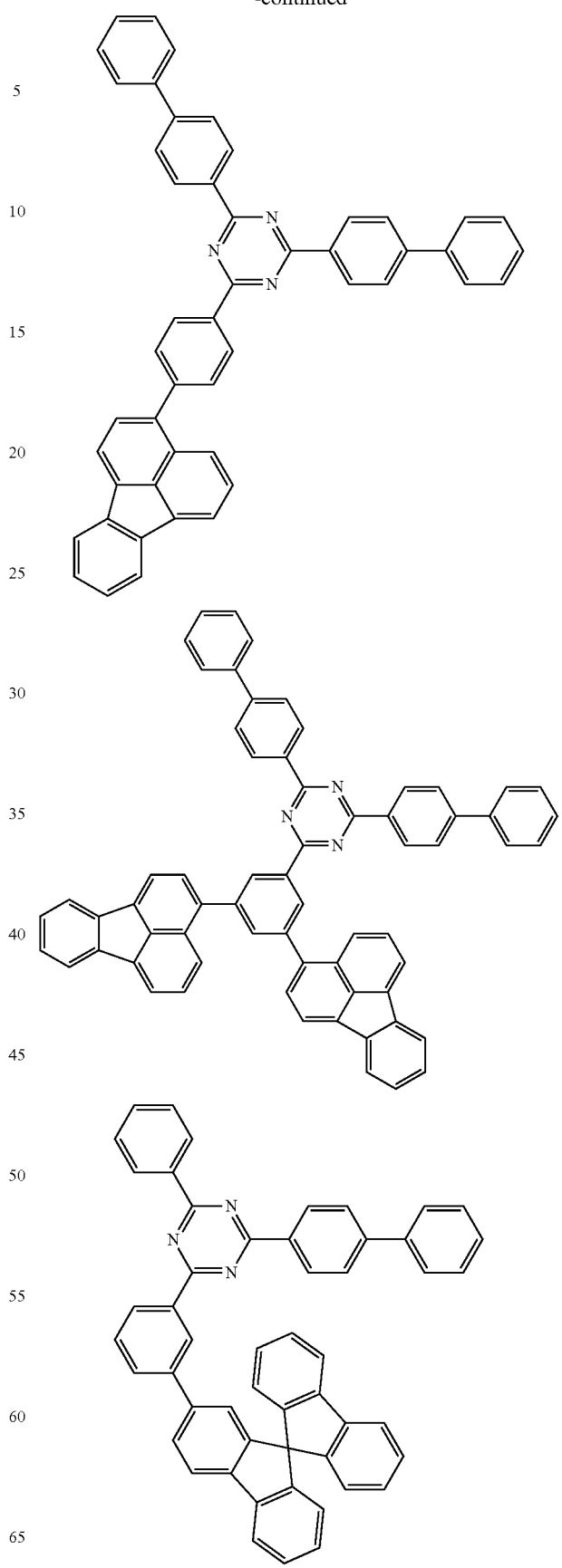

-continued

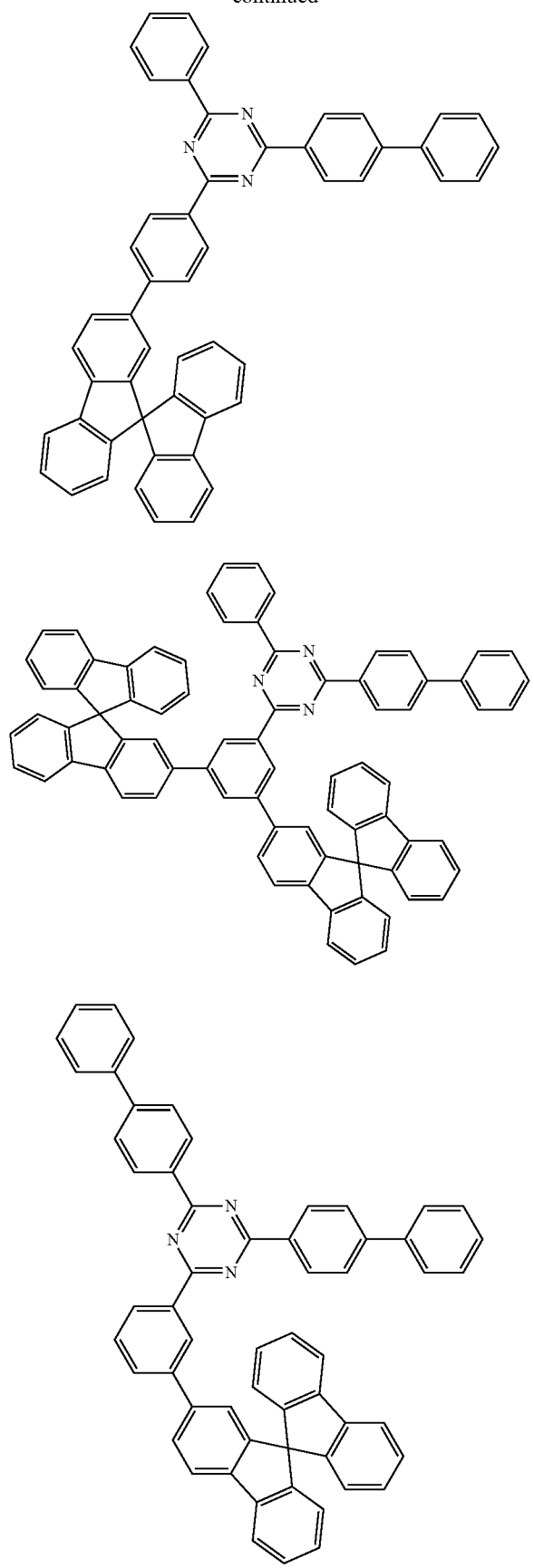

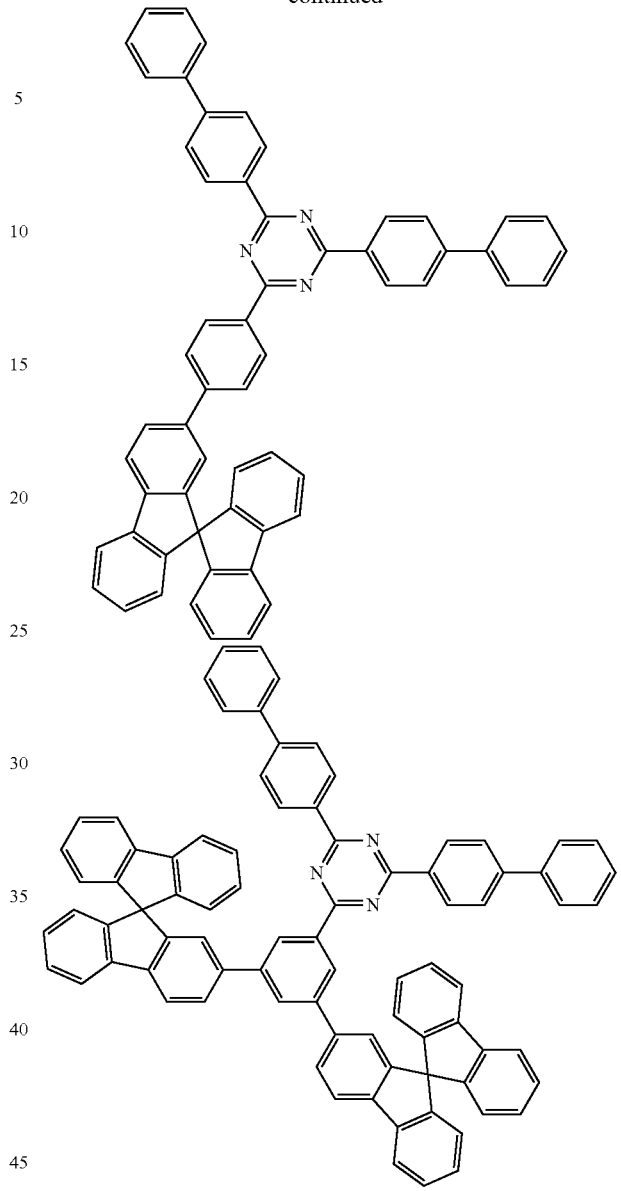

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
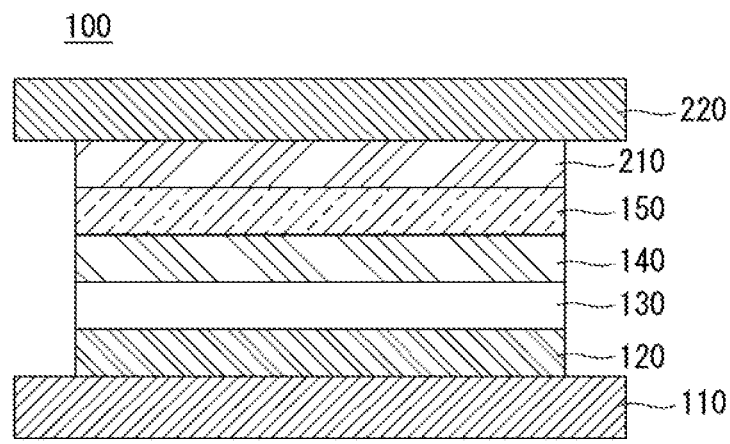
FIG. 1 is a view showing an organic light emitting display device according to a first exemplary embodiment of the present disclosure.

The advantages and features of the present disclosure and methods for accomplishing the same may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims The shapes, sizes, percentages, angles, numbers, etc. shown in the figures to describe the exemplary embodiments of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

The features of various exemplary embodiments of the present disclosure may be combined with one another partly or wholly, and may technically interact or work together in various ways. The exemplary embodiments may be carried out independently or in combination with one another.

Hereinafter, various exemplary embodiments of the present disclosure will be described in detail with reference to the accompanying drawings.

FIG. 1 is a view showing an organic light emitting display device according to a first exemplary embodiment of the present disclosure. All the components of the organic light emitting display devices according to all the embodiments of the present disclosure are operatively coupled and configured.

Referring to FIG. 1, an organic light emitting display device 100 according to the first exemplary embodiment of the present disclosure comprises an anode 110, a hole injection layer 120, a hole transport layer 130, a light emitting layer 140, an electron transport layer 150, an electron injection layer 210, and a cathode 220.

The anode 110 is a hole injection electrode, and may be formed of one among ITO (indium tin oxide), IZO (indium zinc oxide), or ZnO (zinc oxide) having a high work function. Also, if the anode 110 is a reflective electrode, the anode 110 may further comprise a reflective layer formed of one among aluminum (Al), silver (Ag), or nickel (Ni) under a layer formed of one among ITO, IZO, or ZnO.

The hole injection layer 120 may function to facilitate hole injection from the anode 110 to the light emitting layer 140, and may be formed of, but is not limited to, one or more among CuPc (copper phthalocyanine), PEDOT (poly(3,4)-ethylenedioxythiophene), PANI (polyaniline), DNTPD ($N^1$, $N^1$-(biphenyl-4,4'-diyl)bis($N^1$-phenyl-$N^4$,$N^4$-di-m-tolyl-benzene-1,4-diamine), and NPD(N,N'-bis(naphthalene-1-yl)-N,N'-bis(phenyl)-2,2'-dimethylbenzidine). The hole injection layer 120 may have a 1 to 150 nm thickness. If the hole injection layer 120 has a 1 nm thickness or greater, the hole injection properties may be improved, or if the hole injection layer 120 has a 150 nm thickness or less, an increase in the thickness of the hole injection layer 120 may be prevented and a rise in operating voltage may be therefore prevented. The hole injection layer 120 may not be included in the elements of the organic light emitting display device, depending on the structure or characteristics of the organic light emitting display device.

The hole transport layer 130 may function to facilitate hole transport, and may be formed of, but is not limited to, one or more among NPD(N,N'-bis(naphthalene-1-yl)-N,N'-bis(phenyl)-2,2'-dimethylbenzidine), TPD(N,N'-bis-(3-methylphenyl)-N,N'-bis(phenyl)-benzidine), spiro-TAD(2,2'7,7'-tetrakis(N,N-diphenylamino)-9,9'-spirofluorene), NPB(N,N'-bis(naphthalene-1-yl-N,N'-bis(phenyl)-benzidine), and MTDATA(4,4',4"-Tris(N-3-methylphenyl-N-phenylamino)-triphenylamine). The hole transport layer 130 may have a 1 to 150 nm thickness. If the hole transport layer 130 has a 1 nm thickness or greater, the hole transport properties may be improved, or if the hole transport layer 130 has a 150 nm thickness or less, an increase in the thickness of the hole transport layer 130 may be prevented, and a rise in operating voltage may be therefore prevented. Also, an electron blocking layer may be further formed over the hole transport layer 130.

The light emitting layer 140 may emit light of red (R), green (G), or blue (B), and may be formed of a fluorescent material or phosphorescent material.

If the light emitting layer 140 is a red light emitting layer, it may be formed of, but is not limited to, a fluorescent material comprising PBD:Eu(DBM)$_3$(Phen) or perylene. If the light emitting layer 140 is a green light emitting layer, it may be formed of, but is not limited to, a fluorescent material comprising Alq$_3$(tris(8-hydroxyquinolinato)aluminum). If the light emitting layer 140 is a blue light emitting layer, it may be formed of, but is not limited to, a fluorescent material comprising one among spiro-BDAVBi(2,7-bis[4-diphenylamino)styryl]-9,9-spirofluorene), spiro-CBP(2,2',7,7'-tetrakis(carbozol-9-yl)-9,9-spirofluorene), distyrylbenzene (DSB), distyrylarylene (DSA), a polyfluorene (PFO) polymer, and a polyphenylenevinylene (PPV) polymer.

In the organic light emitting display device, the electron transport layer 150 is on the light emitting layer 140. The electron transport layer 150 is formed of a material that has electron transport properties, with high electron mobility, to facilitate electron transport. Also, the electron transport layer 150 is required to have an amorphous structure in order to stably run the device. If the electron transport layer 150 has a crystalline structure, a crystallized part of a thin film acts as a path through which current can easily move. That is, when a current is concentrated at the crystallized part of the thin film, decay occurs rapidly at the crystallized part of the thin film. Decay of the electron transport layer 150 leads to a decrease in the lifetime of the organic light emitting display device. Accordingly, the present inventors conducted several tests or experiments to prevent a decrease in the device's lifetime and improve the device's efficiency by forming an electron transport layer 150 formed of a material with an amorphous structure and high electron mobility.

Through a number of tests or experiments which were performed on materials that do not affect the lifetime or efficiency of the organic light emitting display device and that cause no rise in operating voltage, the present inventors developed organic compounds that have an amorphous structure and provide electron transport properties with the use of a single material. An organic compound of this disclosure comprises p-biphenyl triazine as a core to form an electron transport layer. The LUMO (lowest unoccupied molecular orbital) energy level of a p-biphenyl triazine compound is concentrated in the p-biphenyl triazine groups, and this facilitates electron movement between neighboring p-biphenyl triazine groups within a molecular stack through this LUMO energy level, thereby improving electron mobility.

Moreover, an organic compound of this disclosure includes an aryl group of at least 10 or more carbon atoms with high steric effect, which is a substituent, and has an asymmetrical substitution form around a triazine, in order to have an amorphous structure by eliminating coplanarity and reducing symmetry. By forming an electron transport layer 150 formed of an organic compound with an amorphous structure according to the present disclosure, decay of the electron transport layer 150 may be prevented.

Accordingly, the electron transport layer 150 of this disclosure comprises an organic compound represented by the following Chemical Formula 1:

[Chemical Formula 1]

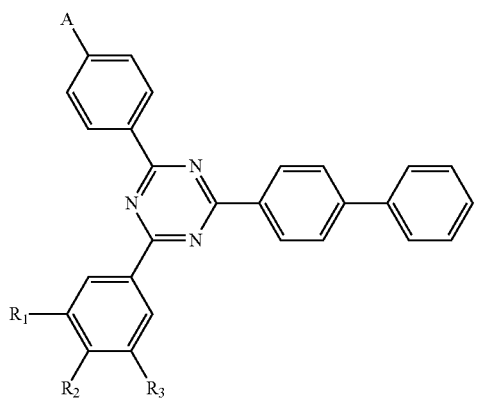

wherein A includes one among hydrogen and a phenyl group, $R_1$ to $R_3$ include independently one among hydrogen and an aryl group of 10 to 30 carbon atoms, with at least one among $R_1$ to $R_3$ being an aryl group, except for the case that $R_1$ to $R_3$ are all hydrogen.

Further, $R_1$ to $R_3$ may be independently one among the following compounds:

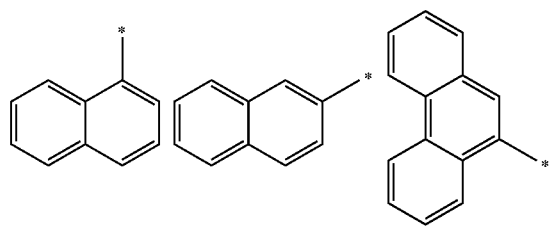

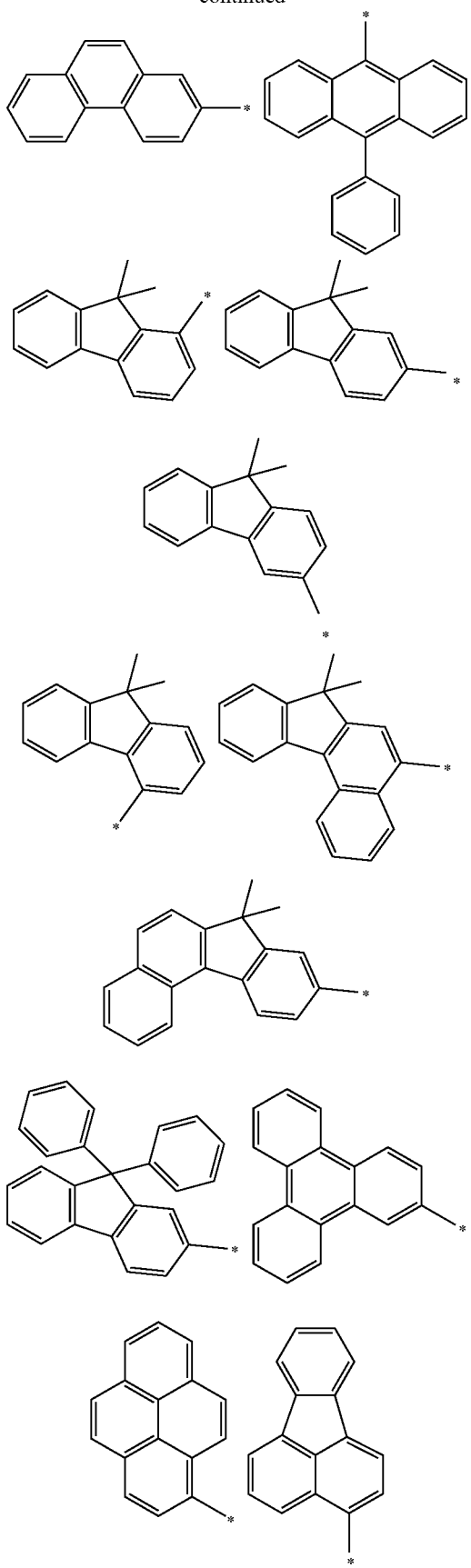

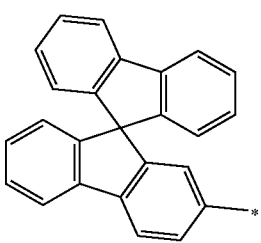
The organic compound of this disclosure represented by Chemical Formula 1 may be one among the following compounds:
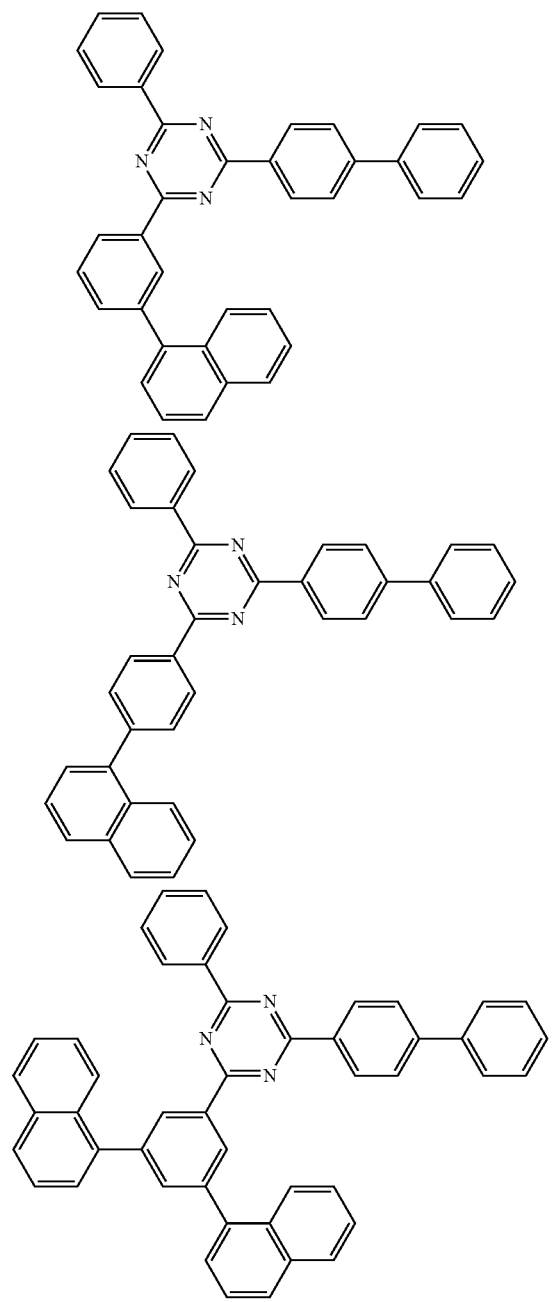
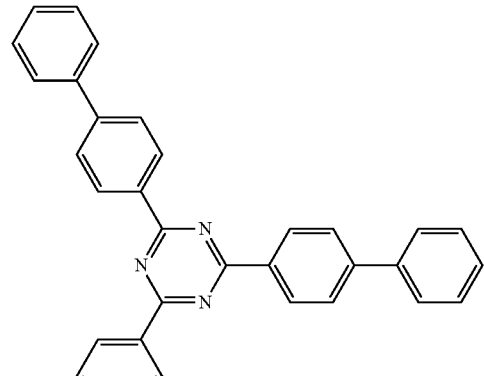

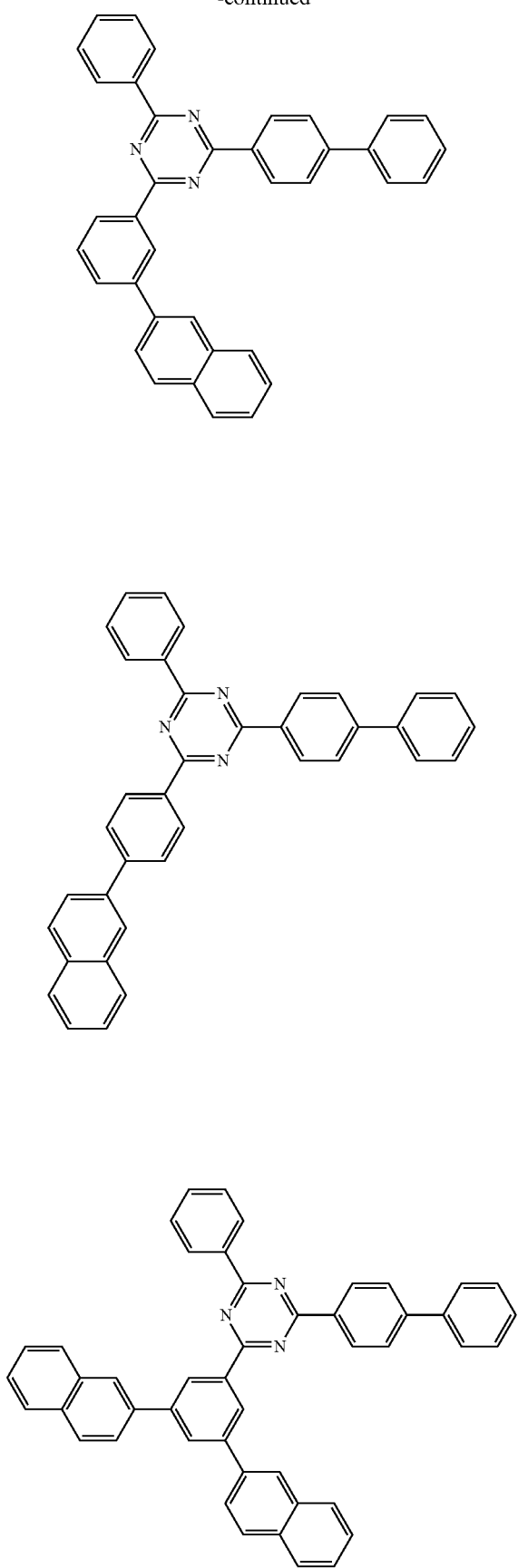
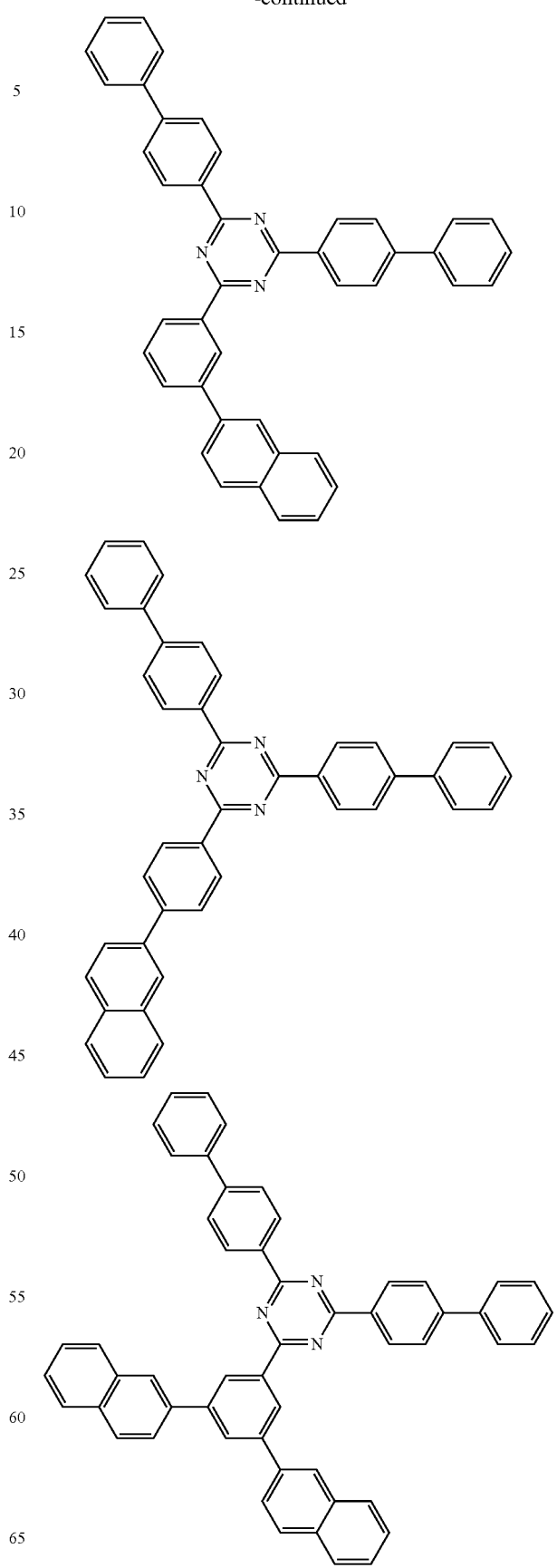

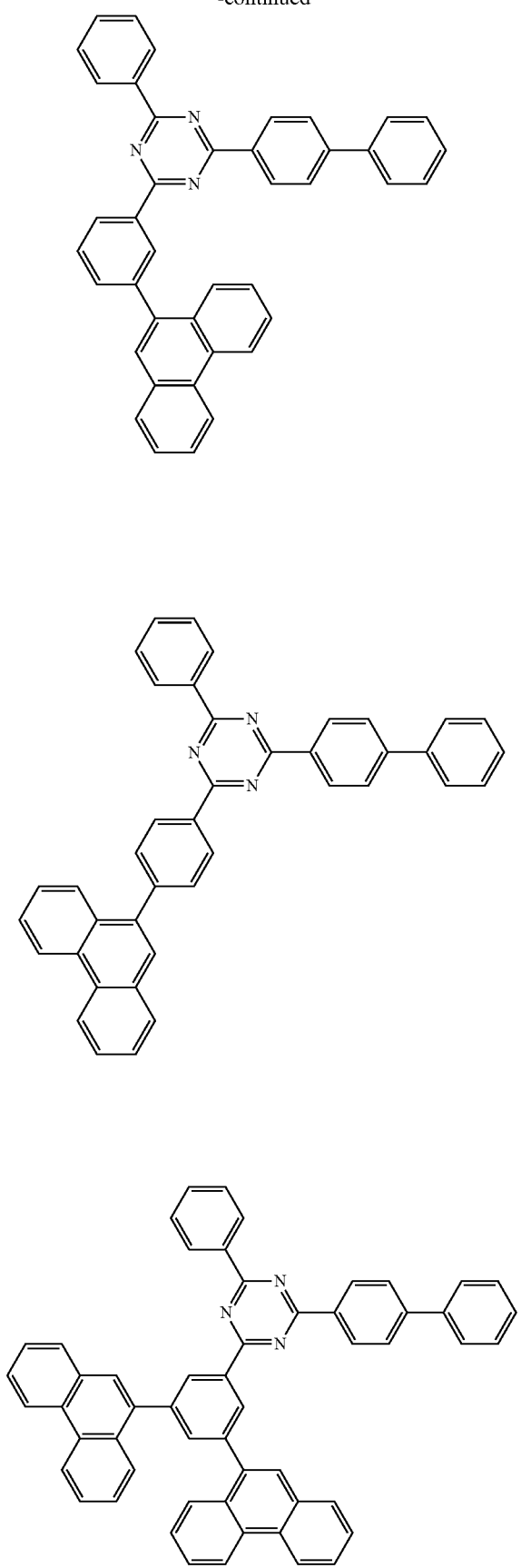
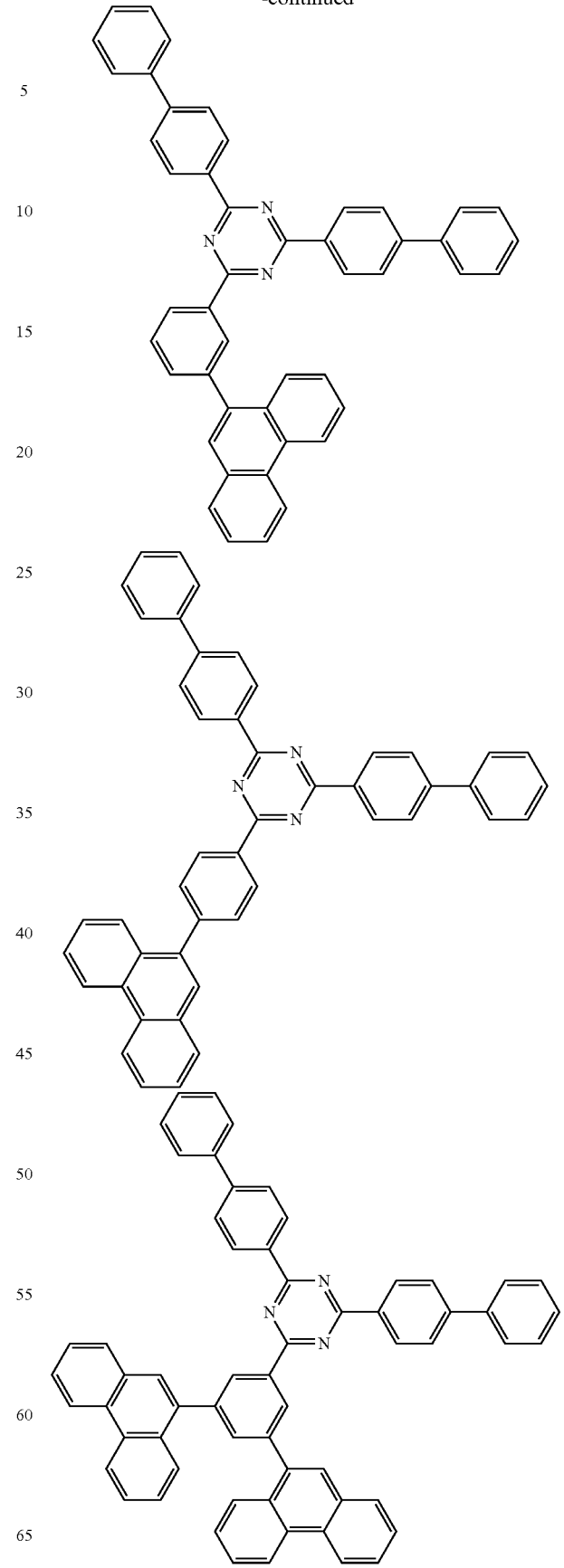

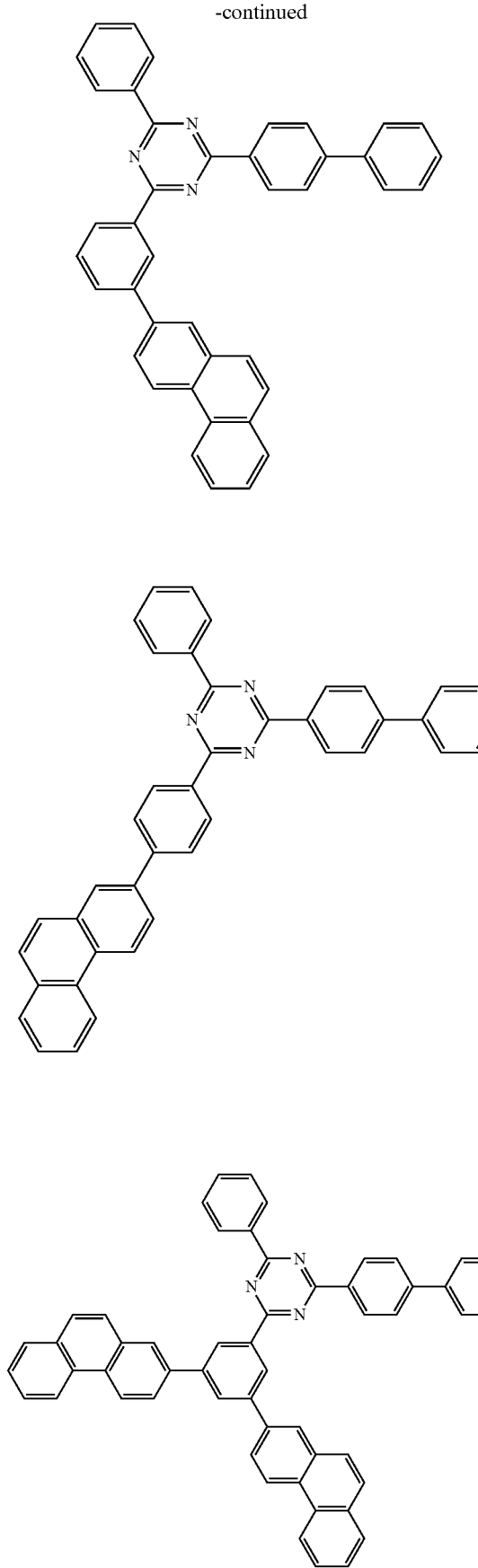
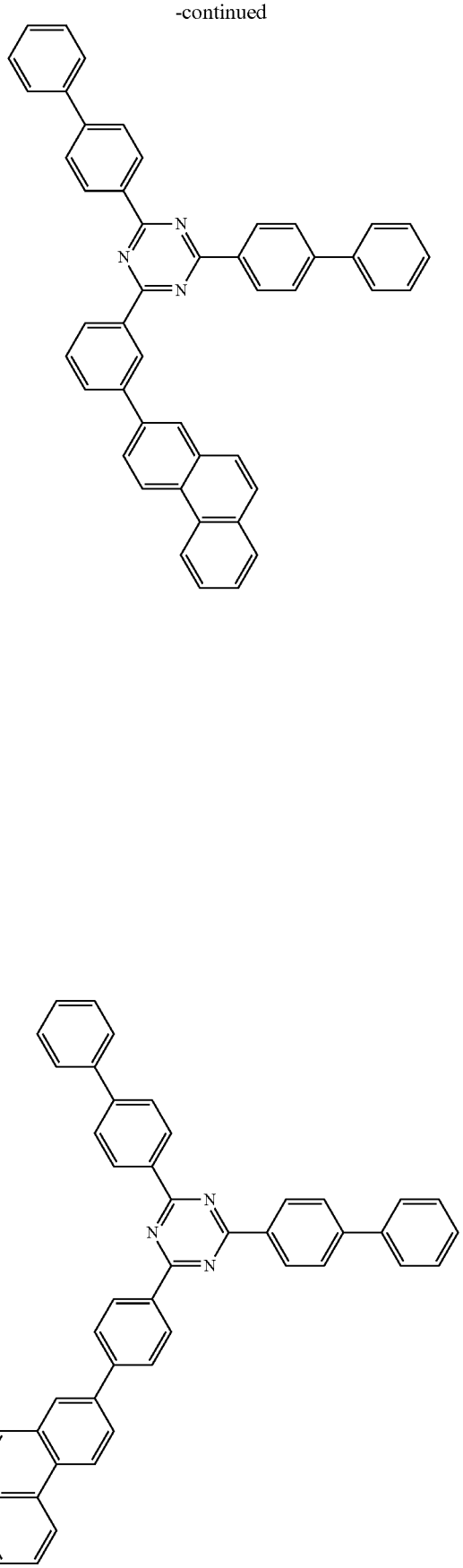

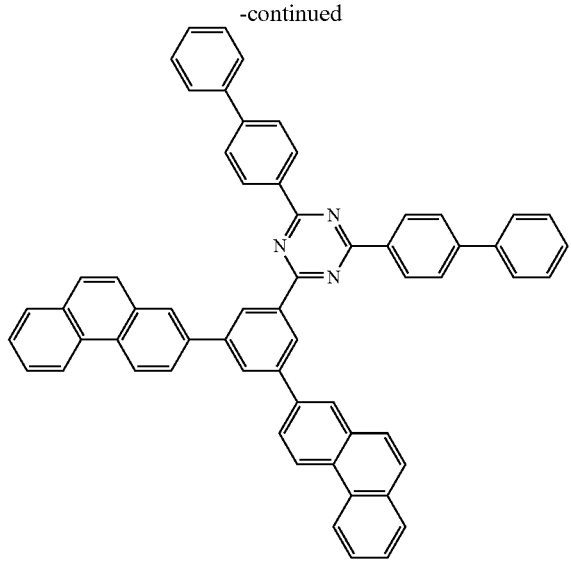
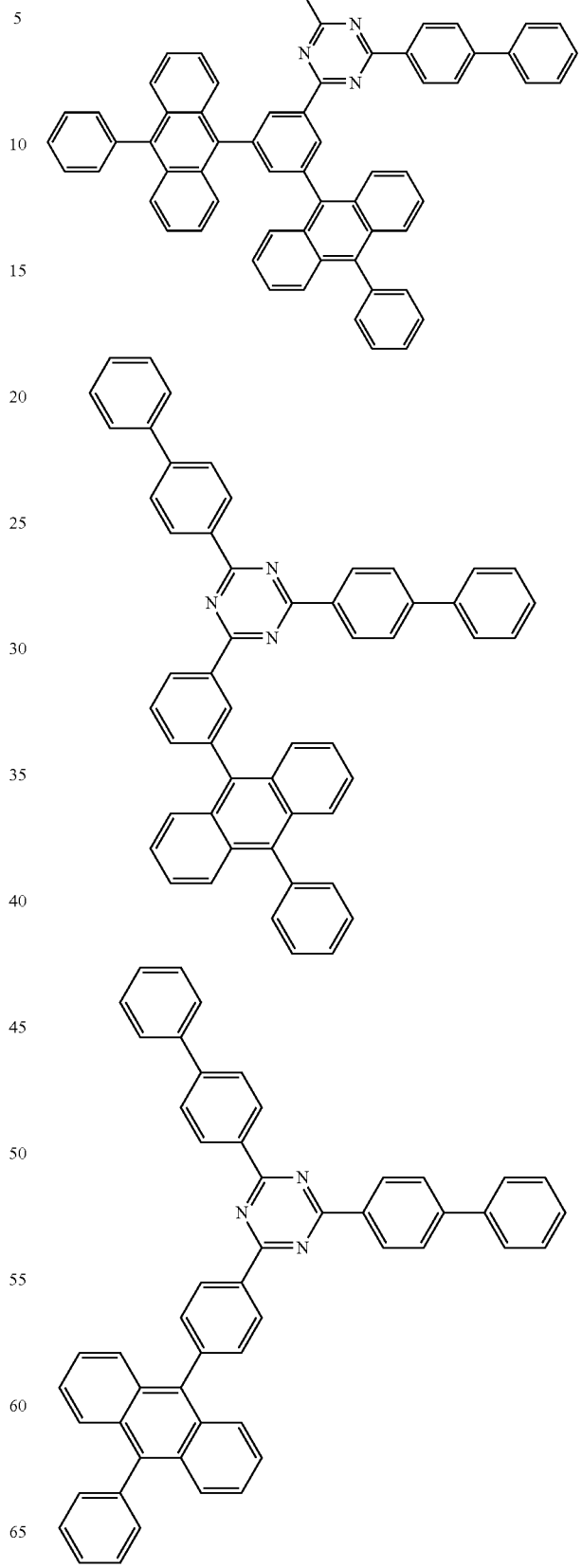

85
-continued
86
-continued
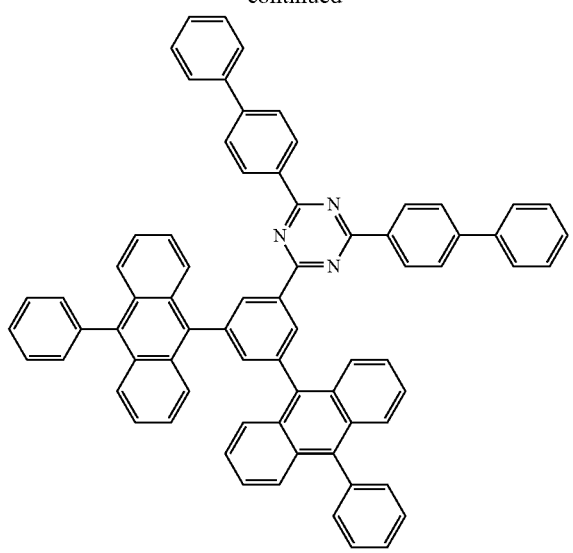
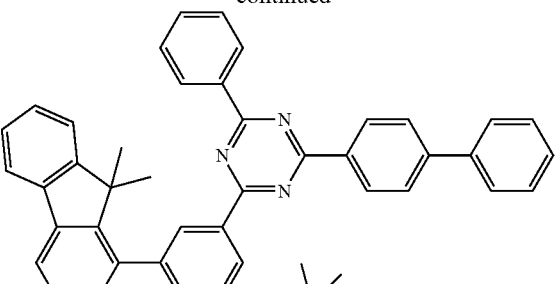
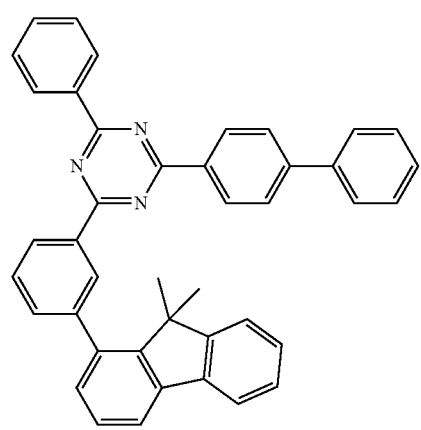
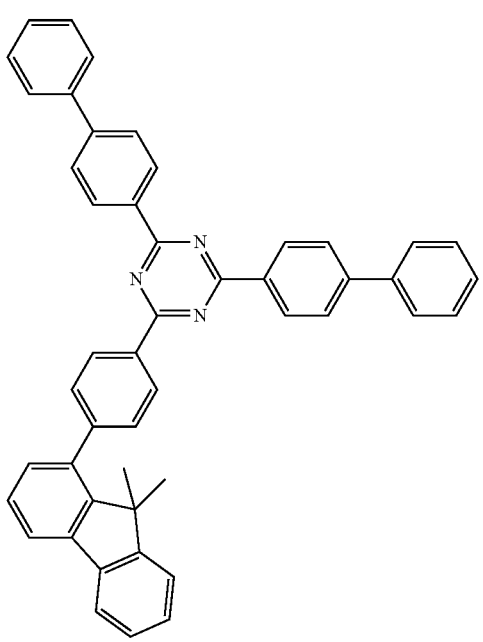
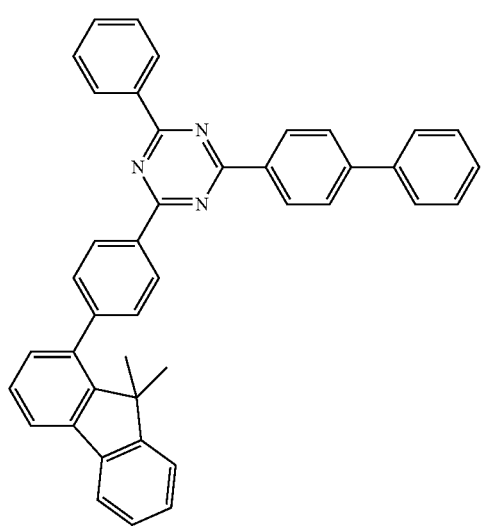

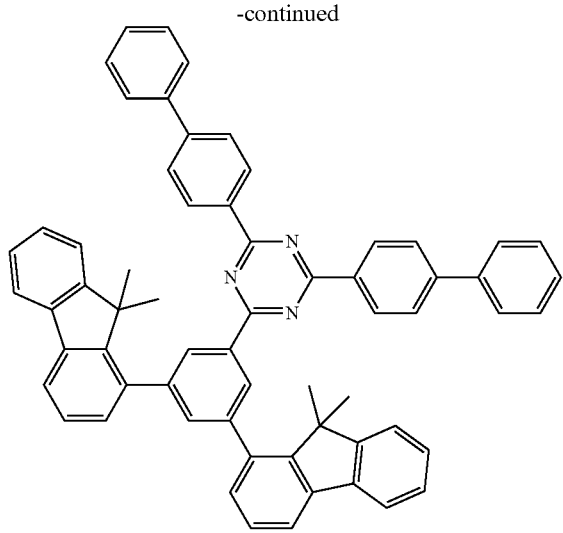
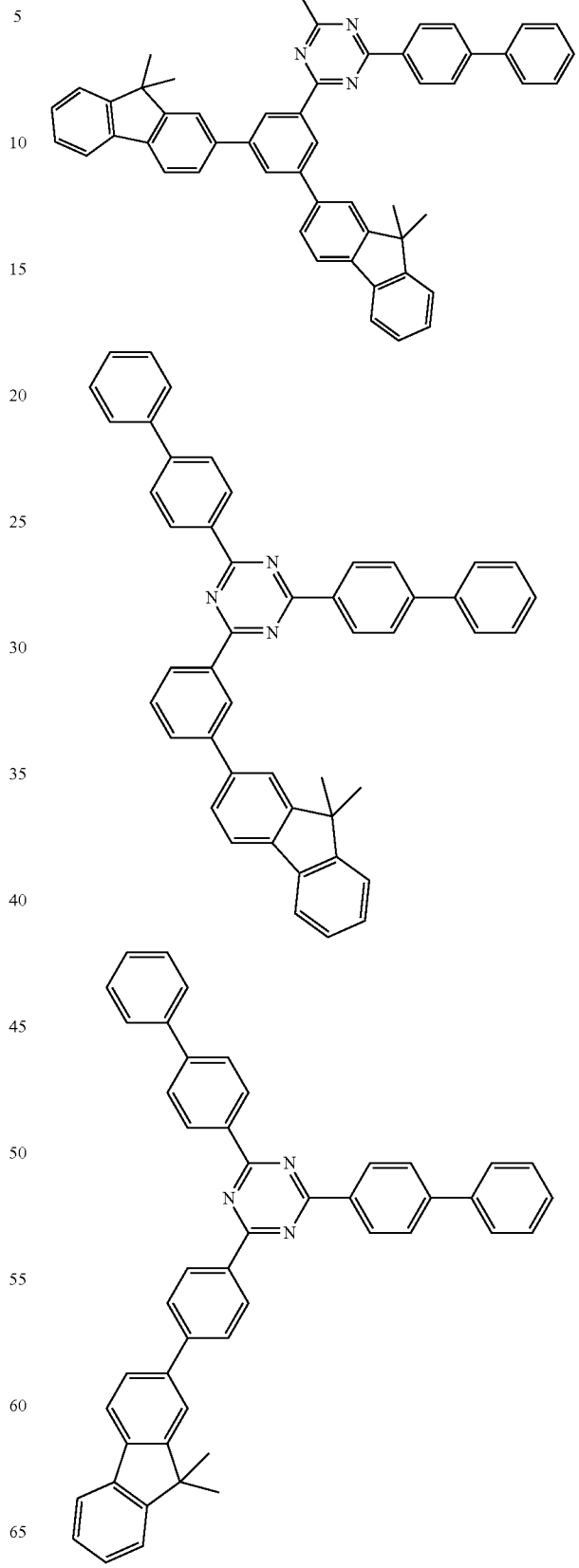

89
-continued
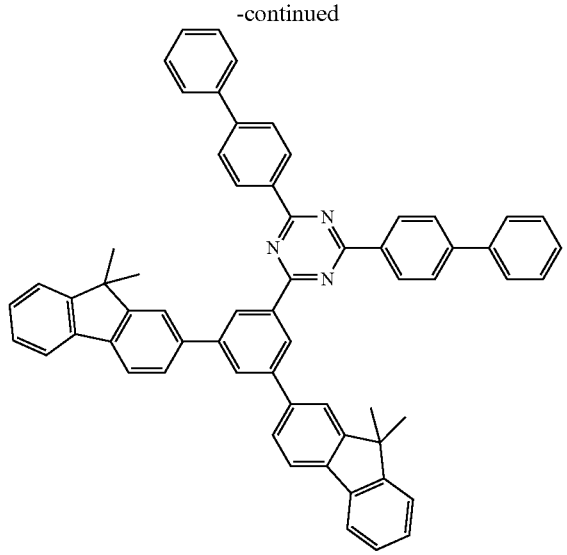
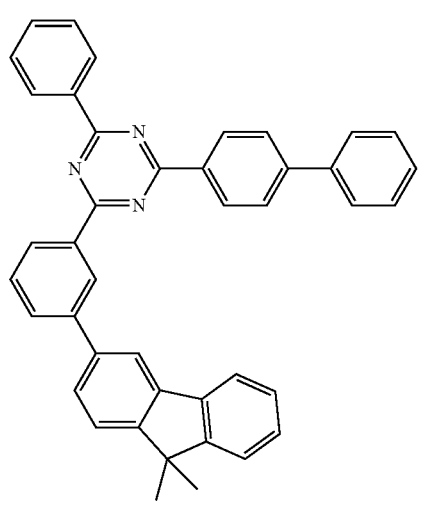
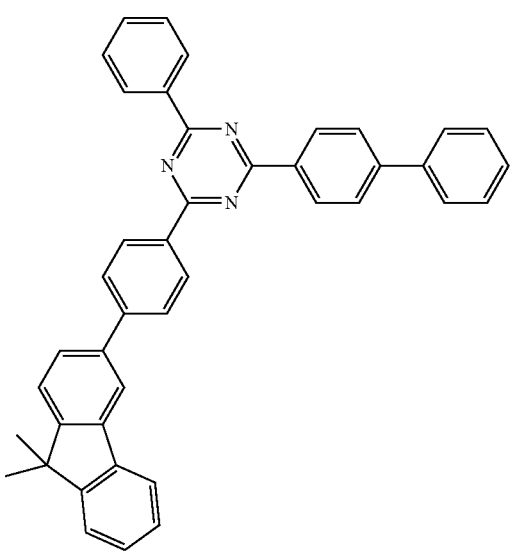
90
-continued
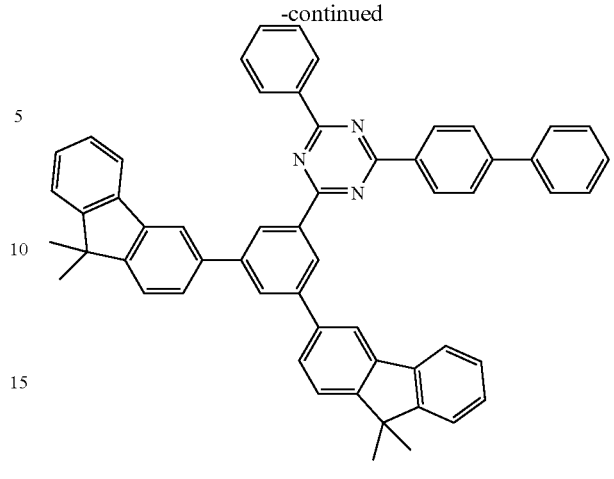
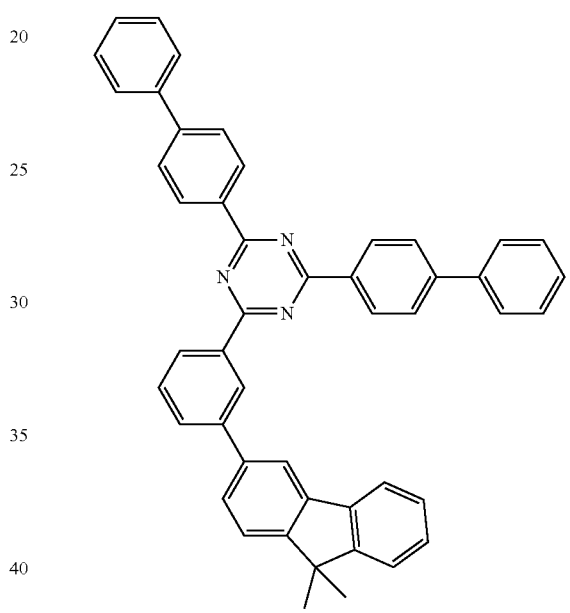
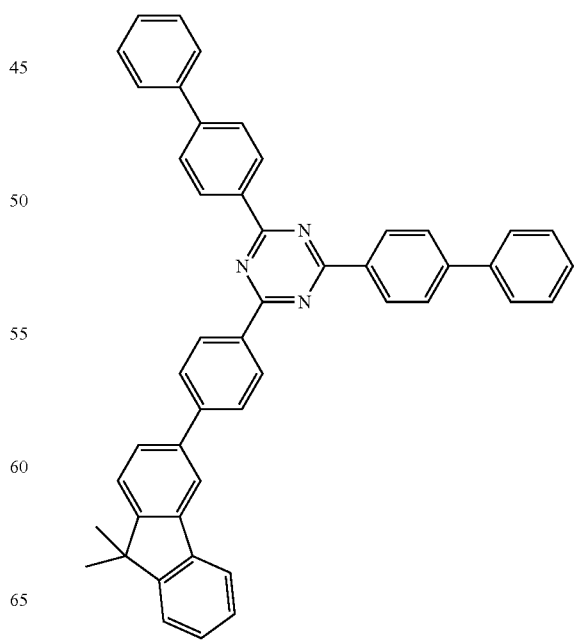

91
-continued
92
-continued
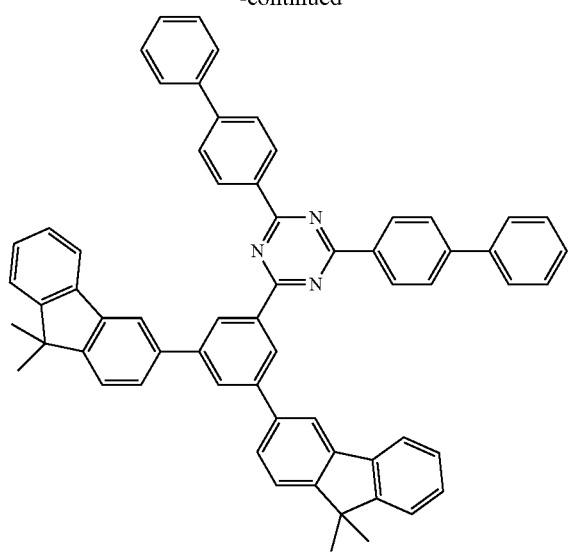
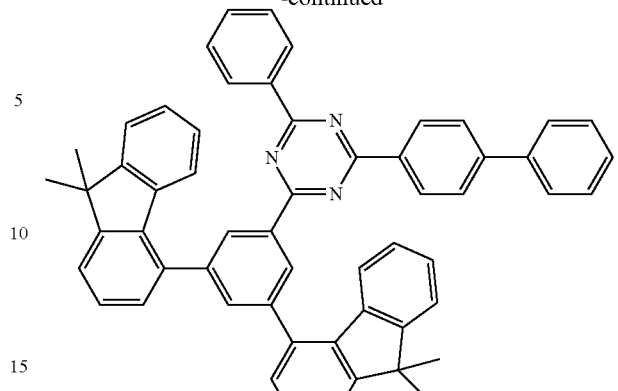
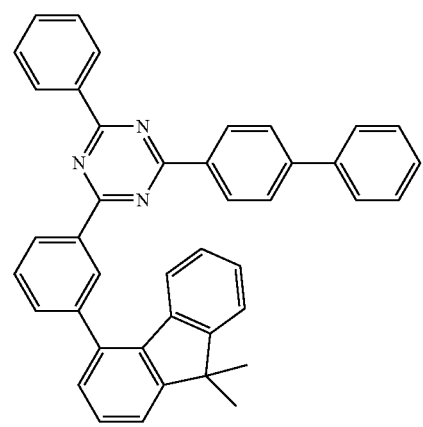
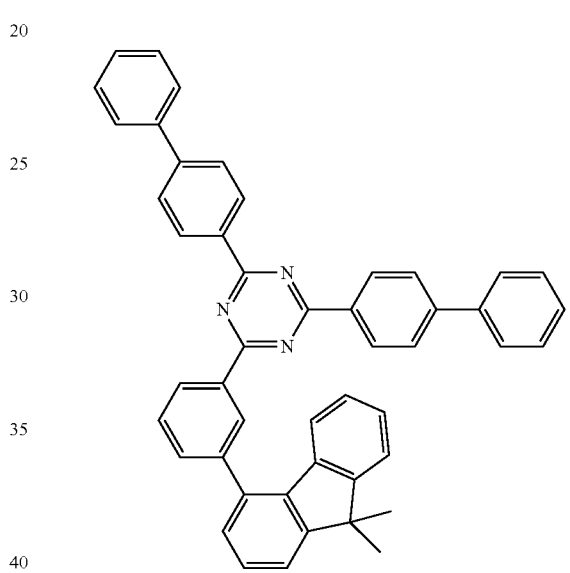
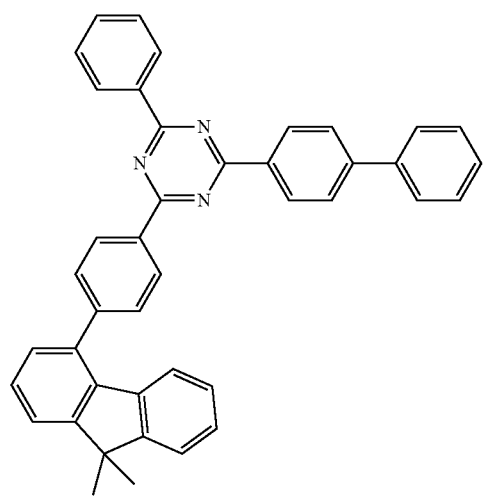

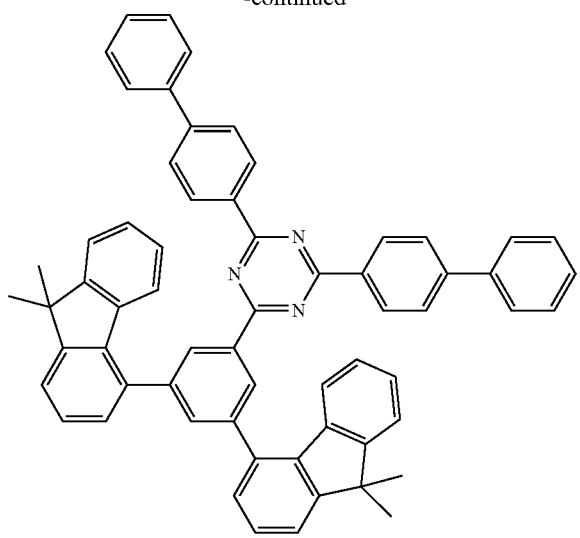
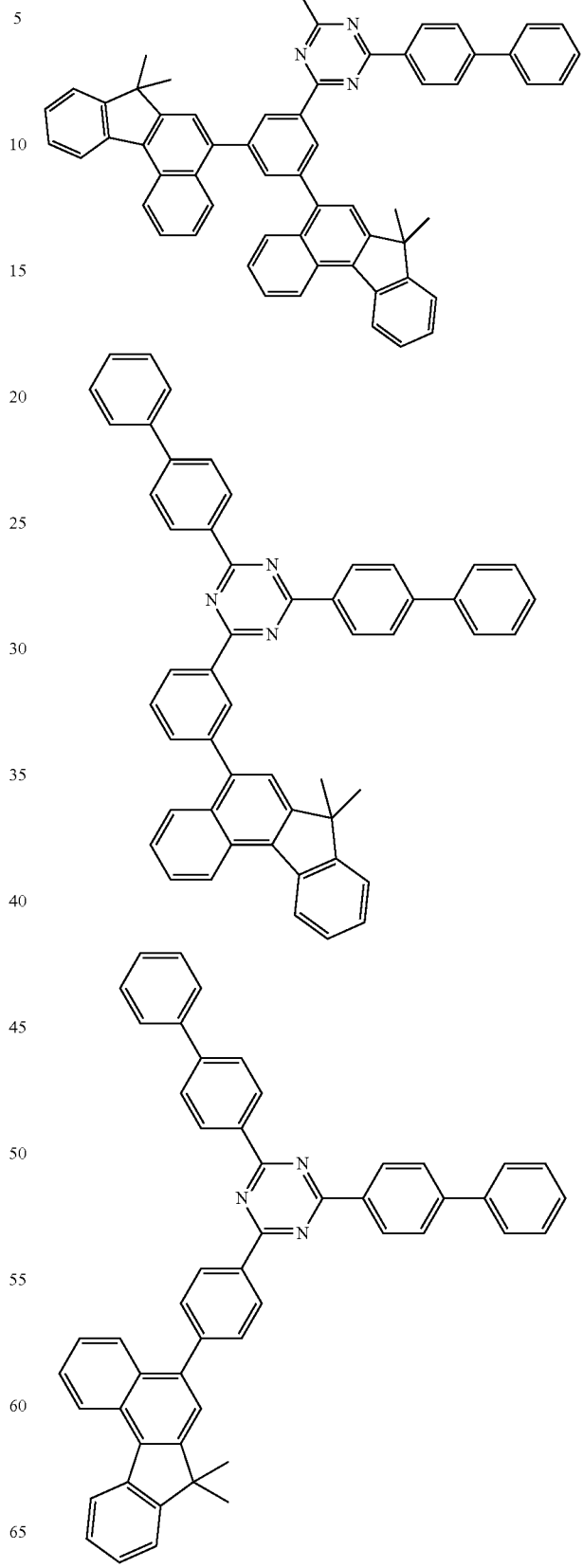

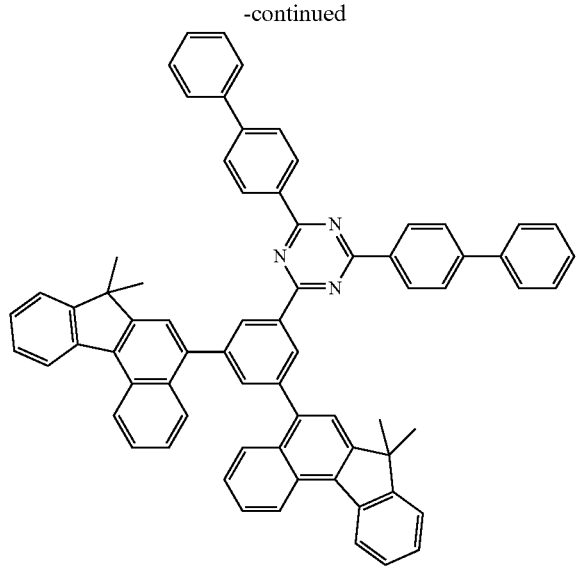
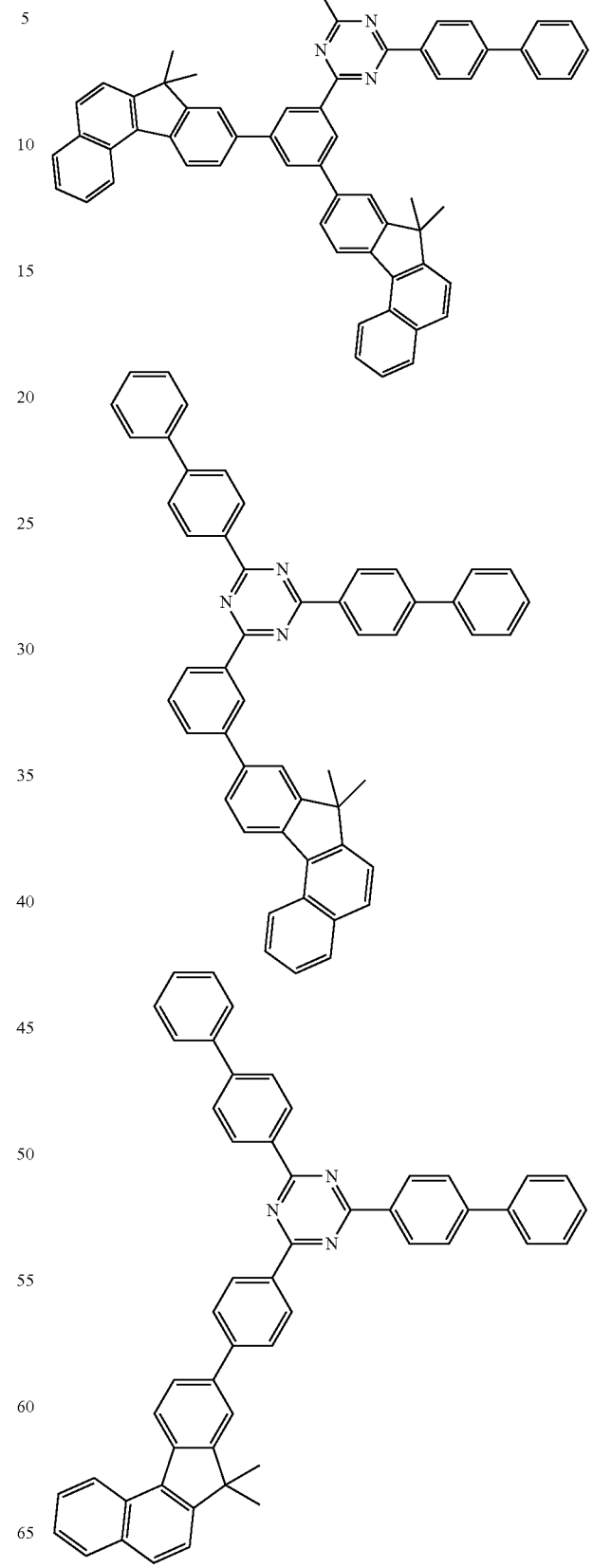

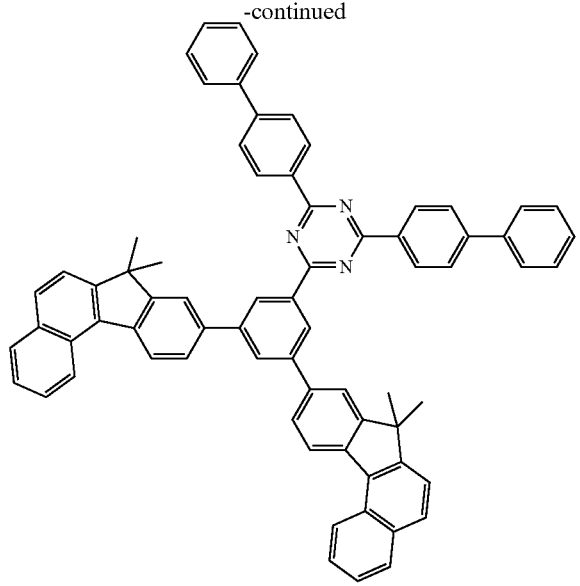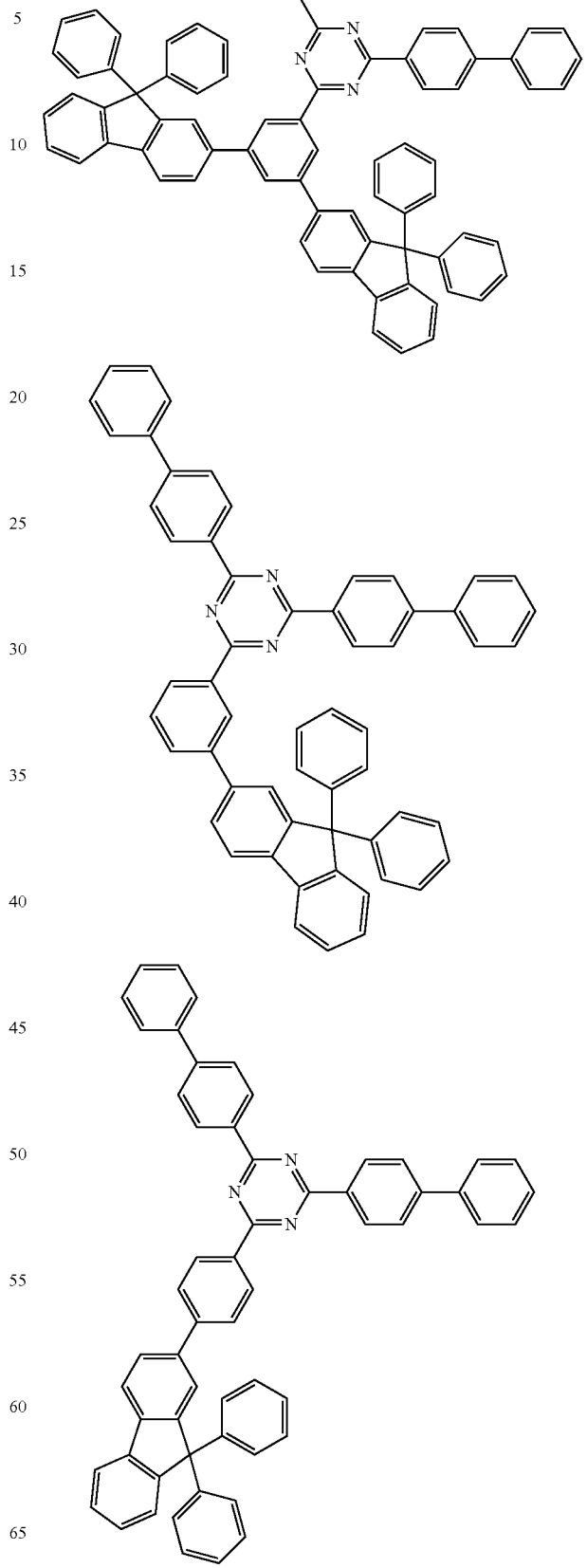

99
-continued
100
-continued
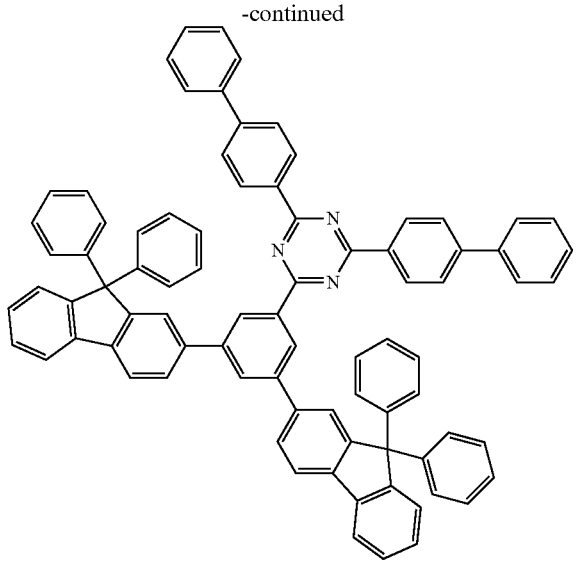
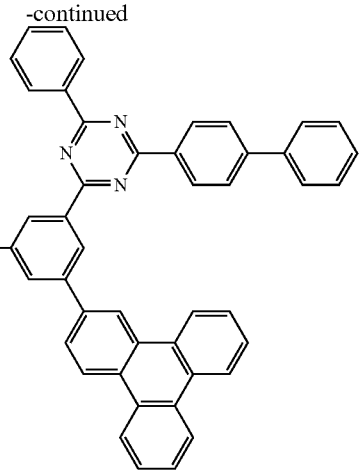
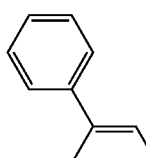
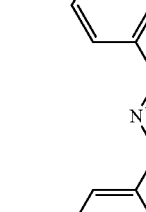
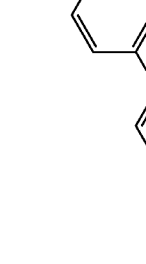
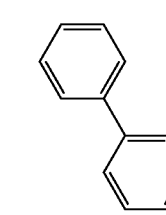
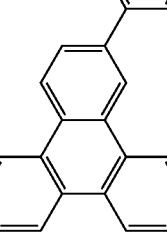

101
-continued
102
-continued
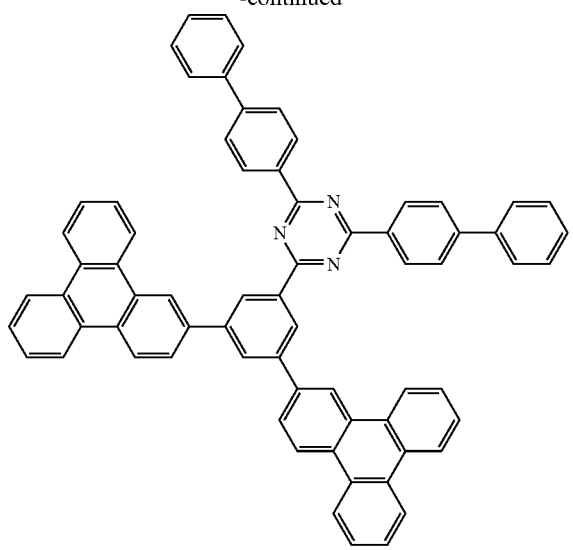
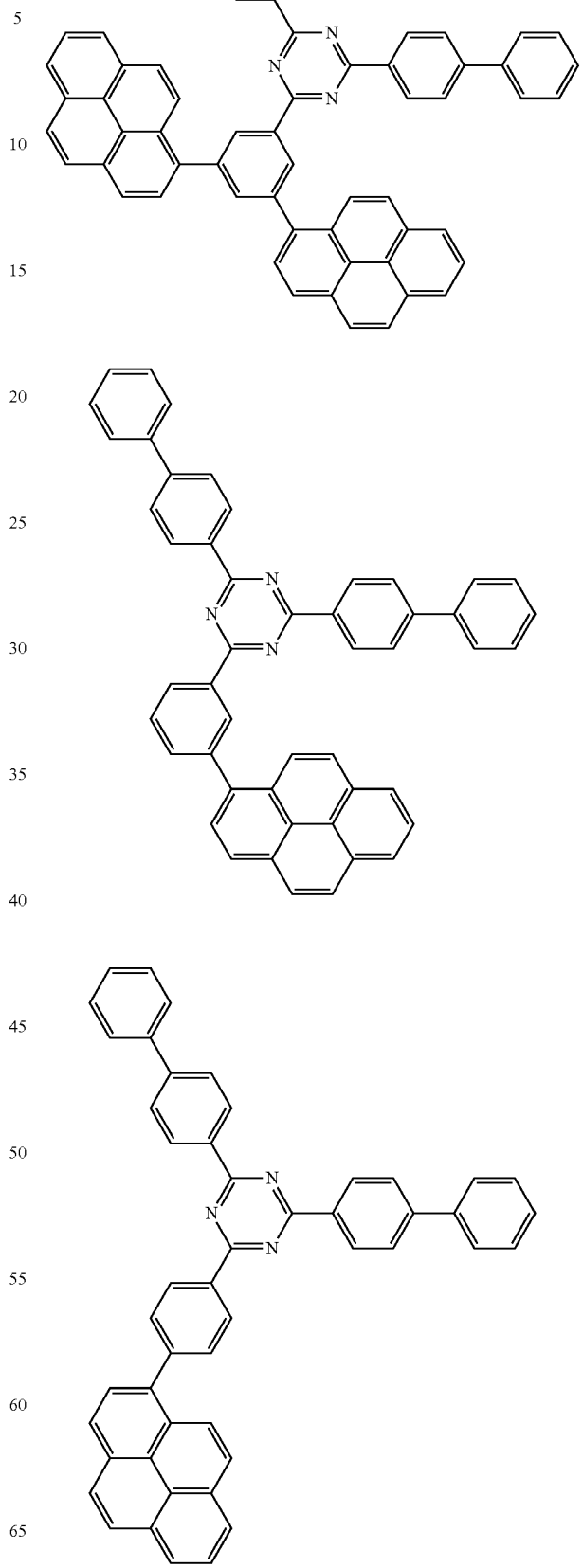

103
-continued
104
-continued
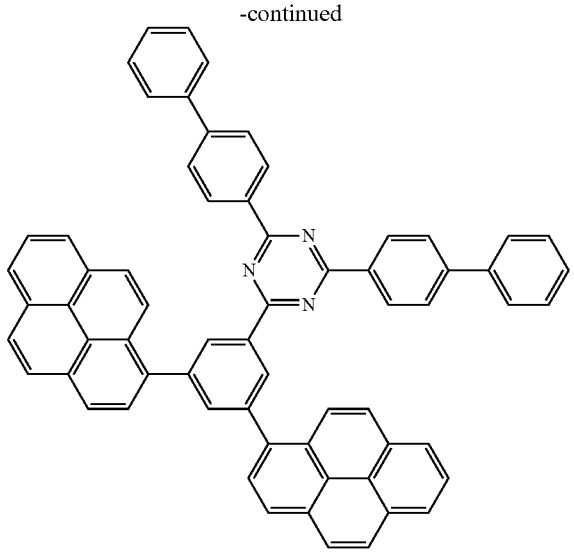
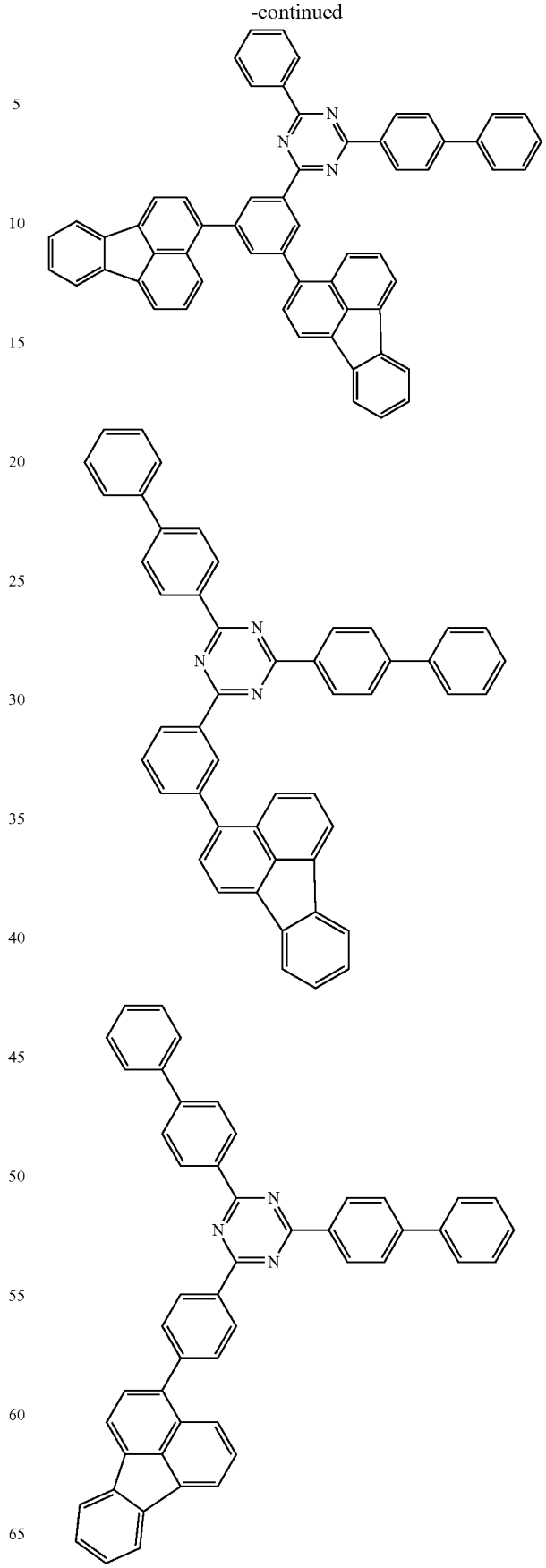

105
-continued
106
-continued
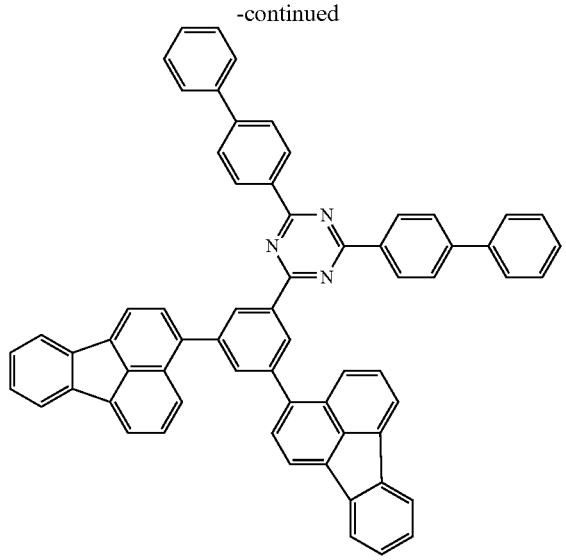
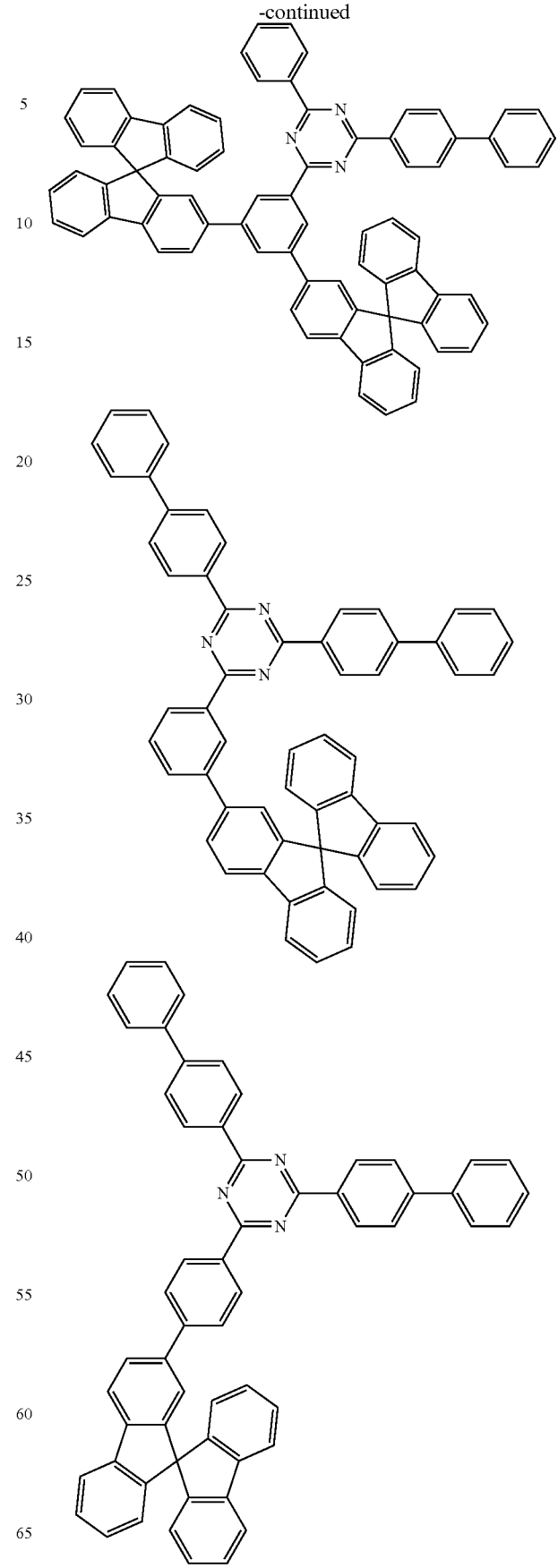

-continued

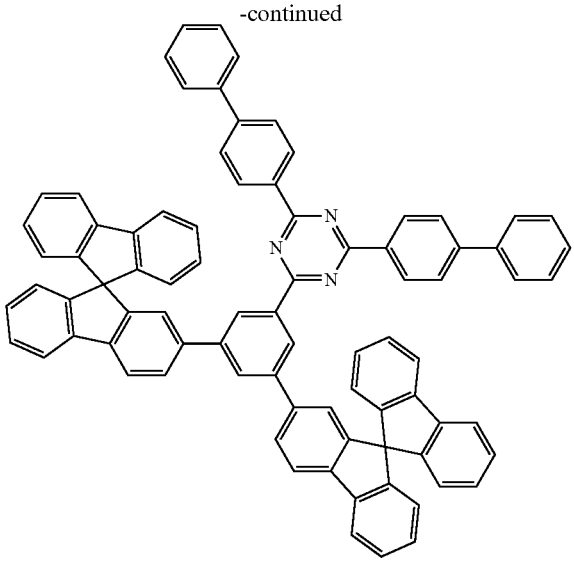

An organic compound of this disclosure comprises p-biphenyl triazine as a core to facilitate electron movement between neighboring p-biphenyl triazine groups within the molecular stack in the electron transport layer. Moreover, an organic compound of this disclosure includes an aryl group of at least 10 or more carbon atoms with high steric effect, which is a substituent, and has an asymmetrical substitution form around a triazine, in order to have an amorphous structure by eliminating coplanarity and reducing symmetry.

Accordingly, the electron transport layer is formed of an organic compound of this disclosure to improve electron mobility, thereby reducing the operating voltage of the device and improving the efficiency. Also, the organic compound of this disclosure may prevent decay of the electron transport layer for its amorphous structure.

The electron transport layer 150 further comprises a dopant. The dopant may be one among an alkali metal, an alkali earth metal, an alkali metal compound, an alkali earth metal compound, an organic complex of alkali metals, or an organic complex of alkali earth metals. For example, the electron transport layer 150 may further comprise Liq. The aforementioned dopant may improve the electron injection capability of the electron transport layer 150 for its high affinity for electrons. The percentage of the dopant may be 10 to 90% by weight of the total weight of electron transport layer 150.

The electron transport layer 150 may have a 1 to 150 nm thickness. If the electron transport layer 150 has a 1 nm thickness or greater, a degradation of the electron transport properties may be prevented, or if the electron transport layer 150 has a 150 nm thickness or less, an increase in the thickness of the electron transport layer 150 may be prevented, and a rise in operating voltage may be therefore prevented.

The electron injection layer 210 functions to facilitate electron injection, and may be formed of, but is not limited to, one among $Alq_3$ (tris(8-hydroxyquinolinato)aluminum), PBD(2-4-biphenyl)-5-(4-tert-butylphenyl)-1,3,4-oxadiazole), TAZ(3-(4-biphenyl)-4-pheynyl-5-tert-butylphenyl-1,2,4-triazole), and BAlq(Bis(2-methyl-8-quinolinolato)-4-(phenylphenolato)aluminum). On the other hand, the electron injection layer 210 may be formed of a metal compound, and the metal compound may be, for example, but is not limited to, one or more among 8-hydroxyquinolinato-lithium(Liq), LiF, NaF, KF, RbF, CsF, FrF, $BeF_2$, $MgF_2$, $CaF_2$, $SrF_2$, $BaF_2$, and $RaF_2$. The electron injection layer 210 may have a 1 to 50 nm thickness. If the electron injection layer 210 has a nm thickness or greater, a degradation of the electron injection properties may be prevented, or if the electron injection layer 210 has a 50 nm thickness or less, an increase in the thickness of the electron injection layer 210 may be prevented, and a rise in operating voltage may be therefore prevented.

The cathode 220 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

An electron transport layer comprising the above-described organic compound of this disclosure is not limited to phosphorescent or fluorescence, but may be included in all types of organic light emitting display devices.

As stated above, an organic compound of this disclosure comprises p-biphenyl triazine as a core to facilitate electron movement between neighboring p-biphenyl triazine groups within the molecular stack of the electron transport layer. Moreover, an organic compound of this disclosure includes an aryl group of at least 10 or more carbon atoms with high steric effect, which is a substituent, and has an asymmetrical substitution form around a triazine, in order to have an amorphous structure by eliminating coplanarity and reducing symmetry.

Accordingly, the electron transport layer is formed of an organic compound of this disclosure to improve electron mobility, thereby reducing the operating voltage of the device and improving the efficiency. Also, the organic compound of this disclosure may prevent decay of the electron transport layer for its amorphous structure.

Figure 2:
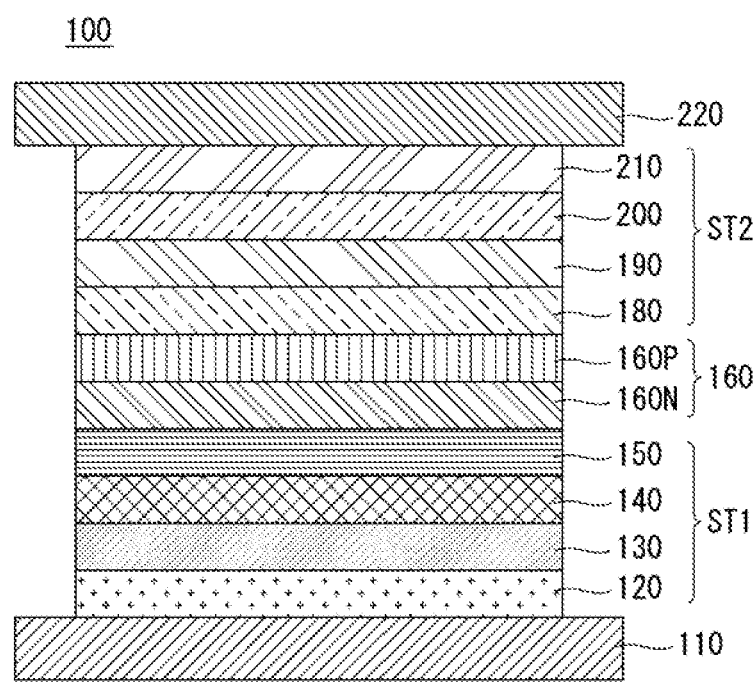
FIG. 2 is a view showing an organic light emitting display device according to a second exemplary embodiment of the present disclosure.

FIG. 2 is a view showing an organic light emitting display device according to a second exemplary embodiment of the present disclosure. The same elements as the first exemplary embodiment are denoted by the same reference numerals, so descriptions of these elements will be omitted or brief below.

Referring to FIG. 2, an organic light emitting display device 100 of the present disclosure comprises light emitting parts ST1 and ST2 between an anode 110 and a cathode 220, and a charge generation layer 160 between the light emitting parts ST1 and ST2.

The first light emitting part ST1 comprises a first light emitting layer 140. The first light emitting layer 140 may emit light of red (R), green (G), or blue (B), and may be formed of a fluorescent material. In this exemplary embodiment, the first light emitting layer 140 may be a blue light emitting layer. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, of a blue light emitting layer and a yellow-green light emitting layer, or of a blue light emitting layer and a green light emitting layer.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising the hole injection layer 120, the first hole transport layer 130, the first light emitting layer 140, and the first electron transport layer 150 is formed on the anode 110. The hole injection layer 120 may not be included in the elements of the first light emitting part ST1, depending on the structure or characteristics of the device.

The first electron transport layer 150 has the same composition as the above-described electron transport layer of the first exemplary embodiment. The first electron transport layer 150 comprises p-biphenyl triazine as a core to facilitate electron movement between neighboring p-biphenyl triazine groups within the molecular stack of the electron transport layer. Moreover, an organic compound of this disclosure includes an aryl group of at least 10 or more carbon atoms with high steric effect, which is a substituent, and has an asymmetrical substitution form around a triazine, in order to have an amorphous structure by eliminating coplanarity and reducing symmetry. Accordingly, the electron transport layer is formed of an organic compound of this disclosure to improve electron mobility, thereby reducing the operating voltage of the device and improving the efficiency. Also, the organic compound of this disclosure may prevent decay of the electron transport layer for its amorphous structure.

A charge generation layer (CGL) 160 is between the first light emitting part ST1 and the second light emitting part ST2. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layer. That is, the N-type charge generation layer 160N transfers electrons to the first electron transport layer 150, the first electron transport layer 150 supplies the electrons to the first light emitting layer 140 adjacent to the anode, and the P-type charge generation layer 160P transfers holes to the second hole transport layer 180 to supply the holes to the second light emitting layer 190 of the second light emitting part ST2. As such, the light emission efficiency of the first and second light emitting layers 140 and 190 may be further increased, and the operating voltage may be reduced.

The N-type charge generation layer 160N may be formed of a metal or N-type-doped organic material. The metal may be one material among Li, Na, K, Rb, Cs, Mg, Ca, Sr, Ba, La, Ce, Sm, Eu, Tb, Dy, and Yb. An N-type dopant and host for the N-doped organic material may be generally-used materials. For example, the N-type dopant may be an alkali metal, an alkali metal compound, an alkali earth metal, or an alkali earth metal compound. Specifically, the N-type dopant may be one among Li, Cs, K, Rb, Mg, Na, Ca, Sr, Eu, and Yb. The percentage of the dopant to be mixed is between 1% and 8% by weight relative to 100% for the host. The dopant may have a work function of 2.5 eV or greater. The host material may be an organic material of 20 to 60 carbon atoms that has a hetero ring with nitrogen atoms, for example, one among Alq$_3$(tris(8-hydroxyquinoline)aluminum), a triazine derivative, a hydroxyquinoline derivative, a benzazole derivative, and a silole derivative.

The P-type charge generation layer 160P may be formed of a metal or a P-doped organic material. The metal may be one or more alloys among Al, Cu, Fe, Pb, Zn, Au, Pt, W, In, Mo, Ni, and Ti. A P-type dopant and host for the P-doped organic material may be the following materials. For example, the P-type dopant may be one material among F$_4$-TCNQ(2,3,5,6-tetrafluoro-7,7,8,8-tetracyanoquinodimethane), a derivative of tetracyanoquinodimethane, iodine, FeCl$_3$, FeF$_3$, and SbCl$_5$. The host may be one material among NPB (N,N'-bis(naphthalene-1-yl)-N,N'-bis(phenyl)-benzidine), TPD(N,N'-bis-(3-methylphenyl)-N,N'-bis(phenyl)-benzidine), and TNB(N,N,N'N'-tetranaphthalenyl-benzidine).

The second light emitting part ST2 comprising a second hole transport layer 180, the second light emitting layer 190, a second electron transport layer 200, and an electron injection layer 210 is on the charge generation layer 160.

The second light emitting layer 190 may emit light of red (R), green (G), blue (B), or yellow-green (YG), and may be formed of a phosphorescent material. In this exemplary embodiment, the second light emitting layer 190 may be a light emitting layer that emits yellow-green light. The second light emitting layer 190 may have a single layer structure of a yellow-green light emitting layer or green light emitting layer, or a multilayer structure formed of a yellow-green light emitting layer and a green light emitting layer. The second light emitting layer 190 comprises a yellow-green light emitting layer, a green light emitting layer, or a multilayer structure formed of a yellow-green light emitting layer and a green light emitting layer, of a yellow light emitting layer and a red light emitting layer, of a green light emitting layer and a red light emitting layer, or of a yellow-green light emitting layer and a red light emitting layer.

This exemplary embodiment will be described by taking as an example a single layer structure of a second light emitting layer 190 that emits yellow-green light. The second light emitting layer 190 may include, but is not limited to, at least one host of CBP 4,4'-bis(carbazol-9-yl)biphenyl) or BAlq(Bis(2-methyl-8-quinolinolato)-4-(phenylphenolato) aluminum) and a phosphorescent yellow-green dopant that emits yellow-green light.

The second light emitting part ST2 comprises the second hole transport layer 180 between the charge generation layer 160 and the second light emitting layer 190, and comprises the second electron transport layer 200 and electron injection layer 210 on the second light emitting layer 190. The second hole transport layer 180 may have the same composition as the first hole transport layer 130 of the first light emitting part ST1 or have a different composition from that of the first hole transport layer 130.

The second electron transport layer 200 has the same composition as the aforementioned first electron transport layer 150. The second electron transport layer 200 comprises p-biphenyl triazine as a core to facilitate electron movement between neighboring p-biphenyl triazine groups within the molecular stack of the electron transport layer. Moreover, an organic compound of this disclosure includes an aryl group of at least 10 or more carbon atoms with high steric effect, which is a substituent, and has an asymmetrical substitution form around a triazine, in order to have an amorphous structure by eliminating coplanarity and reducing symmetry. Accordingly, the electron transport layer is formed of an organic compound of this disclosure to improve electron mobility, thereby reducing the operating voltage of the device and improving the efficiency. Also, the organic compound of this disclosure may prevent decay of the electron transport layer for its amorphous structure.

Accordingly, the second light emitting part ST2 comprising the second hole transport layer 180, the second light emitting layer 190, the second electron transport layer 200, and the electron injection layer 210 is formed on the charge generation layer 160. The cathode 220 is provided on the second light emitting part ST2 to constitute the organic light emitting display device according to the second exemplary embodiment of the present disclosure.

The above-described second exemplary embodiment of the present disclosure has disclosed that the first electron transport layer 150 and the second electron transport layer 200 comprise an organic compound of this disclosure. Alternatively, at least one of the first and second electron transport layers 150 and 200 may comprise the organic compound of this disclosure.

As stated above, an organic compound of this disclosure comprises p-biphenyl triazine as a core to facilitate electron movement between neighboring p-biphenyl triazine groups within the molecular stack of the electron transport layer. Moreover, an organic compound of this disclosure includes an aryl group of at least 10 or more carbon atoms with high steric effect, which is a substituent, and has an asymmetrical substitution form around a triazine, in order to have an amorphous structure by eliminating coplanarity and reducing symmetry. Accordingly, the electron transport layer is formed of an organic compound of this disclosure to improve electron mobility, thereby reducing the operating voltage of the device and improving the efficiency. Also, the organic compound of this disclosure may prevent decay of the electron transport layer for its amorphous structure.

Figure 3:
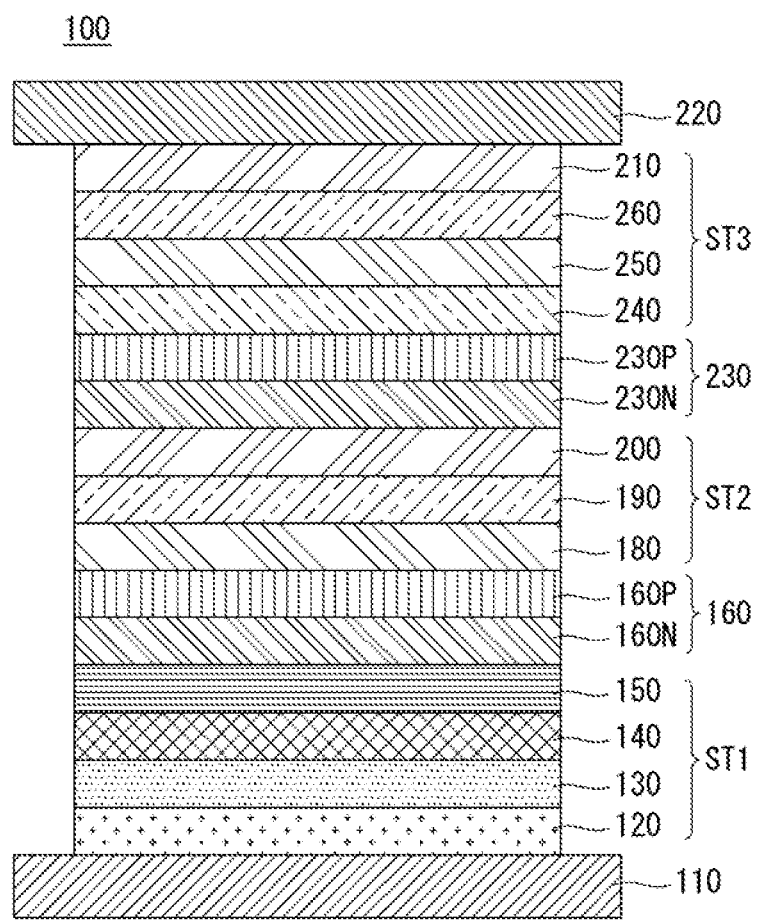
FIG. 3 is a view showing an organic light emitting display device according to a third exemplary embodiment of the present disclosure.

FIG. 3 is a view showing an organic light emitting display device according to a third exemplary embodiment of the present disclosure. The same elements as the first and/or second exemplary embodiments are denoted by the same reference numerals, so descriptions of these elements will be omitted or brief below.

Referring to FIG. 3, an organic light emitting display device 100 of the present disclosure comprises a plurality of light emitting parts ST1, ST2, and ST3 between an anode 110 and a cathode 220, and a first charge generation layer 160 and a second charge generation layer 230 that are between the light emitting parts ST1, ST2, and ST3. Although this exemplary embodiment has been illustrated and described with an example where three light emitting parts are between the anode 110 and the cathode 220, the present disclosure is not limited to this example and four or more light emitting parts may be between the anode 110 and the cathode 220.

Among the light emitting parts, the first light emitting part ST1 comprises a first light emitting layer 140. The first light emitting layer 140 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, of a blue light emitting layer and a yellow-green light emitting layer, or of a blue light emitting layer and a green light emitting layer.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising the hole injection layer 120, the first hole transport layer 130, the first light emitting layer 140, and the first electron transport layer 150 is formed on the anode 110. The hole injection layer 120 may not be included in the elements of the first light emitting part ST1, depending on the structure or characteristics of the device.

The first electron transport layer 150 has the same composition as the aforementioned first electron transport layers 150 of the first and second exemplary embodiments. The organic compound of this disclosure used as the first electron transport layer 150 comprises p-biphenyl triazine as a core to facilitate electron movement between neighboring p-biphenyl triazine groups within the molecular stack of the electron transport layer. Moreover, an organic compound of this disclosure includes an aryl group of at least 10 or more carbon atoms with high steric effect, which is a substituent, and has an asymmetrical substitution form around a triazine, in order to have an amorphous structure by eliminating coplanarity and reducing symmetry. Accordingly, the electron transport layer is formed of an organic compound of this disclosure to improve electron mobility, thereby reducing the operating voltage of the device and improving the efficiency. Also, the organic compound of this disclosure may prevent decay of the electron transport layer for its amorphous structure.

The second light emitting part ST2 comprising a second light emitting layer 190 is on the first light emitting part ST1. The second light emitting layer 190 may emit light of red, green, blue, or yellow-green: for example, it may be a yellow-green light emitting layer in this exemplary embodiment. The second light emitting layer 190 may comprise a yellow-green light emitting layer, a green light emitting layer, or a multilayer structure formed of a yellow-green light emitting layer and a green light emitting layer, of a yellow light emitting layer and a red light emitting layer, of a green light emitting layer and a red light emitting layer, or of a yellow-green light emitting layer and a red light emitting layer. The second light emitting part ST2 further comprises a second hole transport layer 180 on the first light emitting part ST1, and comprises a second electron transport layer 200 on the second light emitting layer 190. Accordingly, the second light emitting part ST2 comprising the second hole transport layer 180, the second light emitting layer 190, and the second electron transport layer 200 is formed on the first light emitting part ST1.

The second electron transport layer may have the same composition as the above-described first electron transport layer 150. That is, the second electron transport layer 200 may comprise a compound of this disclosure. A detailed description of this has been given previously, so it will be omitted.

A first charge generation layer 160 is between the first light emitting part ST1 and the second light emitting part ST2. The first charge generation layer 160 is a PN-junction charge generation layer formed by joining an N-type charge generation layer 160N and a P-type charge generation layer 160P. The first charge generation layer 160 generates a charge, or injects the charge, i.e., electrons and holes, separately into the first and second light emitting layers 140 and 190.

The third light emitting part ST3 comprising a third light emitting layer 250 is on the second light emitting part ST2. The third light emitting layer 250 may emit light of red, green, or blue, and be formed of a fluorescent material. For example, it may be a blue light emitting layer in this exemplary embodiment. The blue light emitting layer comprises one among a blue light emitting layer, a dark blue light emitting layer, and a sky blue light emitting layer. Alternatively, the third light emitting layer 250 may be formed of a blue light emitting layer and a red light emitting layer, of a blue light emitting layer and a yellow-green light emitting layer, or of a blue light emitting layer and a green light emitting layer.

The third light emitting part ST3 further comprises a third hole transport layer 240 on the second light emitting part ST2, and a third electron transport layer 260 and an electron injection layer 210 that are on the third light emitting layer 250.

The third electron transport layer 260 has the same composition as the aforementioned first electron transport layer 150. That is, the third electron transport layer 260 may comprise a compound of this disclosure. A detailed description of this has been given previously, so it will be omitted.

The second charge generation layer 230 is between the second light emitting part ST2 and the third light emitting part ST3. The second charge generation layer 230 is a PN junction charge generation layer formed by joining the N-type charge generation layer 230N and the P-type charge generation layer 230P. The second charge generation layer 230 generates a charge, or injects the charge, i.e., electrons and holes, separately into the second and third light emitting layers 190 and 250.

The cathode 220 is provided on the third light emitting part ST3 to constitute the organic light emitting display device according to the third exemplary embodiment of the present disclosure.

The third exemplary embodiment of the present disclosure has disclosed that the first electron transport layer 150, the second electron transport layer 200, and the third electron transport layer 260 comprise an organic compound of this disclosure. Alternatively, at least one among the first, second, and third electron transport layers 150, 200, and 260 may comprise the organic compound of this disclosure.

Organic light emitting displays using the organic light emitting display device according to the third exemplary embodiment of the present disclosure may include top emission displays, bottom emission displays, dual emission displays, and vehicle lighting. The vehicle lighting may include, but are not necessarily limited to, headlights, high beams, taillights, brake lights, and back-up lights. Moreover, organic light emitting displays using the organic light emitting display device according to the second exemplary embodiment of the present disclosure may be applied to mobile devices, monitors, TVs, etc. In addition, organic light emitting displays using the organic light emitting display device according to the third exemplary embodiment of the present disclosure may be applied to displays in which at least two of the first, second, and third light emitting layers emit light of the same color.

As stated above, an organic compound of this disclosure comprises p-biphenyl triazine as a core to facilitate electron movement between neighboring p-biphenyl triazine groups within the molecular stack of the electron transport layer. Moreover, an organic compound of this disclosure includes an aryl group of at least 10 or more carbon atoms with high steric effect, which is a substituent, and has an asymmetrical substitution form around a triazine, in order to have an amorphous structure by eliminating coplanarity and reducing symmetry. Accordingly, the electron transport layer is formed of an organic compound of this disclosure to improve electron mobility, thereby reducing the operating voltage of the device and improving the efficiency. Also, the organic compound of this disclosure may prevent decay of the electron transport layer for its amorphous structure.

Hereinafter, synthesis examples of compounds of the present disclosure will be described in detail. However, the following examples are only for illustration, and the present disclosure is not limited thereto.

1) Synthesis of Compound B-3

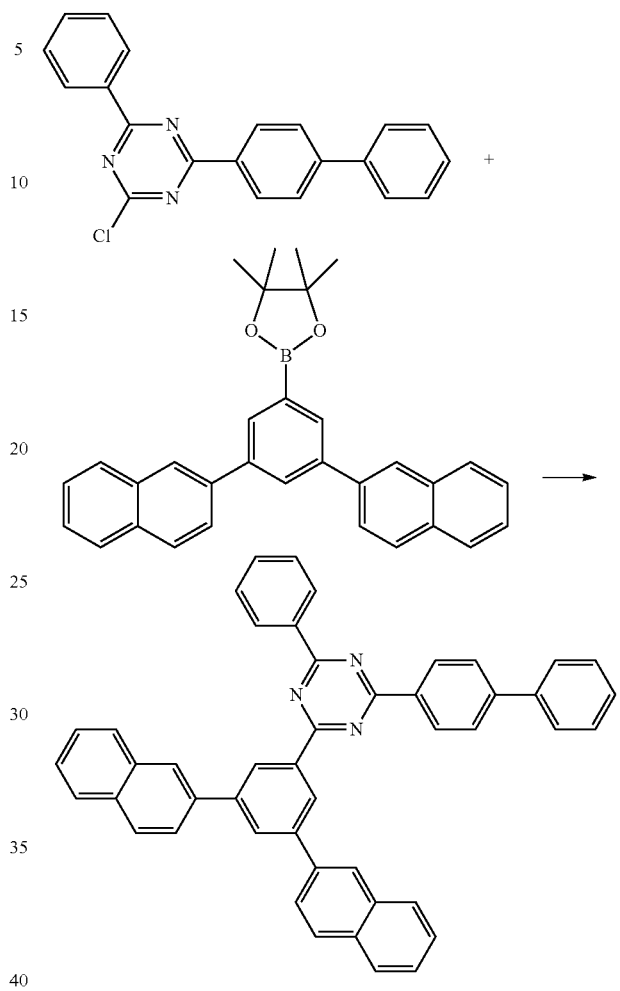

2-chloro-4-(biphenyl-4-yl)-6-phenyl-1,3,5-triazine (4.5 g, 13.1 mmol), 4,4,5,5-tetramethyl-2-(3,5-bis(naphthalen-2-yl)phenyl)-1,3,2-dioxaborolane (5.0 g, 11.0 mmol), tetrakistriphenylphosphine palladium (0) (Pd(PPh3)4) (0.25 g, 0.22 mmol), 30 mL of 2M potassium carbonate ($K_2CO_3$) solution, and 100 mL of tetrahydrofurane (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound B-3.

2) Synthesis of Compound C-2

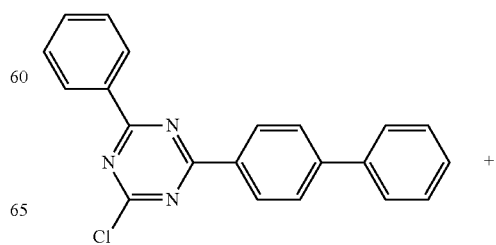

-continued

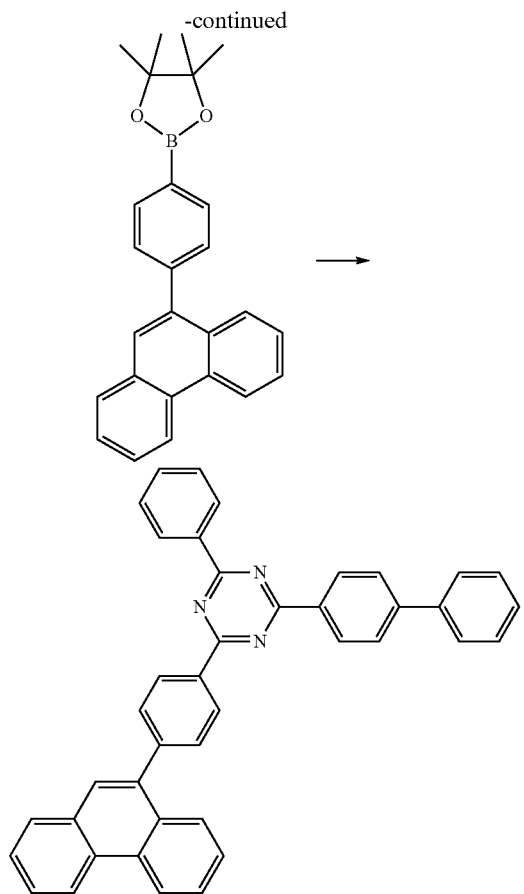

2-chloro-4-(biphenyl-4-yl)-6-phenyl-1,3,5-triazine) (5.4 g, 15.8 mmol), 4,4,5,5-tetramethyl-2-(4-(phenanthren-10-yl)phenyl)-1,3,2-dioxaborolane (5.0 g, 13.1 mmol), tetrakistriphenylphosphine palladium (0) (Pd(PPh3)4) (0.30 g, 0.26 mmol), 35 mL of 2M potassium carbonate ($K_2CO_3$) solution, and 100 mL of tetrahydrofurane (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound C-2.

3) Synthesis of Compound G-3

-continued

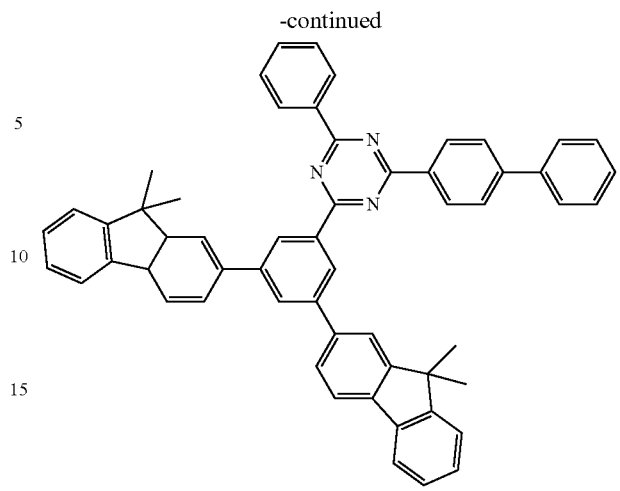

2-chloro-4-(biphenyl-4-yl)-6-phenyl-1,3,5-triazine) (3.5 g, 10.2 mmol), 2-(3,5-bis(9,9-dimethyl-9H-fluoren-2-yl)phenyl)-4,4,5,5-tetramethyl-1,3,2-dioxaborolane (5.0 g, 8.5 mmol), tetrakistriphenylphosphine palladium (0) (Pd(PPh3)4) (0.20 g, 0.17 mmol), 25 mL of 2M potassium carbonate ($K_2CO_3$) solution, and 100 mL of tetrahydrofurane (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound G-3.

4) Synthesis of Compound G-6

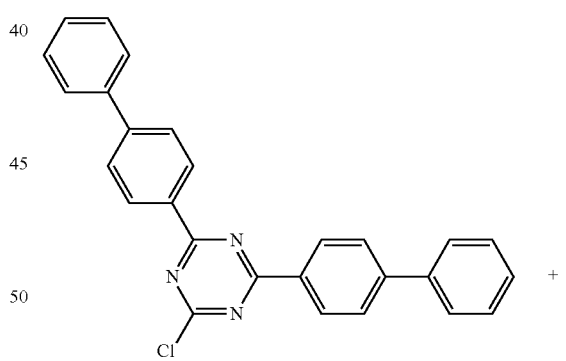

+

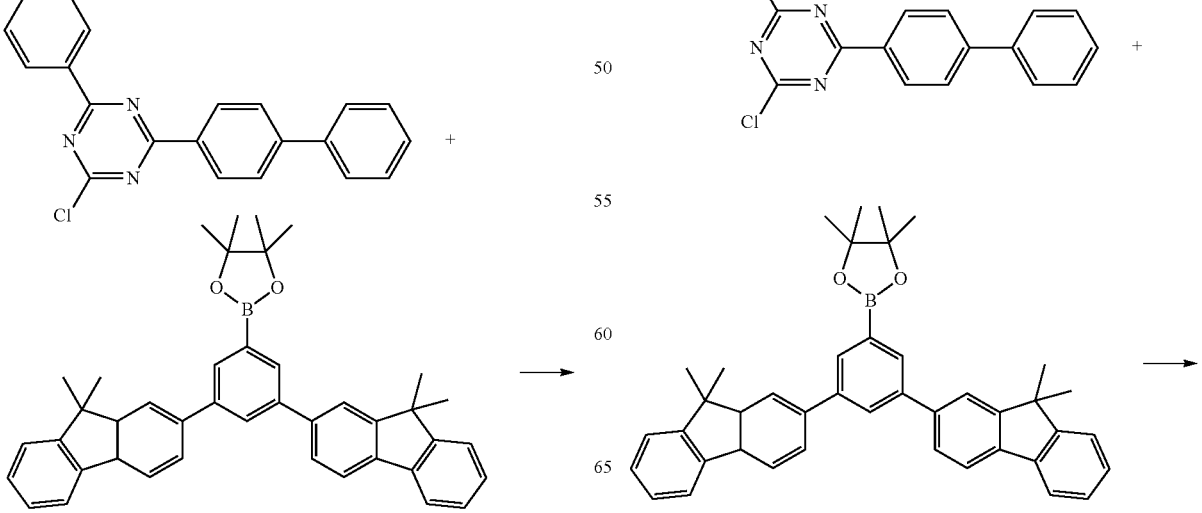

→

-continued

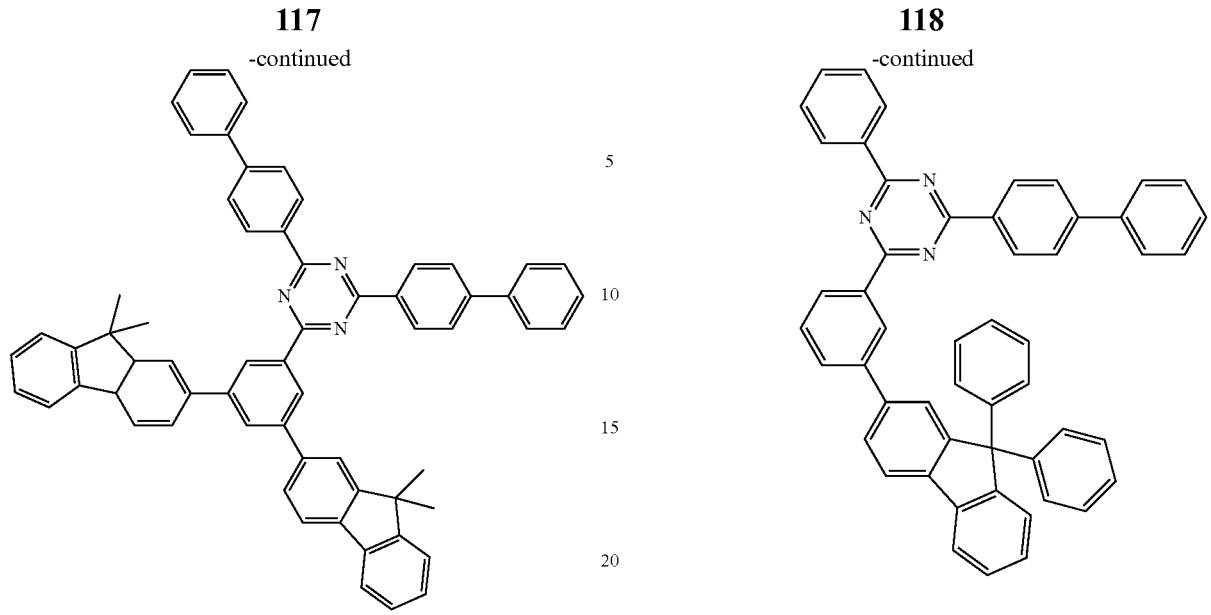

2,4-bis((1,1'-biphenyl)-4-yl)-6-chloro-1,3,5-triazine) (4.3 g, 10.2 mmol), 2-(3,5-bis(9,9-dimethyl-9H-fluoren-2-yl)phenyl)-4,4,5,5-tetramethyl-1,3,2-dioxaborolane (5.0 g, 8.5 mmol), tetrakistriphenylphosphine palladium (0) (Pd(PPh3)4) (0.20 g, 0.17 mmol), 25 mL of 2M potassium carbonate ($K_2CO_3$) solution, and 100 mL of tetrahydrofurane (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound G-6.

5) Synthesis of Compound L-1

2-chloro-4-(biphenyl-4-yl)-6-phenyl-1,3,5-triazine (3.2 g, 9.2 mmol), 4,4,5,5-tetramethyl-2-(3-(9,9-diphenyl-9H-fluoren-2-yl)phenyl)-1,3,2-dioxaborolane (4.0 g, 7.7 mmol), tetrakistriphenylphosphine palladium (0) (Pd(PPh3)4) (0.18 g, 0.15 mmol), 25 mL of 2M potassium carbonate ($K_2CO_3$) solution, and 80 mL of tetrahydrofurane (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound L-1.

6) Synthesis of Compound M-4

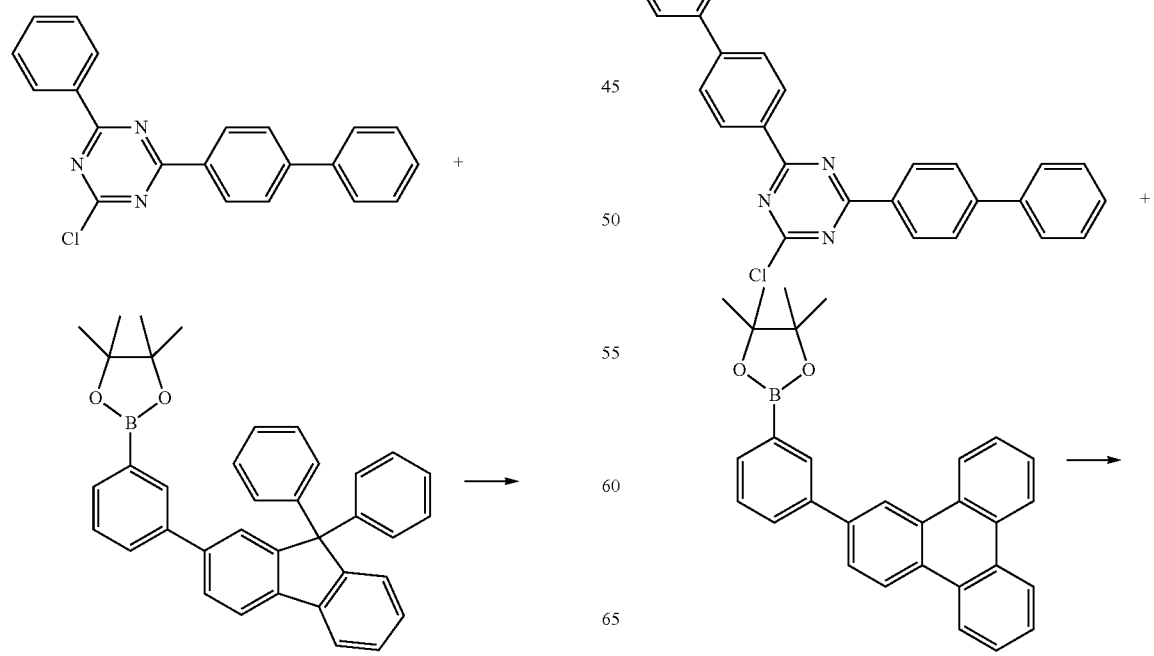

-continued

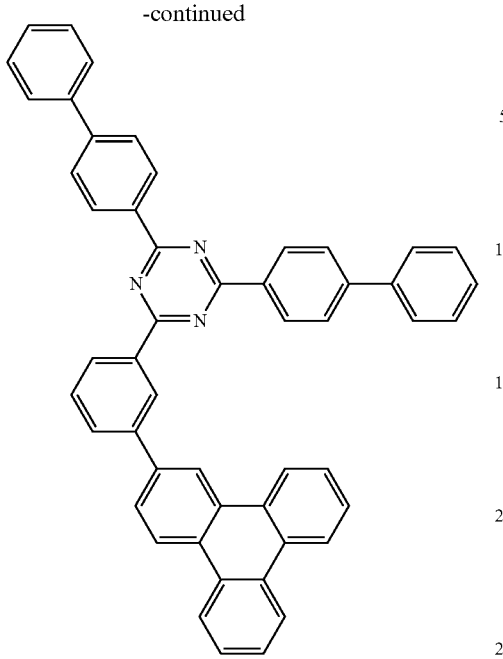

2,4-bis((1,1'-biphenyl)-4-yl)-6-chloro-1,3,5-triazine (4.7 g, 11.2 mmol), 4,4,5,5-tetramethyl-2-(3-(triphenylen-3-yl)phenyl)-1,3,2-dioxaborolane (4.0 g, 9.3 mmol), tetrakistriphenylphosphine palladium (0) (Pd(PPh3)4) (0.21 g, 0.19 mmol), 40 mL of 2M potassium carbonate ($K_2CO_3$) solution, and 160 mL of tetrahydrofurane (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound M-4.

7) Synthesis of Compound N-5

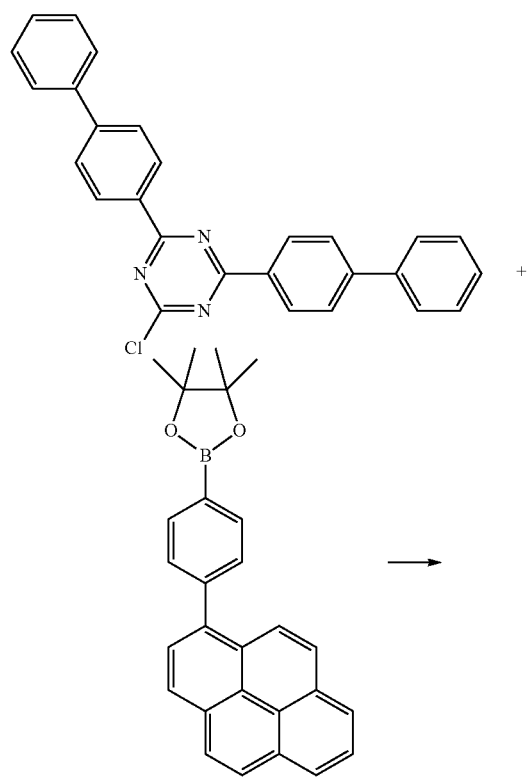

-continued

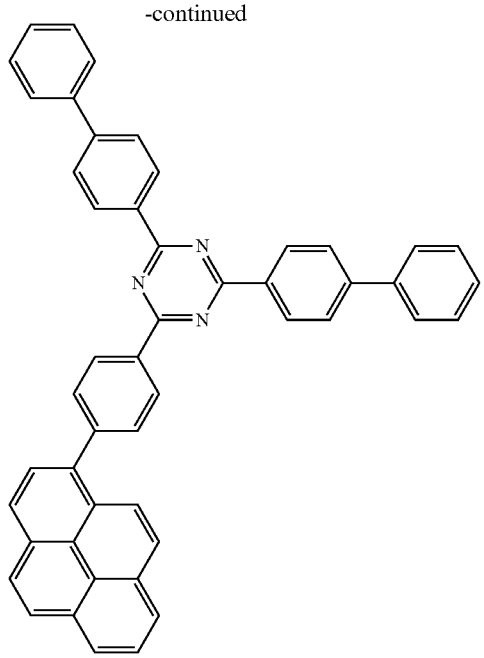

2,4-bis((1,1'-biphenyl)-4-yl)-6-chloro-1,3,5-triazine (6.2 g, 14.8 mmol), 4,4,5,5-tetramethyl-2-(3-(pyren-1-yl)phenyl)-1,3,2-dioxaborolane (5.0 g, 12.4 mmol), tetrakistriphenylphosphine palladium (0) (Pd(PPh3)4) (0.29 g, 0.25 mmol), 35 mL of 2M potassium carbonate ($K_2CO_3$) solution, and 120 mL of tetrahydrofurane (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound N-5.

8) Synthesis of Compound P-1

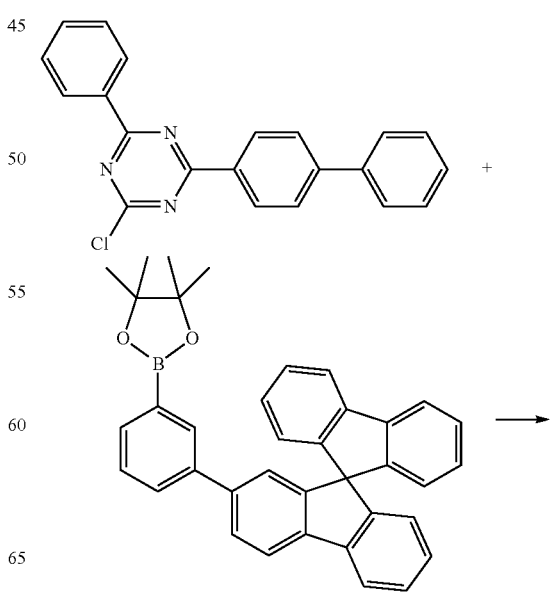

-continued

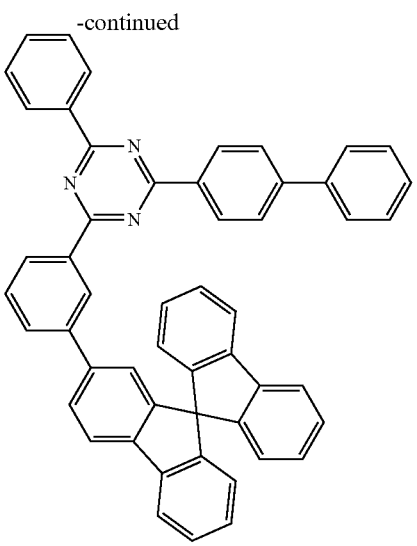

2-chloro-4-(biphenyl-4-yl)-6-phenyl-1,3,5-triazine (3.2 g, 9.3 mmol), 4,4,5,5-tetramethyl-2-(3-(9,9'-spirobifluoren-2-yl)phenyl)-1,3,2-dioxaborolane (4.0 g, 7.7 mmol), tetrakis-triphenylphosphine palladium (0) (Pd(PPh3)4) (0.18 g, 0.15 mmol), 25 mL of 2M potassium carbonate ($K_2CO_3$) solution, and 100 mL of tetrahydrofurane (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound P-1.

Hereinafter, embodiments for the manufacture of an organic light emitting display device according to the present disclosure will be disclosed. However, the following materials for the electron transport layer do not limit the scope of the present disclosure.

Embodiment 1

An organic light emitting display device is manufactured by forming, on a substrate, an anode, a hole injection layer, a hole transport layer, a blue light emitting layer, an electron transport layer, an electron injection layer, and a cathode. Here, the electron transport layer is formed of Compound B-3.

Embodiment 2

It has the same elements as the above-described Embodiment 1, and the electron transport layer is formed of Compound C-2.

Embodiment 3

It has the same elements as the above-described Embodiment 1, and the electron transport layer is formed of Compound G-3.

Embodiment 4

It has the same elements as the above-described Embodiment 1, and the electron transport layer is formed of Compound G-6.

Embodiment 5

It has the same elements as the above-described Embodiment 1, and the electron transport layer is formed of Compound L-1.

Embodiment 6

It has the same elements as the above-described Embodiment 1, and the electron transport layer is formed of Compound M-4.

Embodiment 7

It has the same elements as the above-described Embodiment 1, and the electron transport layer is formed of Compound N-5.

Embodiment 8

It has the same elements as the above-described Embodiment 1, and the electron transport layer is formed of Compound P-1.

Comparative Example 1

It has the same elements as the above-described Embodiment 1, and the electron transport layer is formed of the following anthracene compound referred to as ETM1.

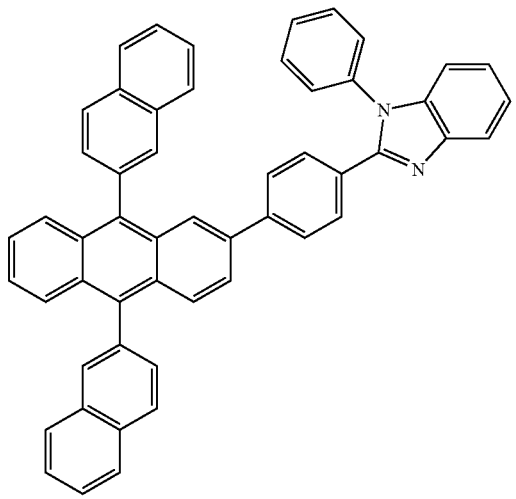

ETM1

Comparative Example 2

It has the same elements as the above-described Embodiment 1, and the electron transport layer is formed of the following triazine compound referred to as ETM2.

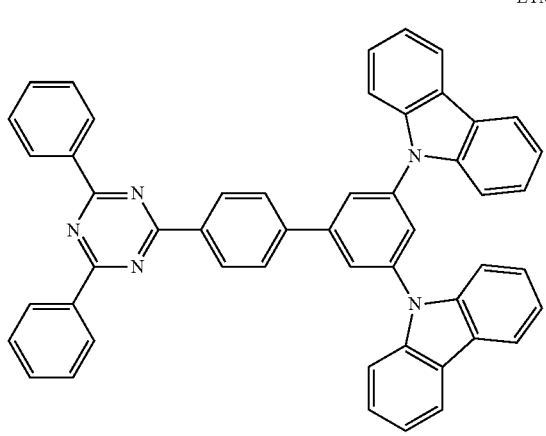

ETM2

The operating voltage, quantum efficiency, and lifetime of the devices manufactured according to the above-described Embodiments 1 to 8 and Comparative Examples 1 and 2 were measured and shown in the following Table 1. (The devices operated at a current density of 10 mA/cm$^2$ to measure the operating voltage, quantum efficiency, and lifetime. T90 is the time it takes for the luminance to decrease to 90% of the initial luminance. The measurements taken in Embodiments and Comparative Example 2 were expressed as a percentage relative to those taken in Comparative Example 1 corresponding to 100%).

TABLE 1

|  | Operative voltage | External quantum efficiency | Lifetime (T90) |
|---|---|---|---|
| Embodiment 1 | 90 | 137 | 139 |
| Embodiment 2 | 91 | 125 | 180 |
| Embodiment 3 | 95 | 128 | 253 |
| Embodiment 4 | 93 | 127 | 236 |
| Embodiment 5 | 95 | 120 | 207 |
| Embodiment 6 | 88 | 135 | 174 |
| Embodiment 7 | 96 | 111 | 129 |
| Embodiment 8 | 94 | 126 | 215 |
| Comparative Example 1 | 100 | 100 | 100 |
| Comparative Example 2 | 97 | 103 | 112 |

Referring to Table 1, Embodiment 1 comprising Compound B-3 of this disclosure showed a 10% decrease in operating voltage, a 37% increase in external quantum efficiency, and a 39% increase in lifetime, compared to Comparative Example 1 in which an anthracene compound was used as an electron transport layer. Embodiment 2 comprising Compound C-2 of this disclosure showed a 9% decrease in operating voltage, a 25% increase in external quantum efficiency, and an 80% increase in lifetime, compared to Comparative Example 1. Embodiment 3 comprising Compound G-3 of this disclosure showed a 5% decrease in operating voltage, a 28% increase in external quantum efficiency, and a 153% increase in lifetime, compared to Comparative Example 1. Embodiment 4 comprising Compound G-6 of this disclosure showed a 7% decrease in operating voltage, a 27% increase in external quantum efficiency, and a 136% increase in lifetime, compared to Comparative Example 1. Embodiment 5 comprising Compound L-1 of this disclosure showed a 5% decrease in operating voltage, a 20% increase in external quantum efficiency, and a 107% increase in lifetime, compared to Comparative Example 1. Embodiment 6 comprising Compound M-4 of this disclosure showed a 12% decrease in operating voltage, a 35% increase in external quantum efficiency, and a 74% increase in lifetime, compared to Comparative Example 1. Embodiment 7 comprising Compound N-5 of this disclosure showed a 4% decrease in operating voltage, an 11% increase in external quantum efficiency, and a 29% increase in lifetime, compared to Comparative Example 1. Embodiment 8 comprising Compound P-1 of this disclosure showed a 6% decrease in operating voltage, a 26% increase in external quantum efficiency, and a 125% increase in lifetime, compared to Comparative Example 1.

Also, Embodiment 1 comprising Compound B-3 of this disclosure showed a 7% decrease in operating voltage, a 34% increase in external quantum efficiency, and a 27% increase in lifetime, compared to Comparative Example 2 in which a triazine compound different from the compounds of this disclosure was used as an electron transport layer. Embodiment 2 comprising Compound C-2 of this disclosure showed a 6% decrease in operating voltage, a 22% increase in external quantum efficiency, and a 68% increase in lifetime, compared to Comparative Example 2. Embodiment 3 comprising Compound G-3 of this disclosure showed a 2% decrease in operating voltage, a 25% increase in external quantum efficiency, and a 141% increase in lifetime, compared to Comparative Example 2. Embodiment 4 comprising Compound G-6 of this disclosure showed a 4% decrease in operating voltage, a 24% increase in external quantum efficiency, and a 124% increase in lifetime, compared to Comparative Example 2. Embodiment 5 comprising Compound L-1 of this disclosure showed a 2% decrease in operating voltage, a 17% increase in external quantum efficiency, and a 95% increase in lifetime, compared to Comparative Example 2. Embodiment 6 comprising Compound M-4 of this disclosure showed a 9% decrease in operating voltage, a 32% increase in external quantum efficiency, and a 62% increase in lifetime, compared to Comparative Example 2. Embodiment 7 comprising Compound N-5 of this disclosure showed a 1% decrease in operating voltage, a 8% increase in external quantum efficiency, and a 17% increase in lifetime, compared to Comparative Example 2. Embodiment 8 comprising Compound P-1 of this disclosure showed a 3% decrease in operating voltage, a 23% increase in external quantum efficiency, and a 103% increase in lifetime, compared to Comparative Example 2.

From these results, it can be found out that the organic light emitting display devices according to the embodiments using an electron transport layer comprising a compound of this disclosure reduced the operating voltage and improved the external quantum efficiency and lifetime, compared to the organic light emitting display device according to Comparative Example 1 using an anthracene compound as an electron transport layer. Also, it can be found out that the organic light emitting display devices according to the embodiments using an electron transport layer comprising a compound of this disclosure reduced the operating voltage and improved the external quantum efficiency and lifetime, compared to the organic light emitting display device according to Comparative Example 2 using a triazine compound different from the compounds of this disclosure as an electron transport layer.

As stated above, an organic compound of this disclosure comprises p-biphenyl triazine as a core to facilitate electron movement between neighboring p-biphenyl triazine groups within the molecular stack of the electron transport layer. Moreover, an organic compound of this disclosure includes an aryl group of at least 10 or more carbon atoms with high steric effect, which is a substituent, and has an asymmetrical substitution form around a triazine, in order to have an amorphous structure by eliminating coplanarity and reducing symmetry. Accordingly, the electron transport layer is formed of an organic compound of this disclosure to improve electron mobility, thereby reducing the operating voltage of the device and improving the efficiency.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising:
at least one light emitting part between an anode and a cathode and including at least one organic layer and a light emitting layer,
wherein the at least one organic layer includes an organic compound, and the organic compound includes a triazine compound having a substituent with a steric effect,
wherein the organic compound is represented by the following Chemical Formula 1:

[Chemical Formula 1]

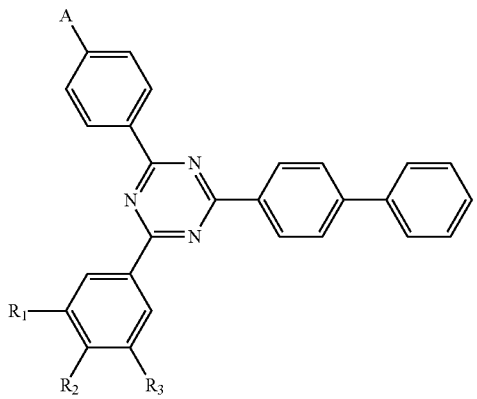

wherein A includes one among hydrogen and a phenyl group, $R_1$ and $R_3$ include independently one among hydrogen and an aryl group of 10 to 30 carbon atoms, $R_2$ includes one among hydrogen and an aryl group of 10 to 30 carbon atoms when A is hydrogen, $R_2$ includes hydrogen when A is phenyl, with at least one among $R_1$ to $R_3$ being an aryl group, except for the case that $R_1$ to $R_3$ are all hydrogen, and wherein the organic compound represented by Chemical Formula 1 excludes the following compounds:

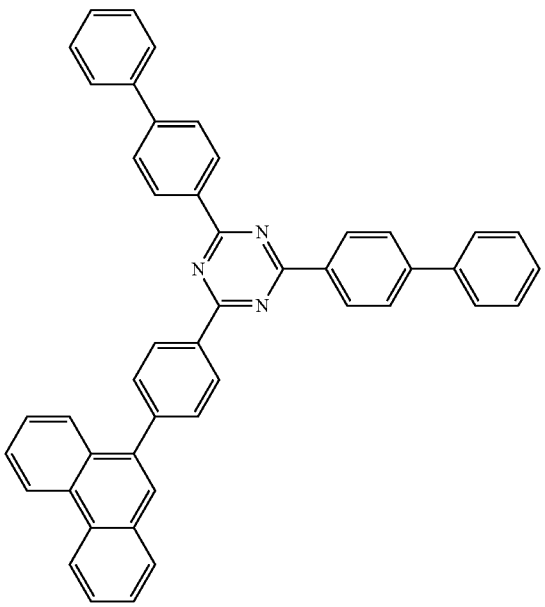

and

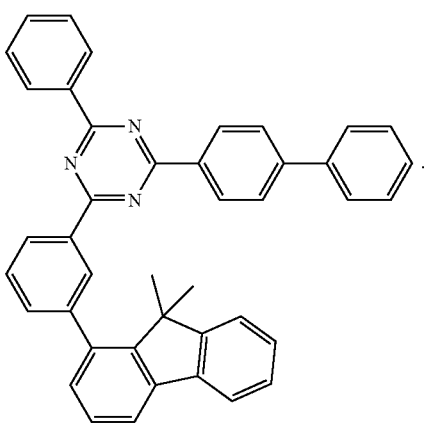

2. The organic light emitting display device of claim 1, wherein the at least one organic layer includes an electron transport layer.

3. The organic light emitting display device of claim 1, wherein the organic compound has an asymmetrical substitution form around the triazine compound.

4. The organic light emitting display device of claim 1, wherein the substituent includes an aryl group having at least 10 or more carbon atoms.

5. The organic light emitting display device of claim 1, wherein the at least one light emitting part includes at least two or more light emitting parts, and one of the at least two or more light emitting parts is a blue light emitting part and the another one of the at least two or more light emitting parts is a yellow-green light emitting part.

6. The organic light emitting display device of claim 1, wherein $R_1$ to $R_3$ include independently one among the following compounds:

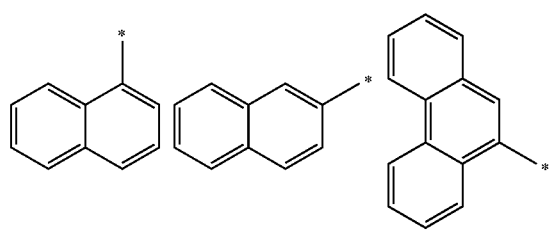
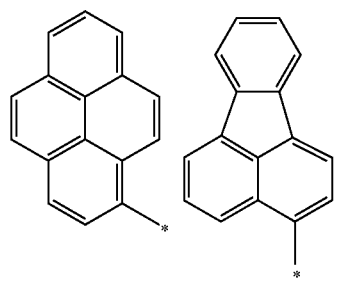
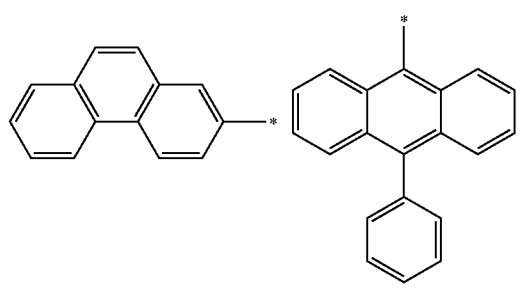
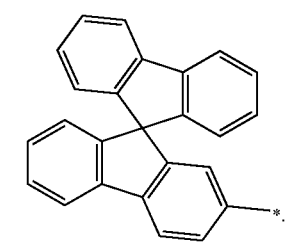
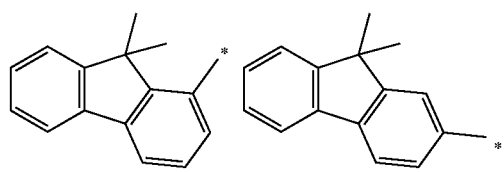
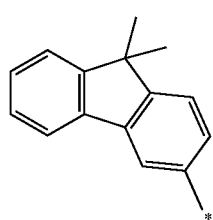
7. The organic light emitting display device of claim 1, wherein the organic compound represented by Chemical Formula 1 includes one among the following compounds:
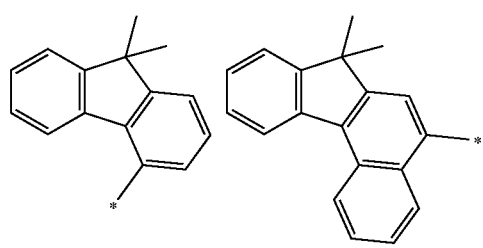
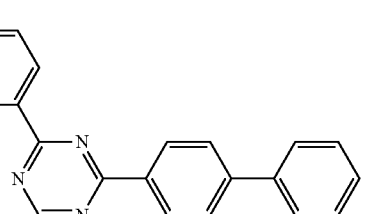
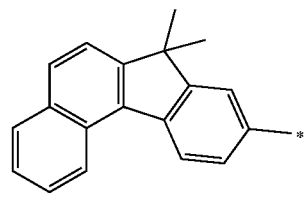
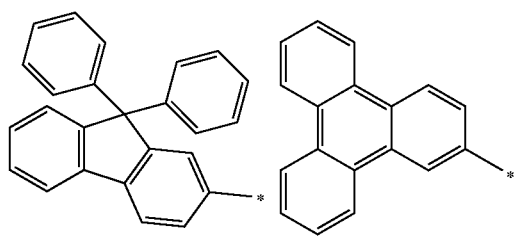
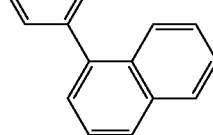
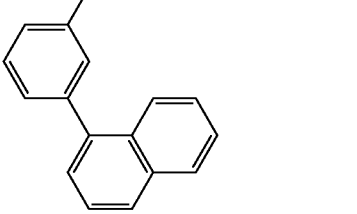
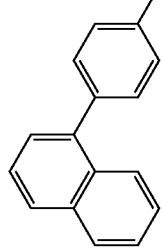
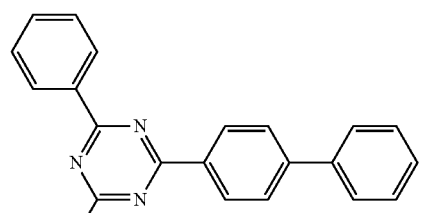

129
-continued
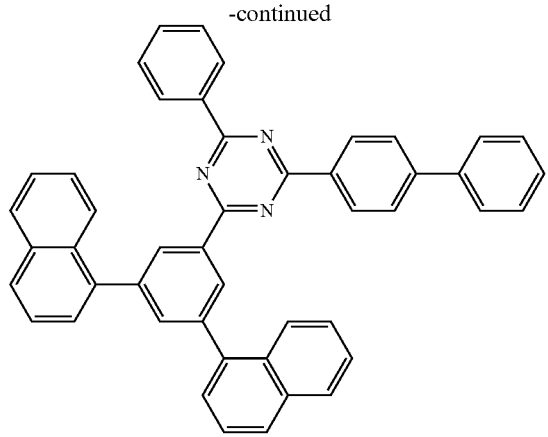
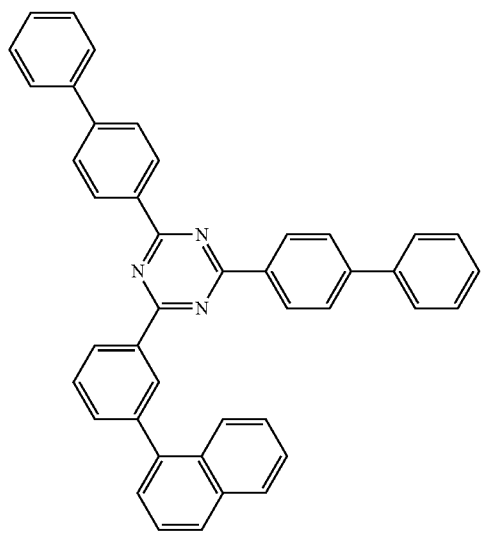
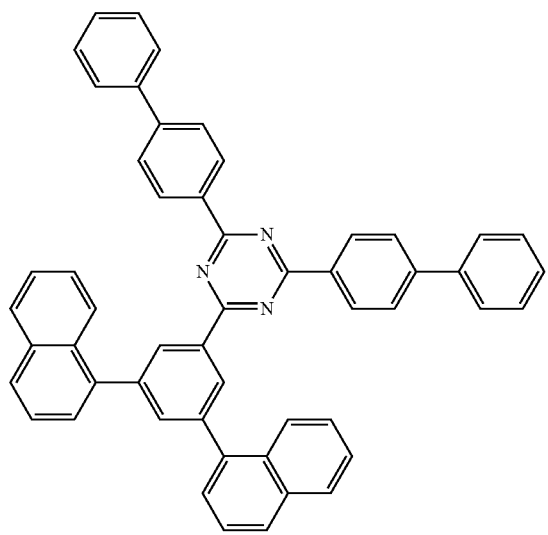
130
-continued
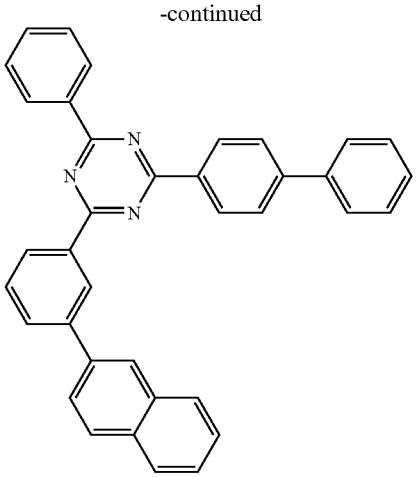
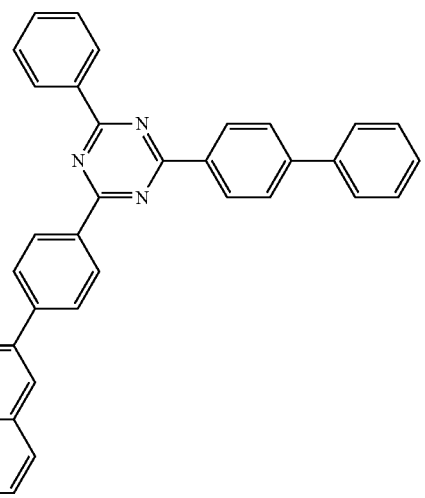
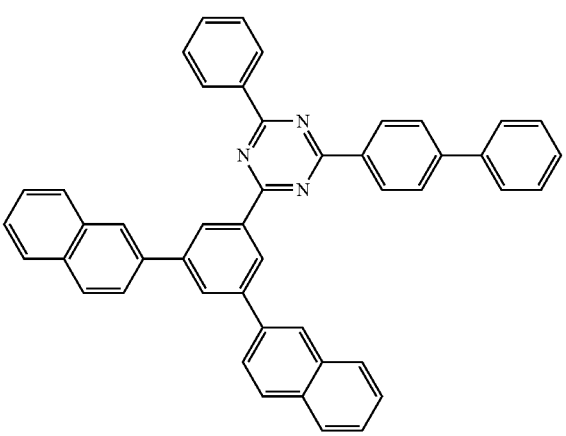

-continued
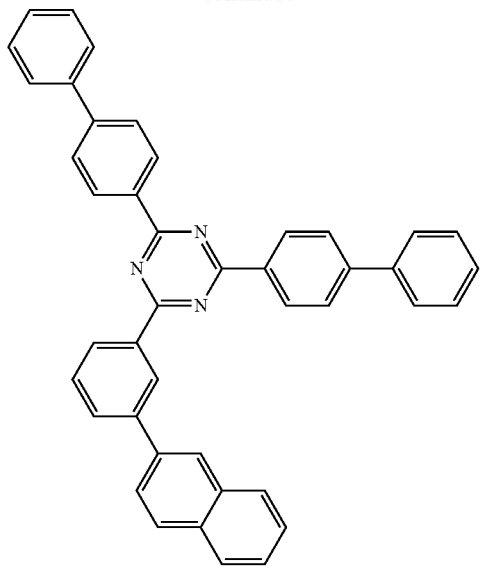
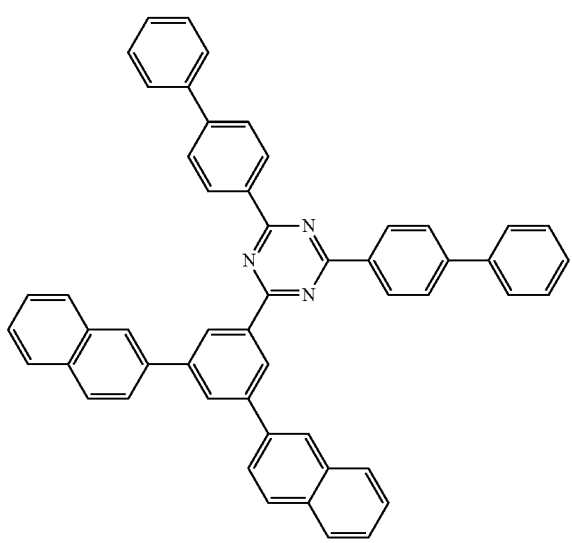
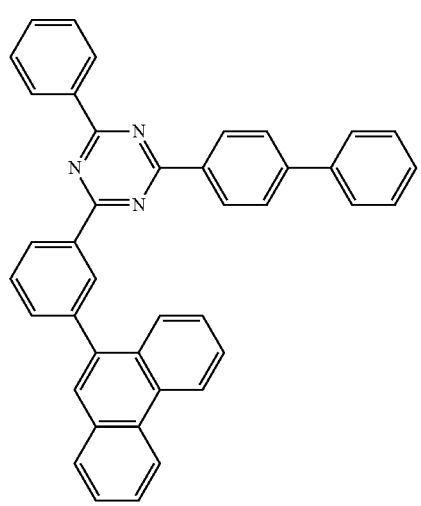
-continued
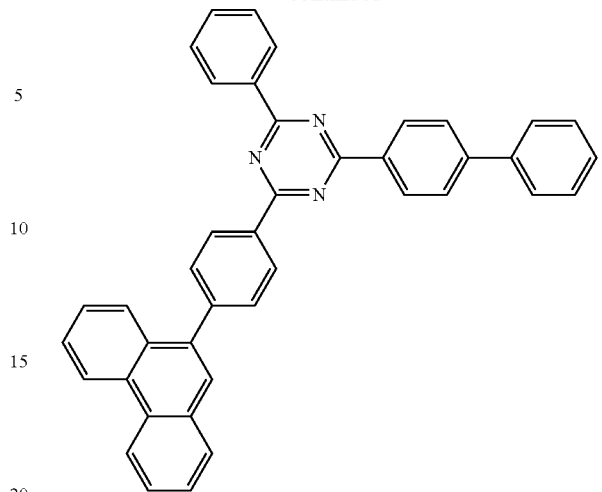
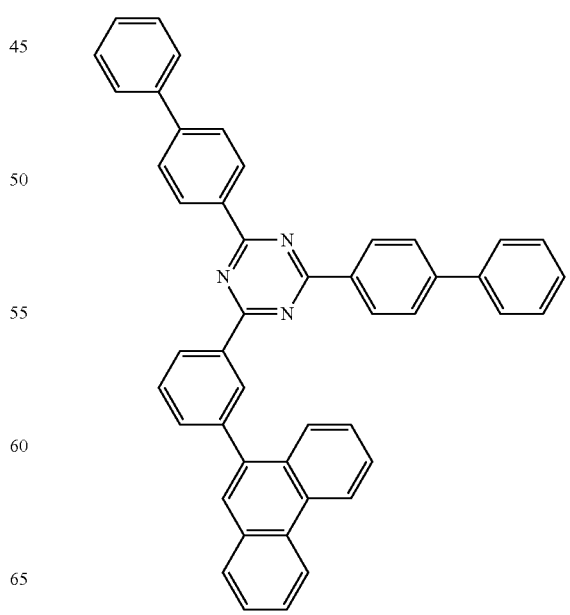

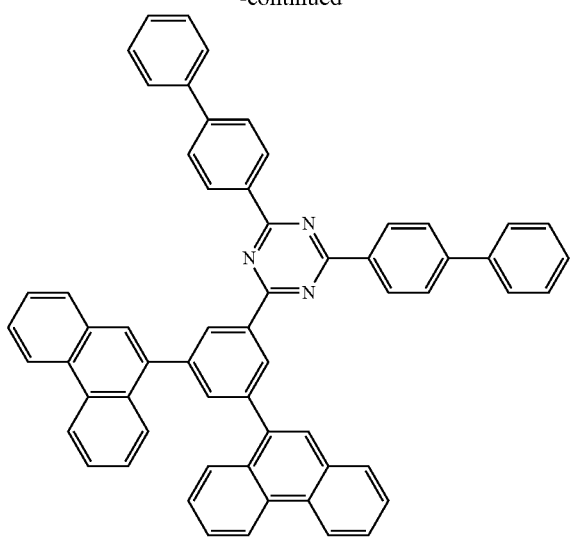
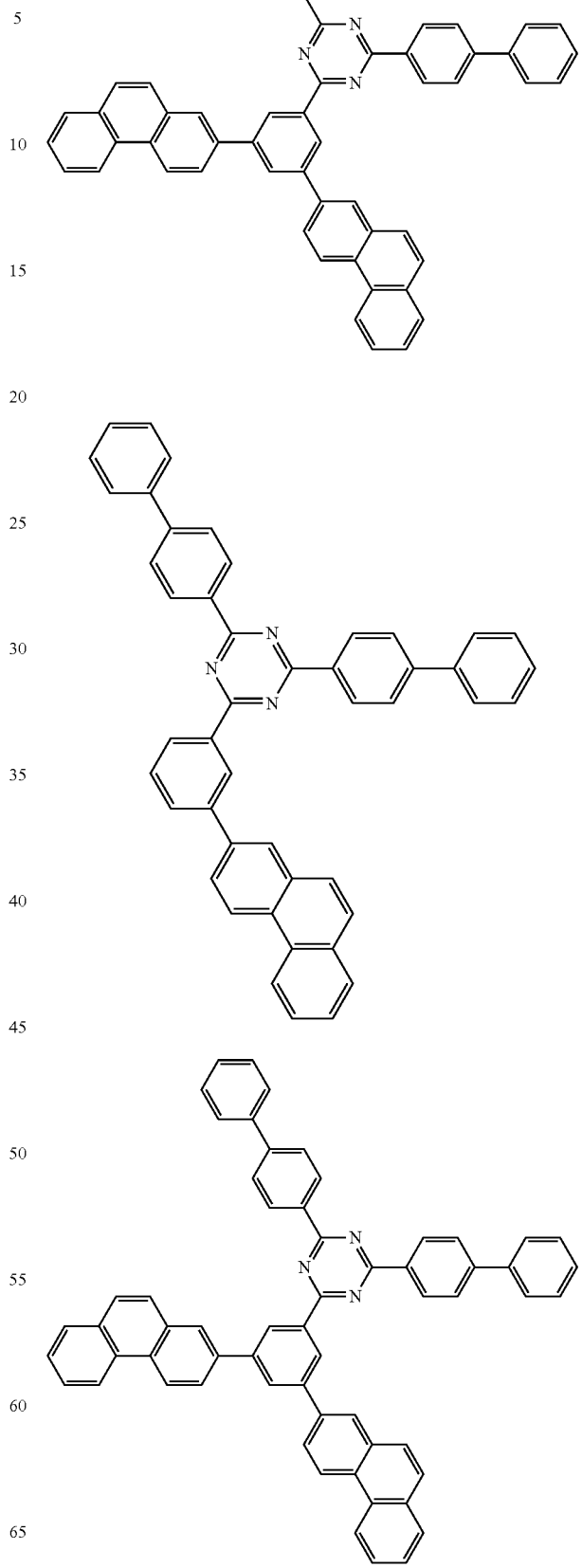

135
-continued
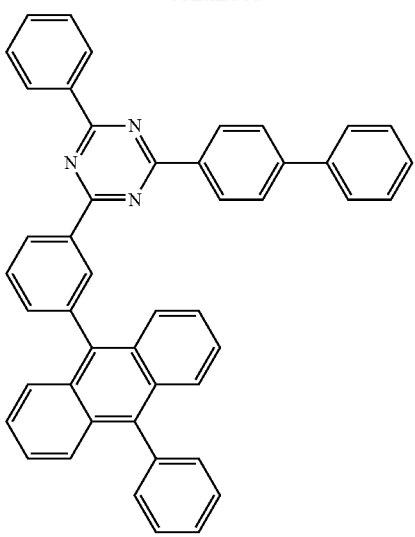
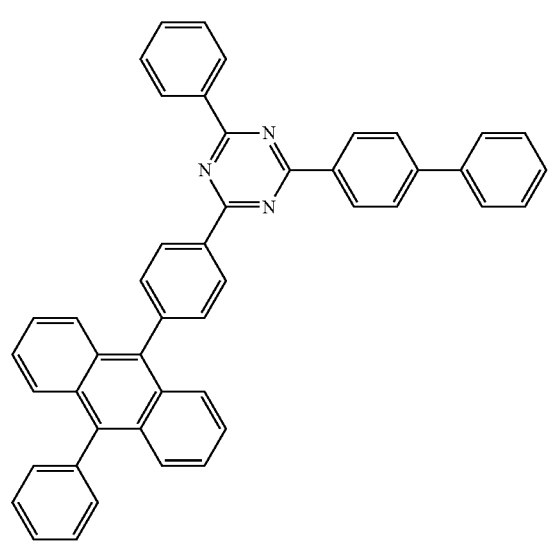
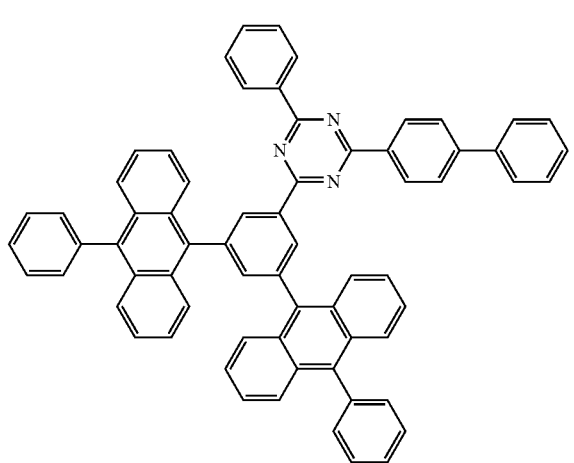
136
-continued
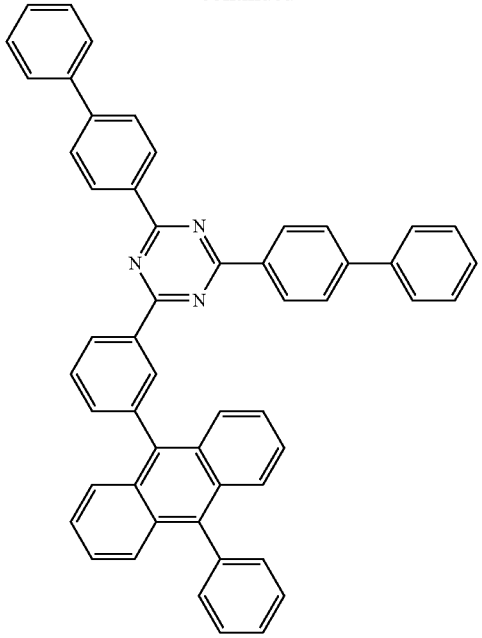
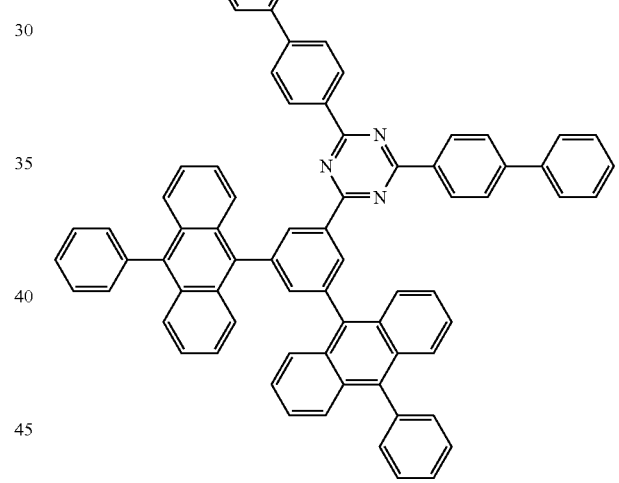
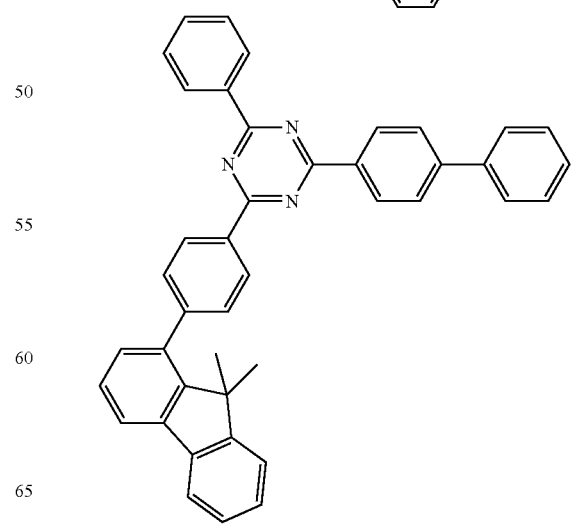

137
-continued
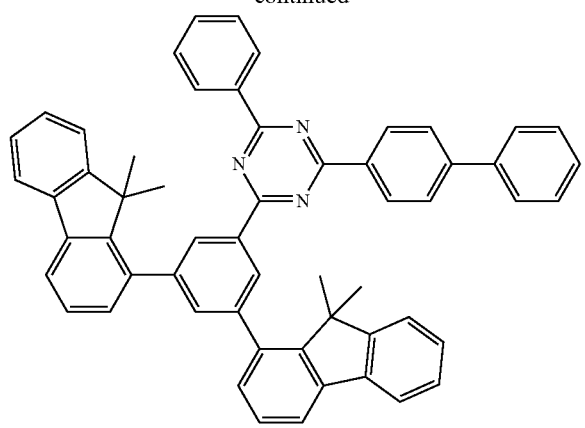
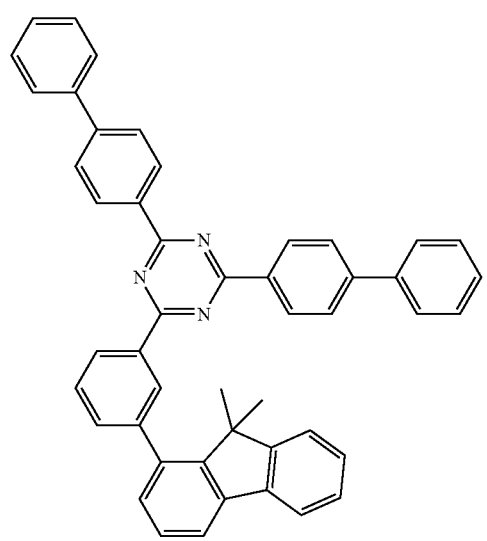
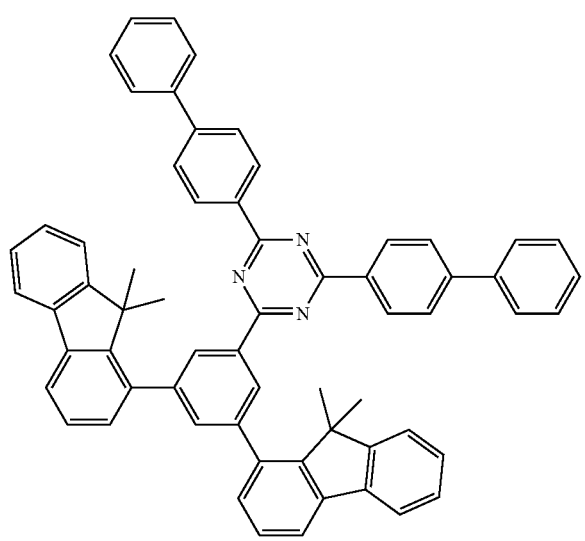
138
-continued
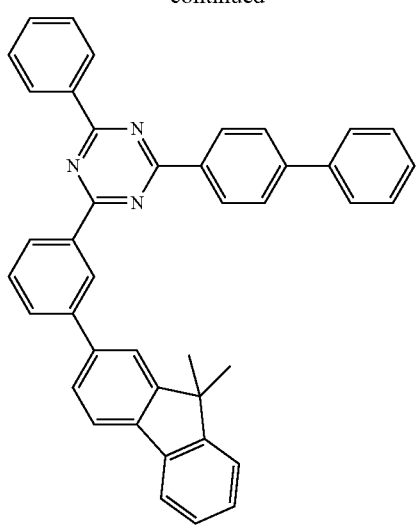
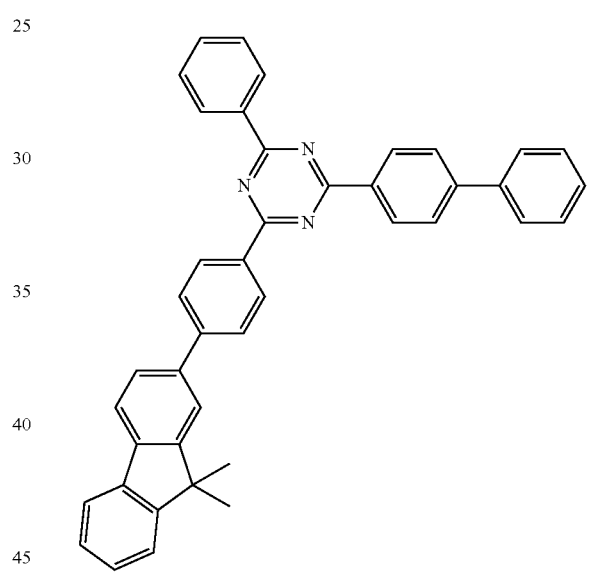
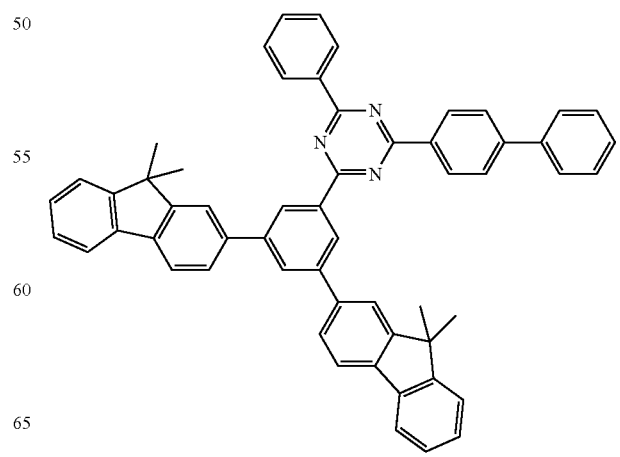

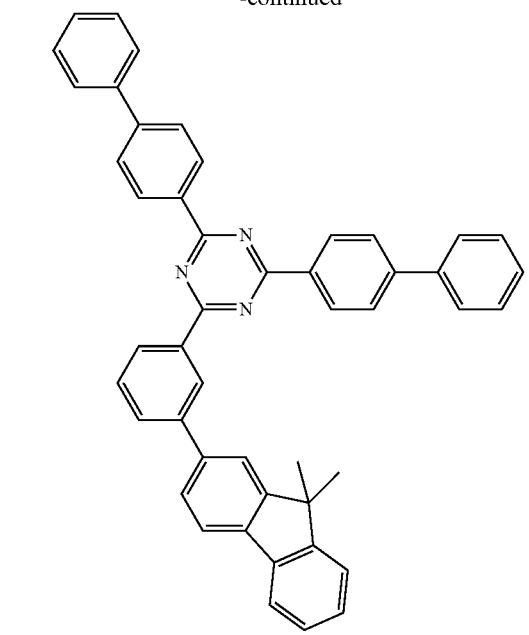
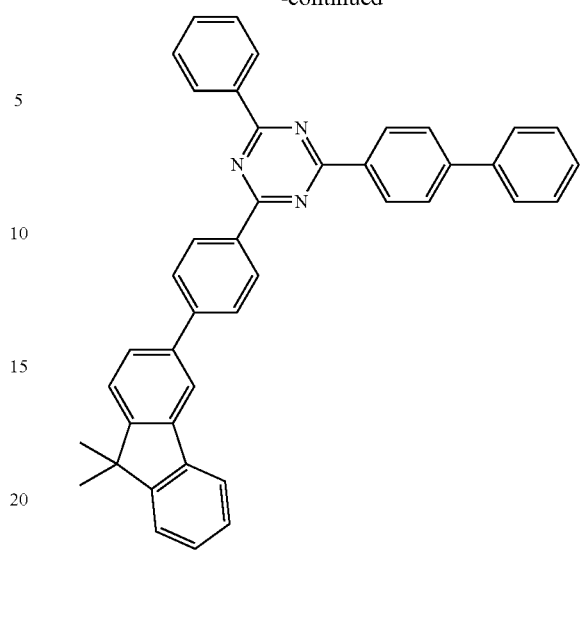

141
-continued
142
-continued
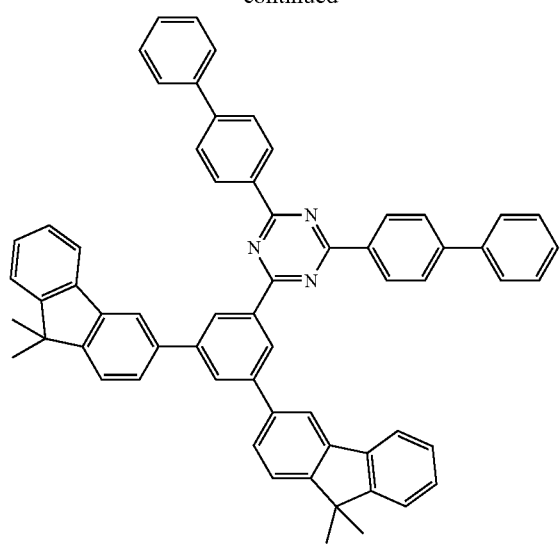
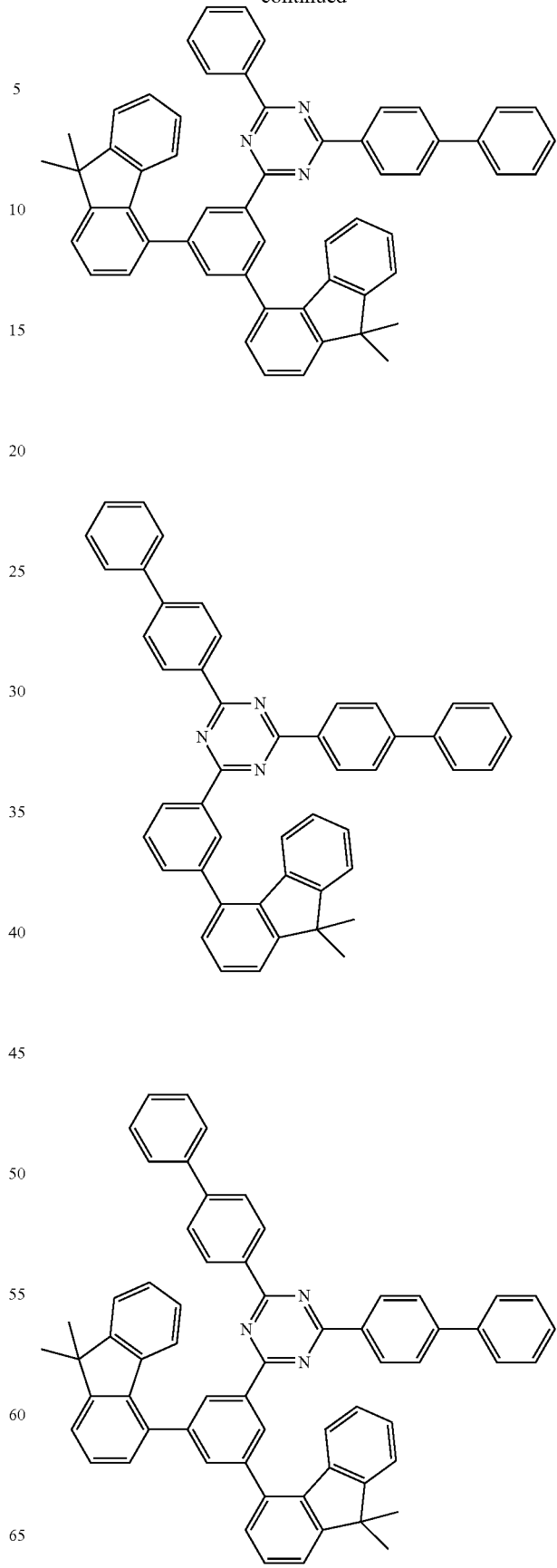

143
-continued
144
-continued
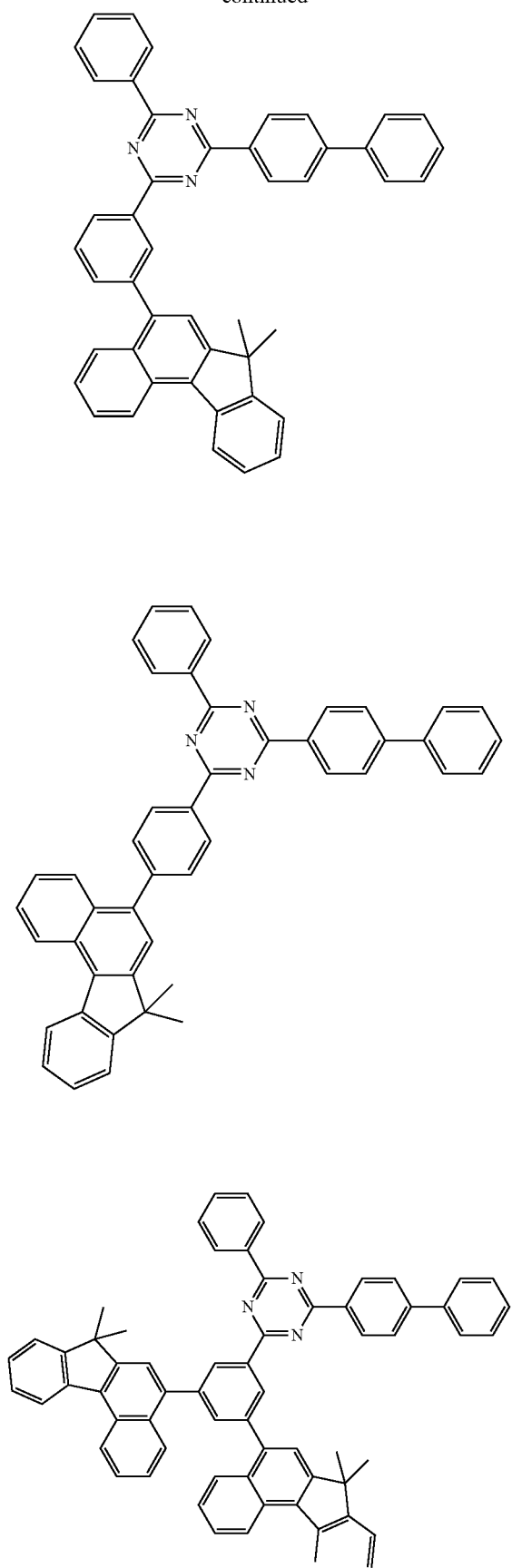
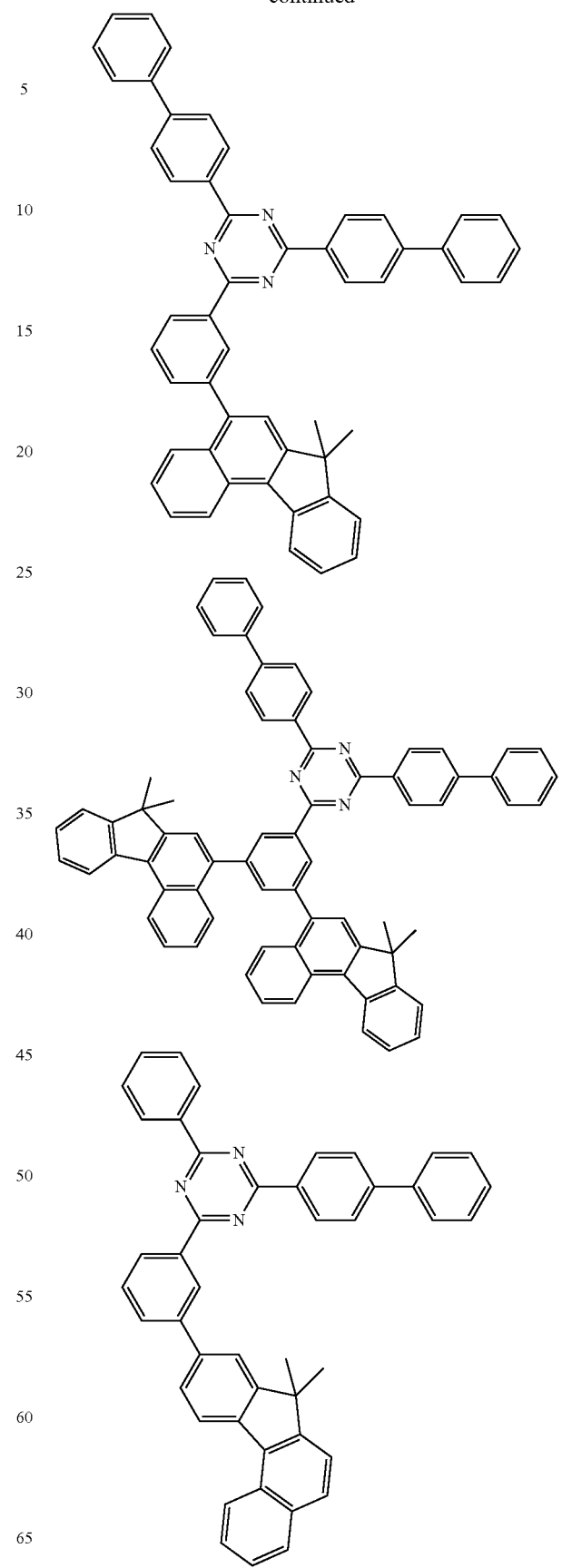

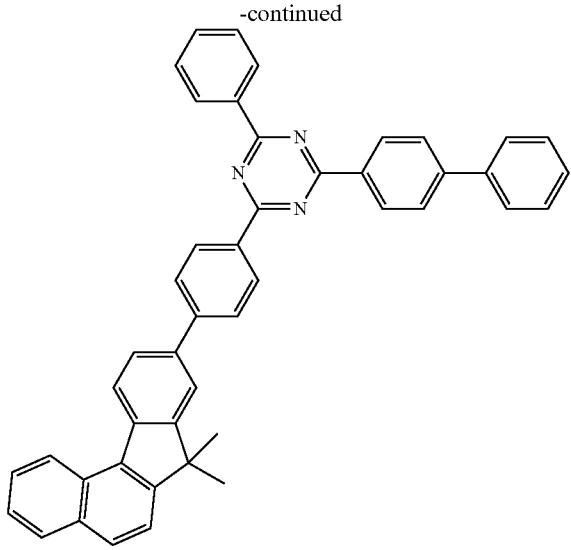
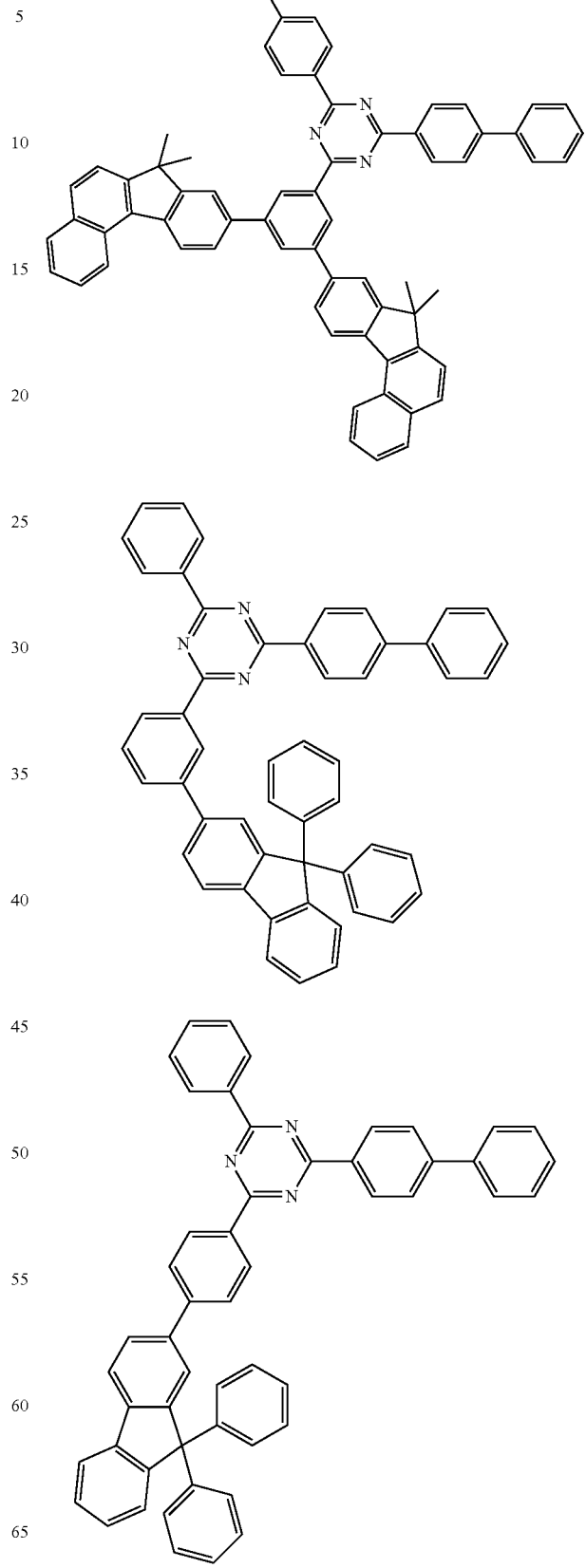

147
-continued
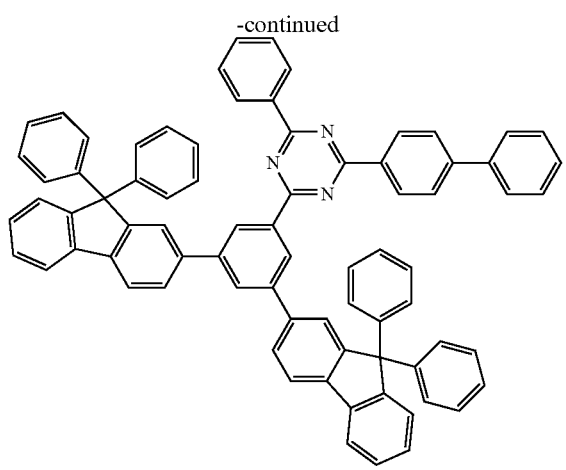
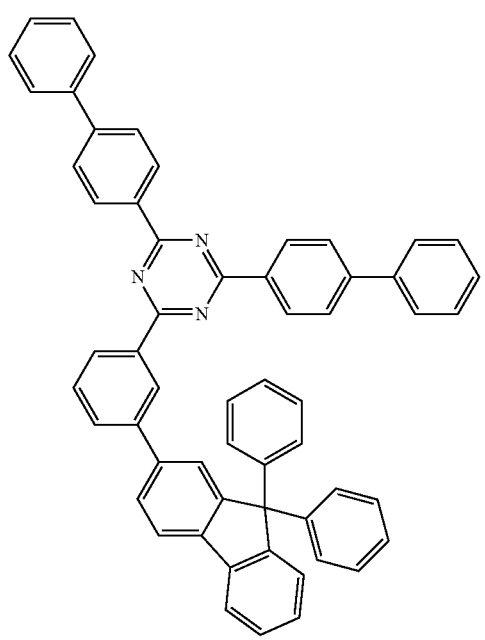
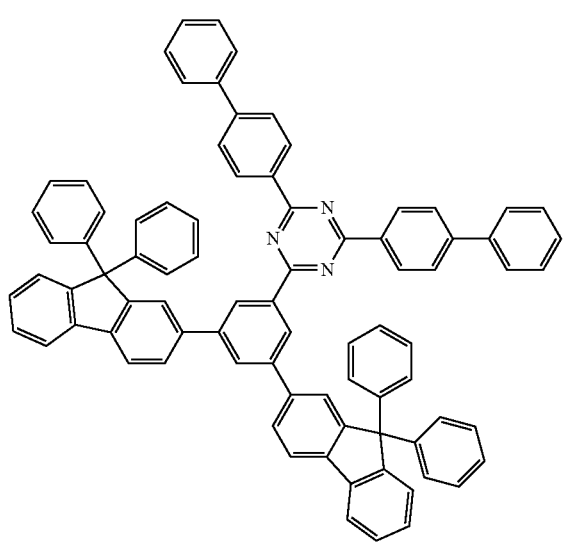
148
-continued
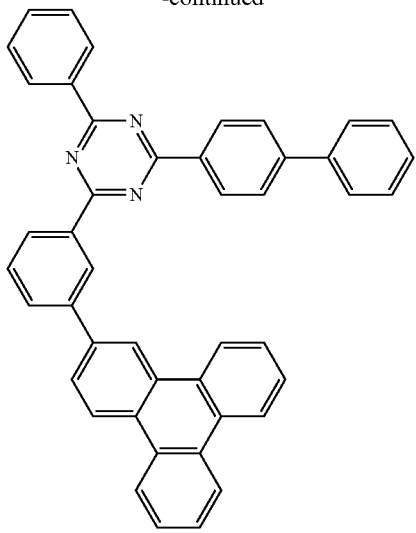
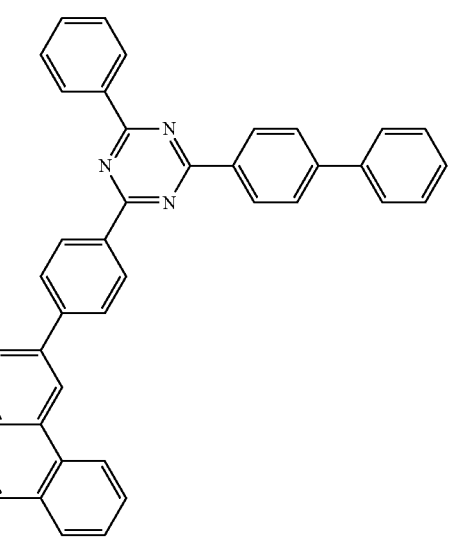
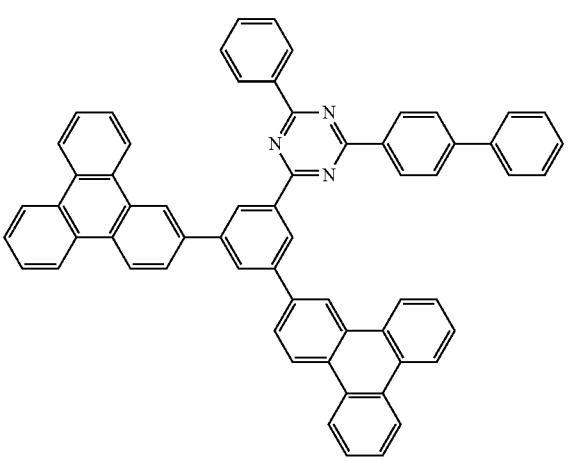

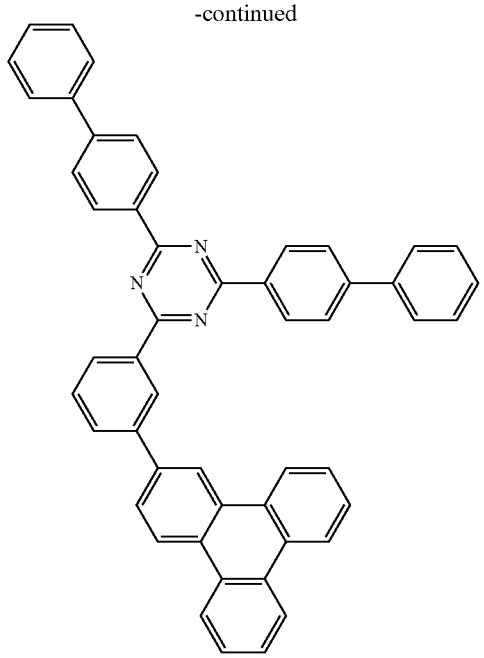
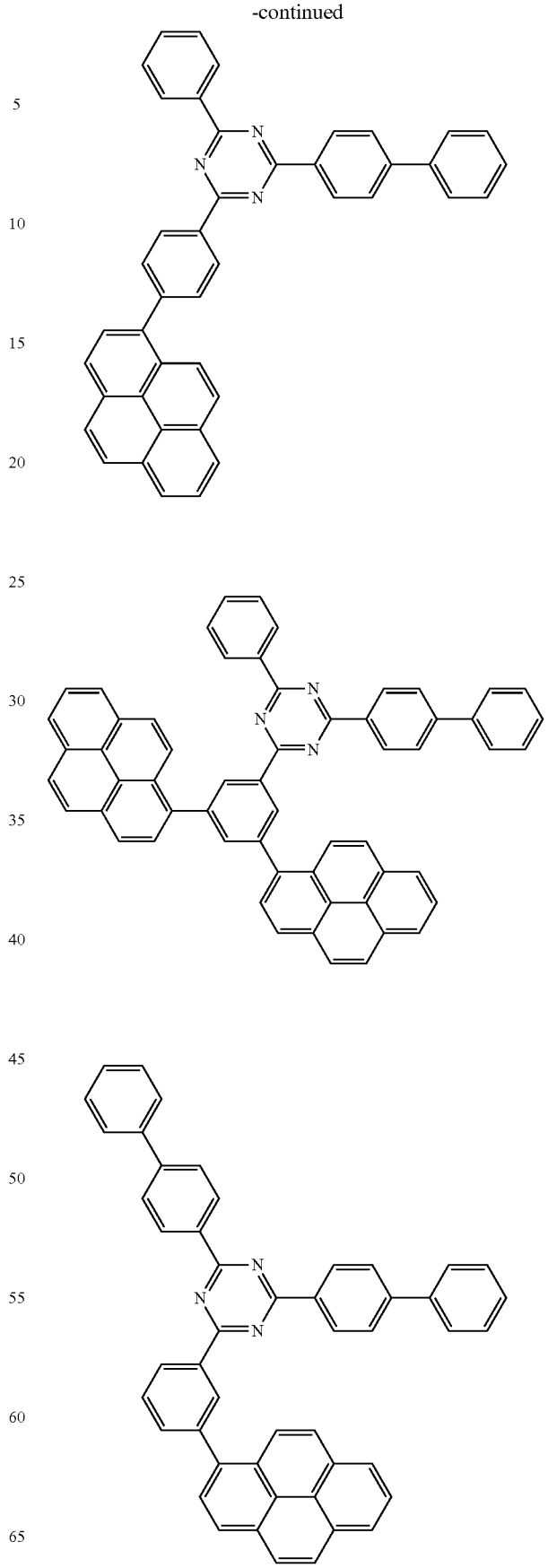

151
-continued
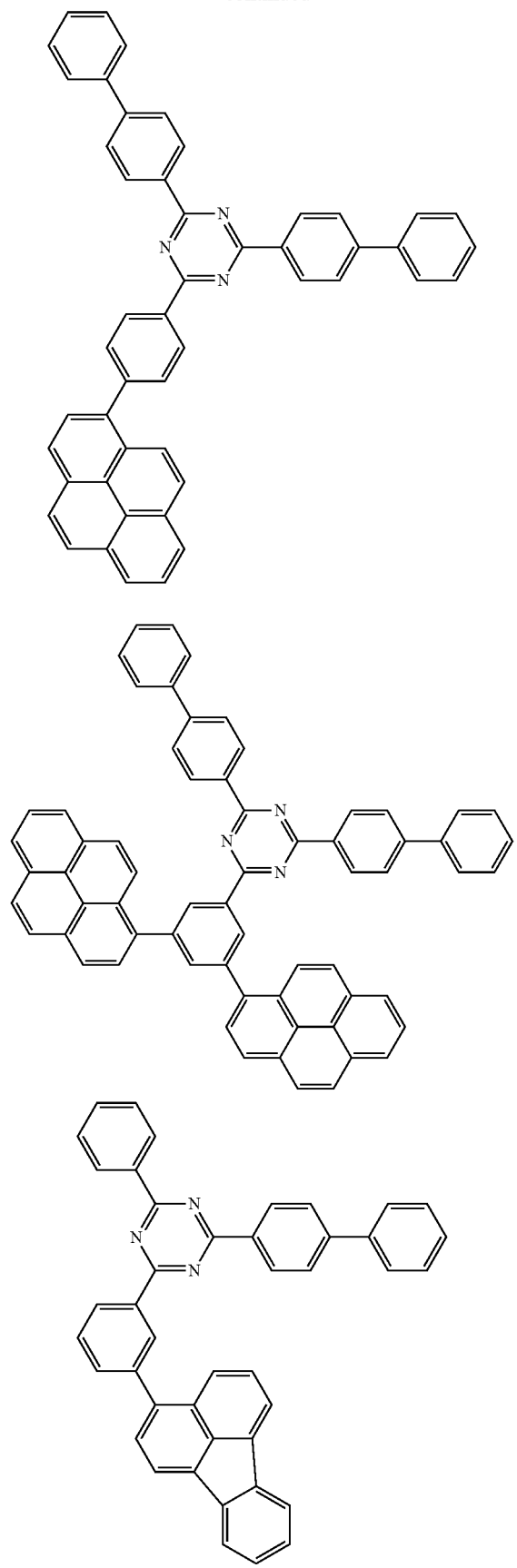
152
-continued
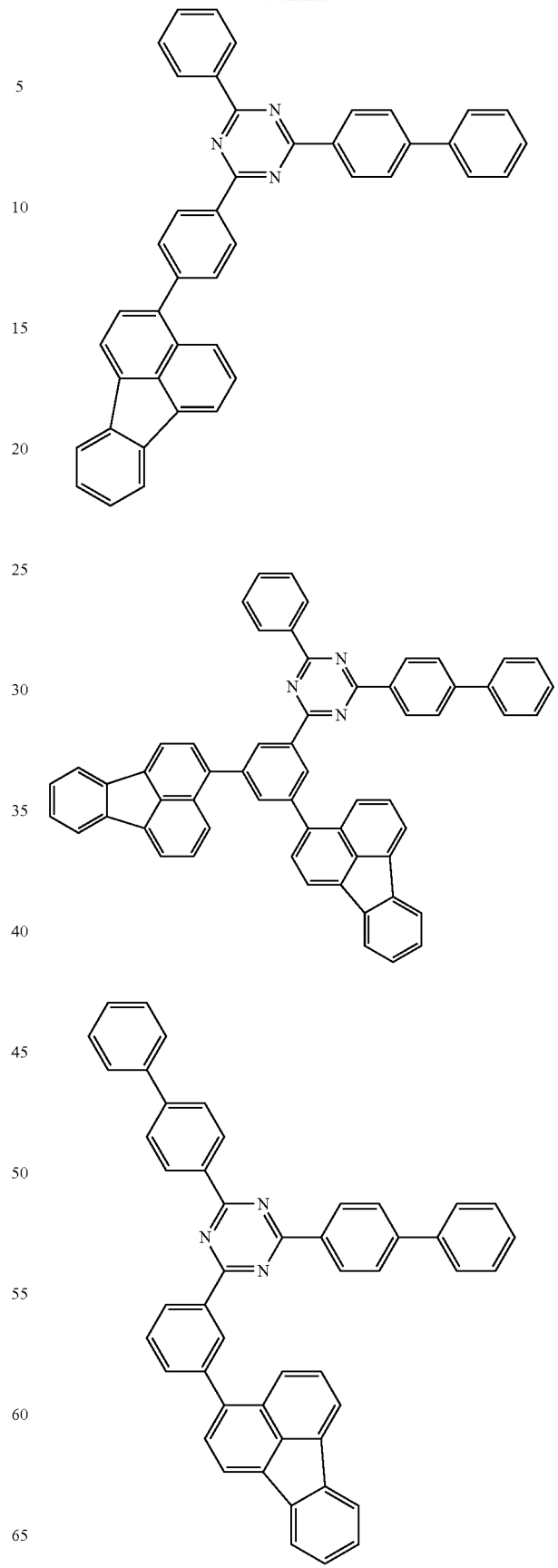

153
-continued
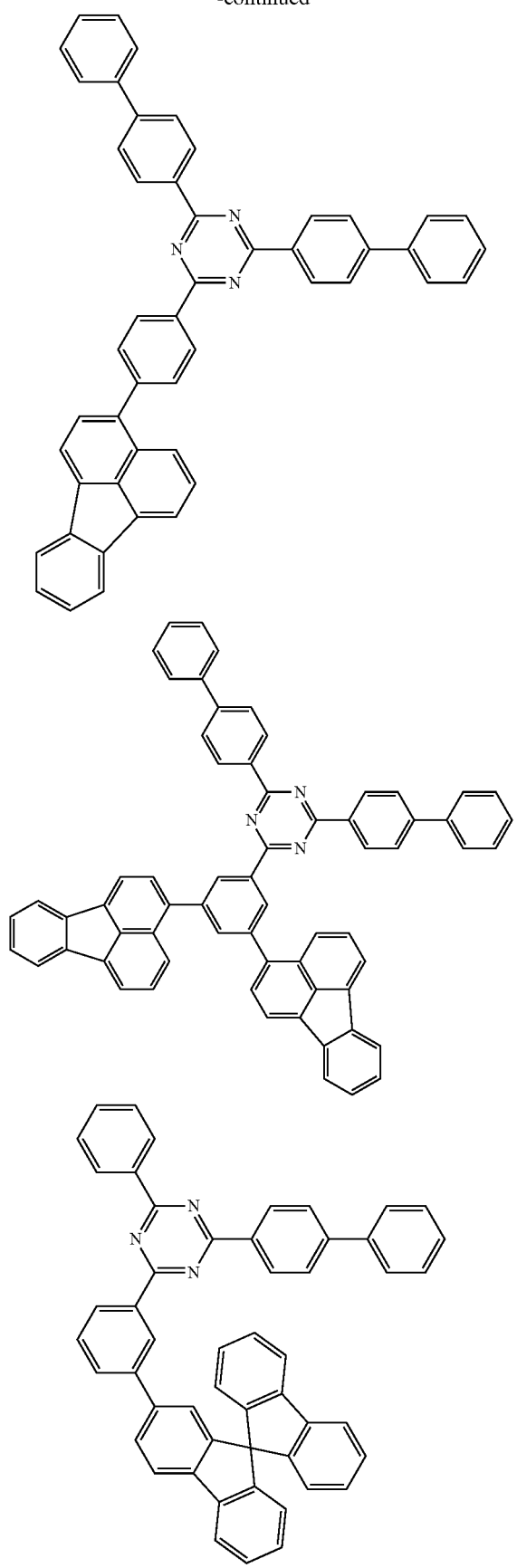
154
-continued

-continued

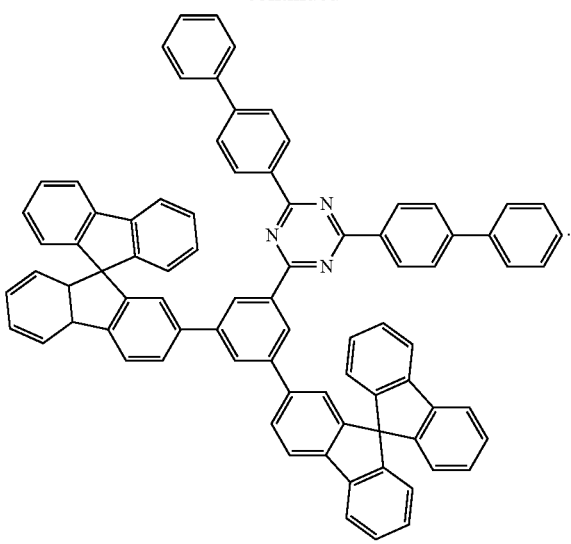 [SMILES: C1=CC2c3ccc(-c4cc(-c5ccc6c(c5)C5(c7ccccc7-c7ccccc75)c5ccccc5-6)cc(-c5nc(-c6ccc(-c7ccccc7)cc6)nc(-c6ccc(-c7ccccc7)cc6)n5)c4)cc3C3(c4ccccc4-c4ccccc43)C2C=C1]

8. The organic light emitting display device of claim 2, wherein the electron transport layer further includes a dopant, and the dopant includes one among an alkali metal, an alkali earth metal, an alkali metal compound, an alkali earth metal compound, an organic complex of alkali metals, or an organic complex of alkali earth metals.

9. An organic light emitting display device comprising:
at least one light emitting part between an anode and a cathode and including at least one organic layer and a light emitting layer,
wherein the at least one organic layer includes an organic compound represented by the following Chemical Formula 1:

[Chemical Formula 1]

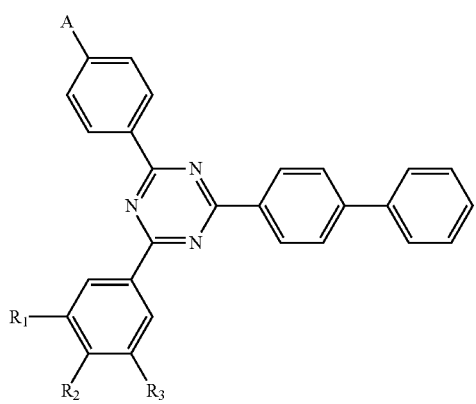

wherein A includes one among hydrogen and a phenyl group, $R_1$ and $R_3$ include independently one among hydrogen and an aryl group of 10 to 30 carbon atoms, $R_2$ includes one among hydrogen and an aryl group of 10 to 30 carbon atoms when A is hydrogen, $R_2$ includes hydrogen when A is phenyl, with at least one among $R_1$ to $R_3$ being an aryl group, except for the case that $R_1$ to $R_3$ are all hydrogen, and wherein the organic compound represented by Chemical Formula 1 excludes the following compounds:

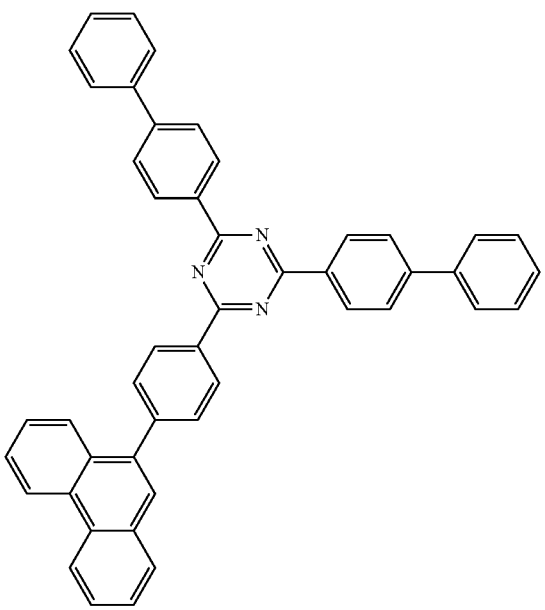

and

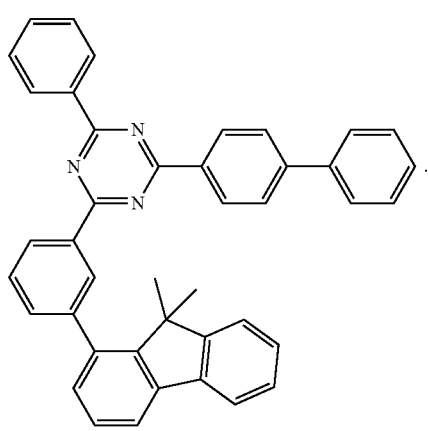

10. The organic light emitting display device of claim 9, wherein $R_1$ to $R_3$ include independently one among the following compounds:

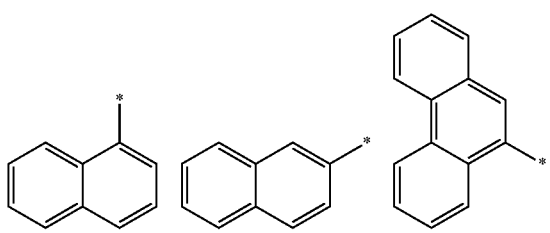

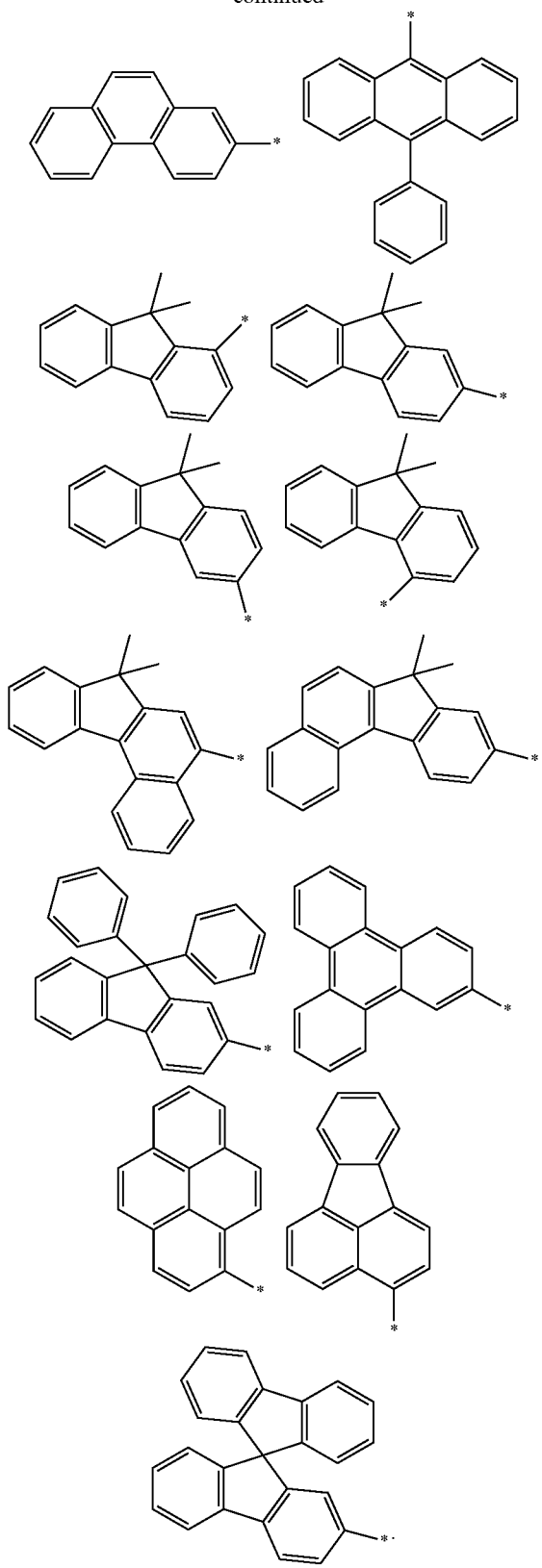
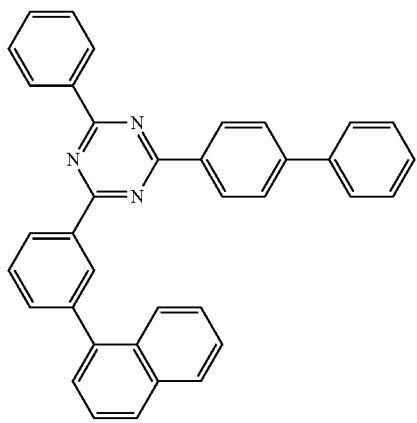
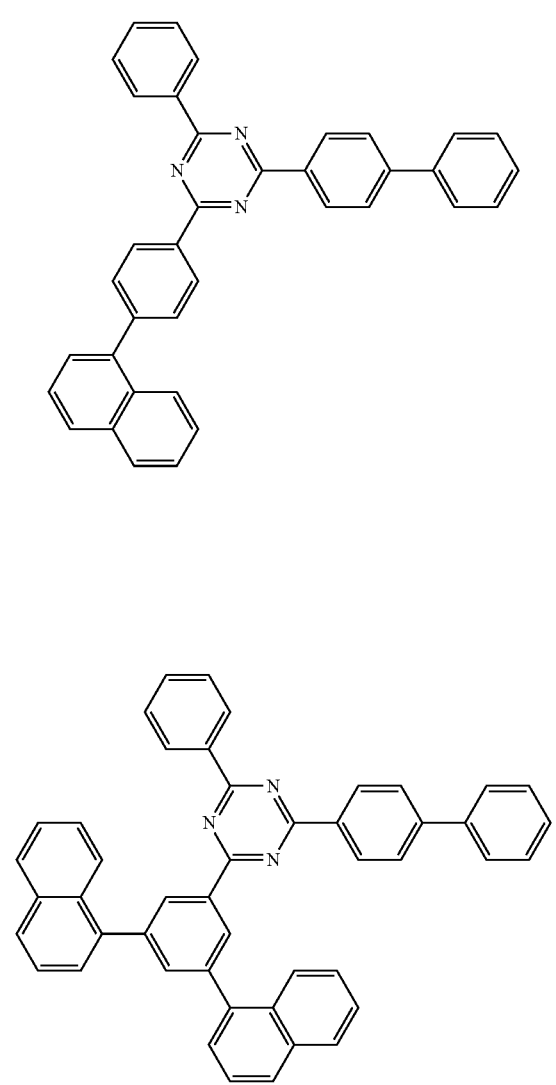
11. The organic light emitting display device of claim 9, wherein the organic compound represented by Chemical Formula 1 includes one among the following compounds:

159
-continued
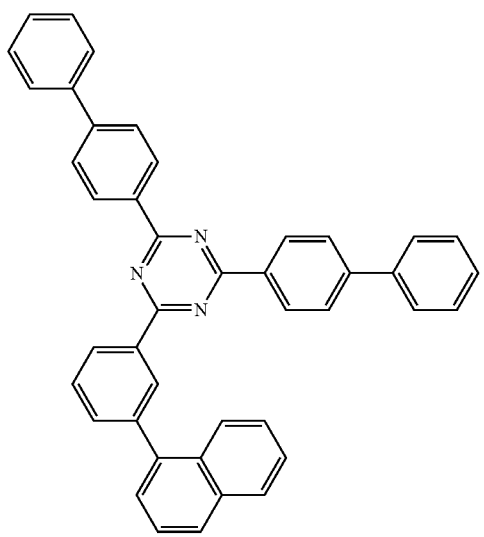
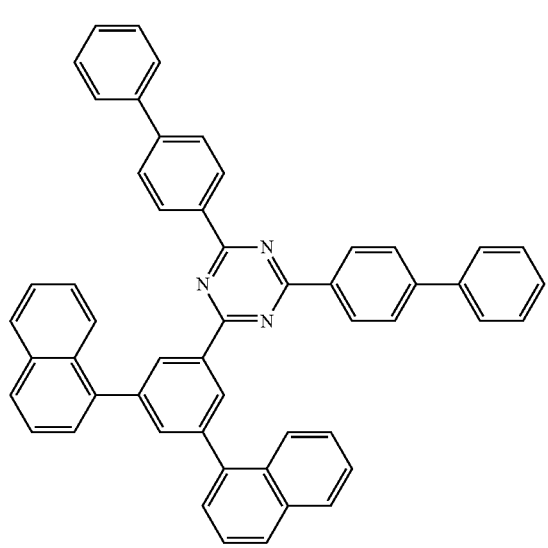
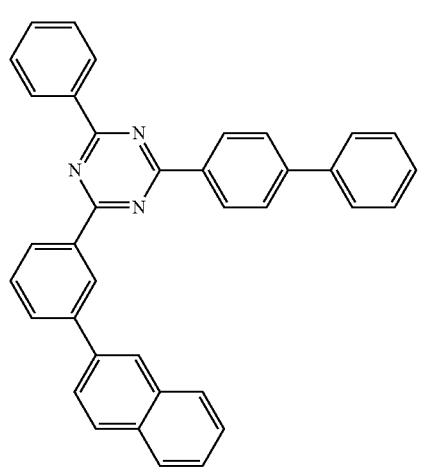
160
-continued
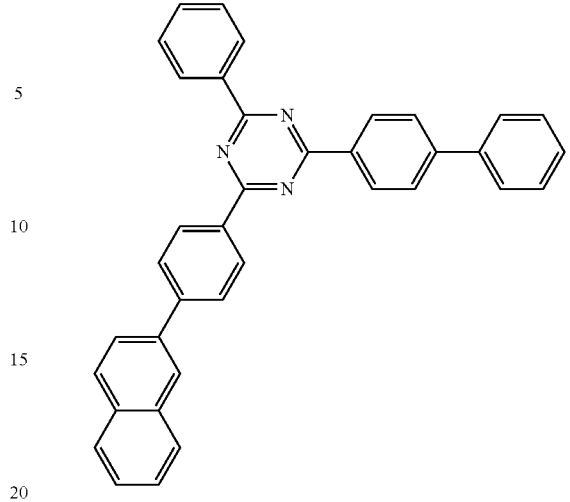
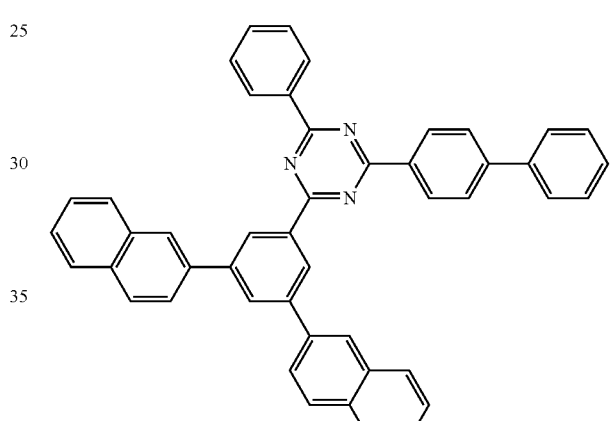

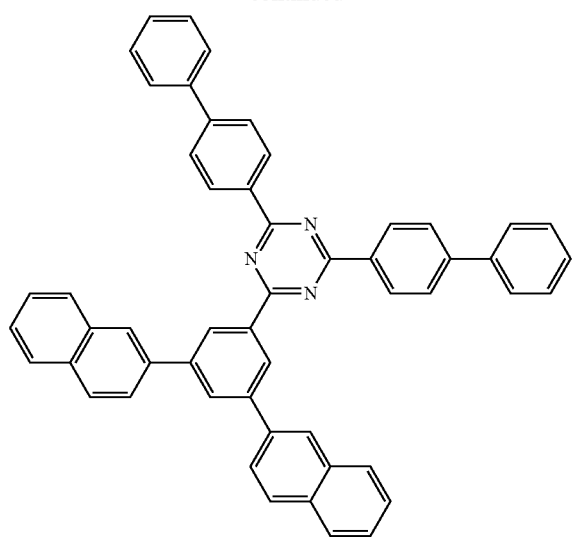
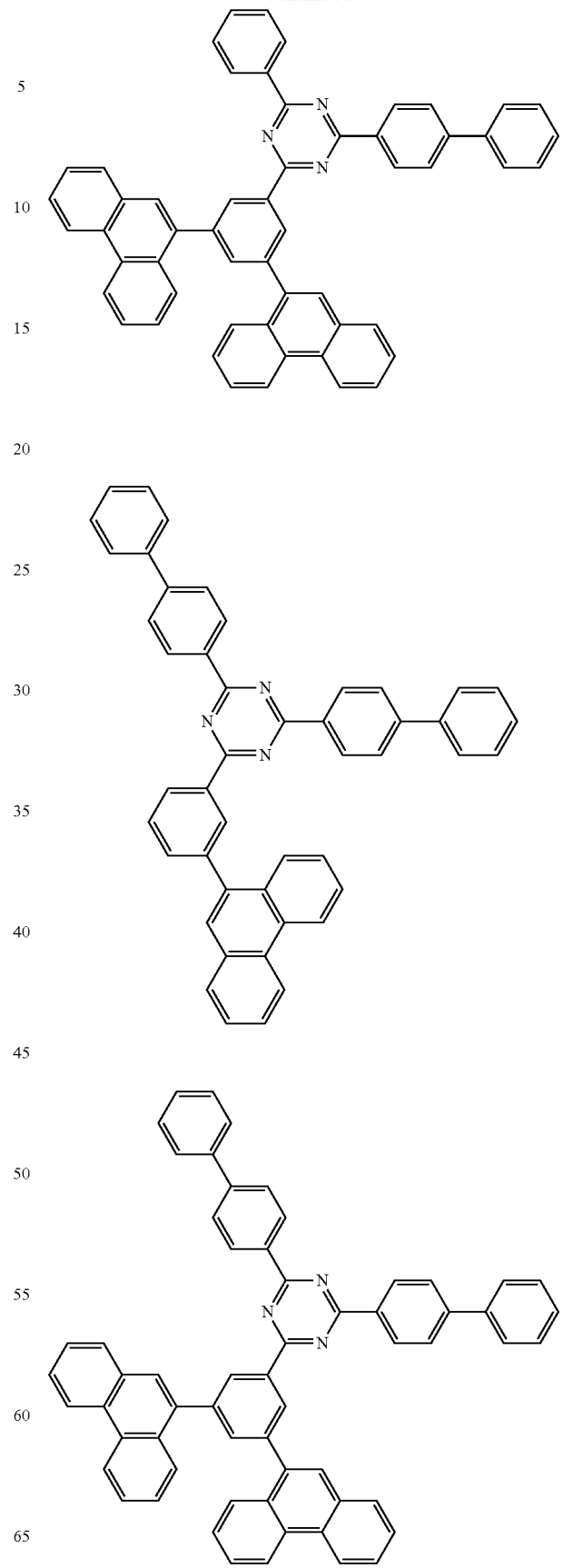

163
-continued
164
-continued
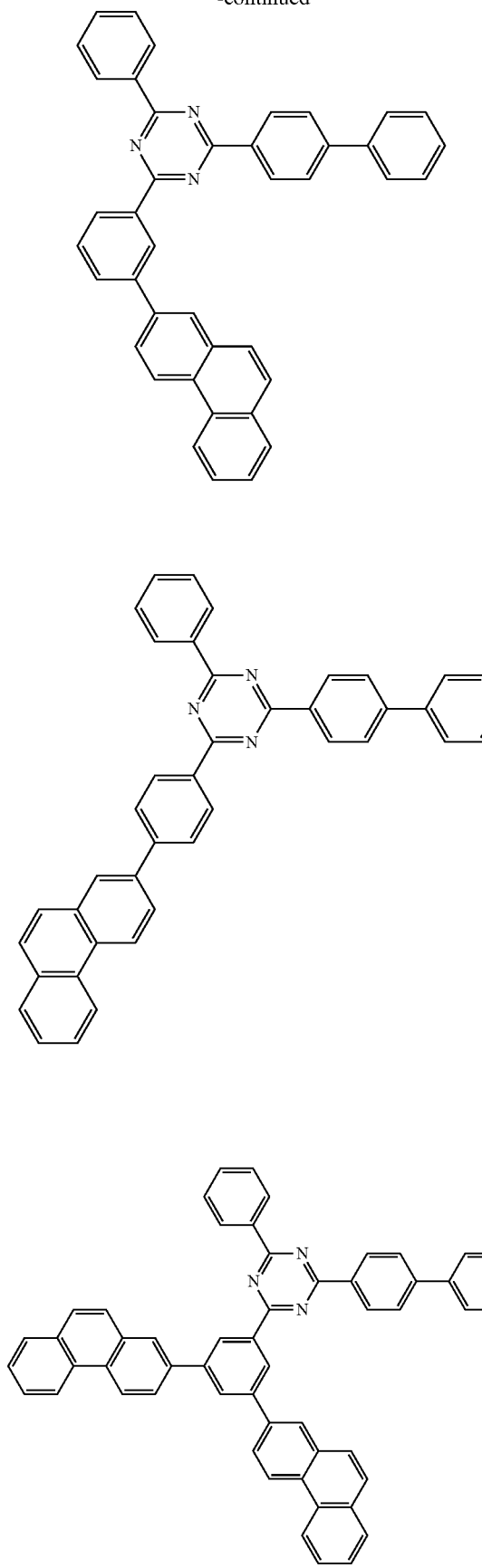
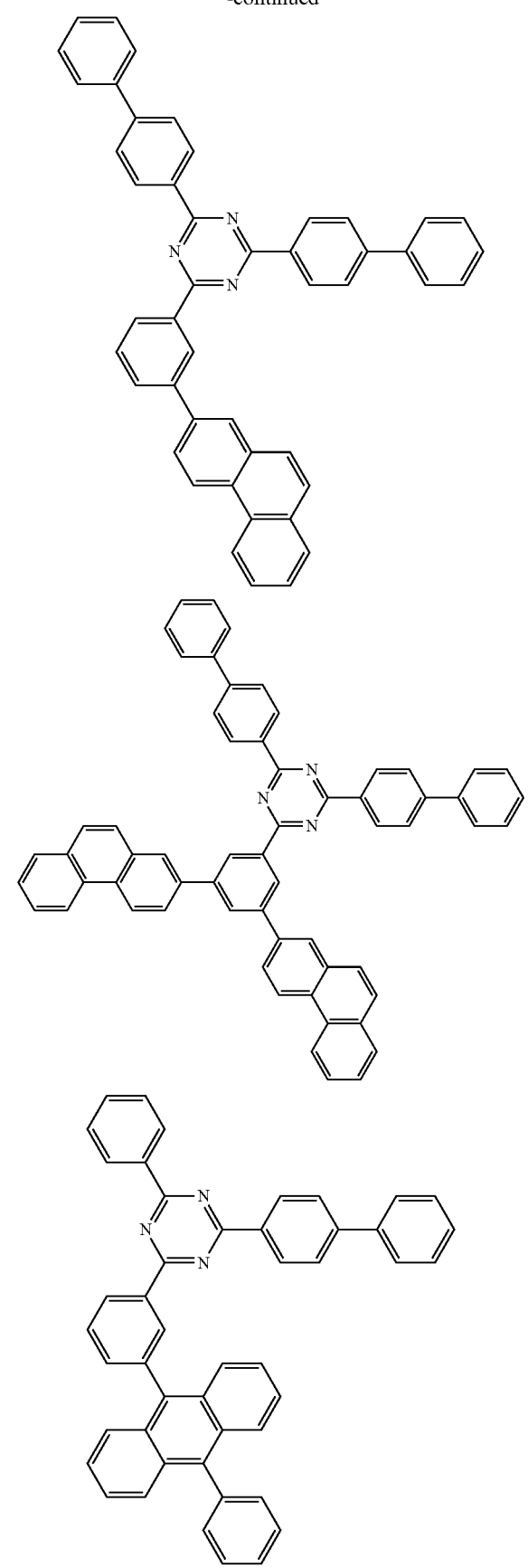

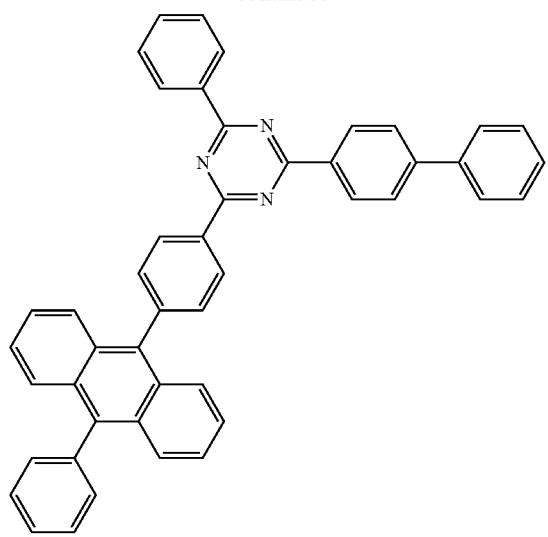
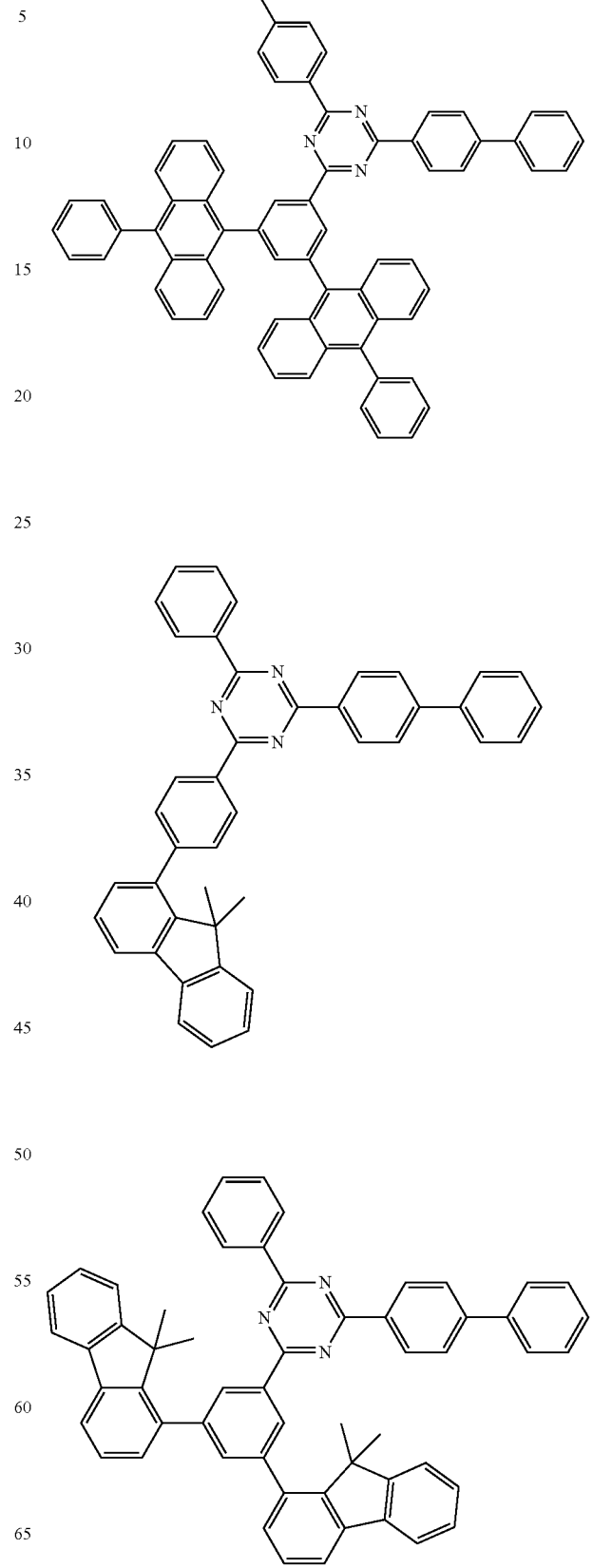

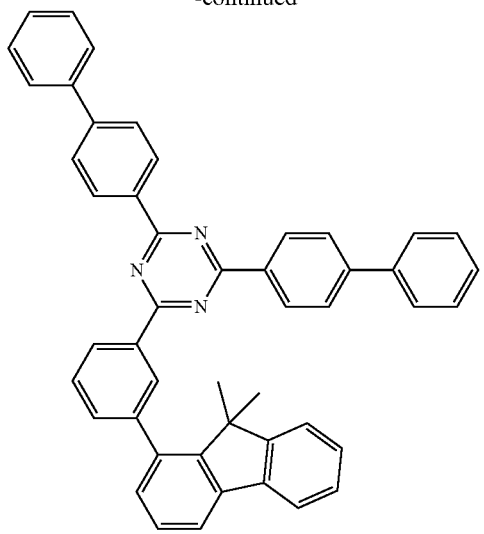
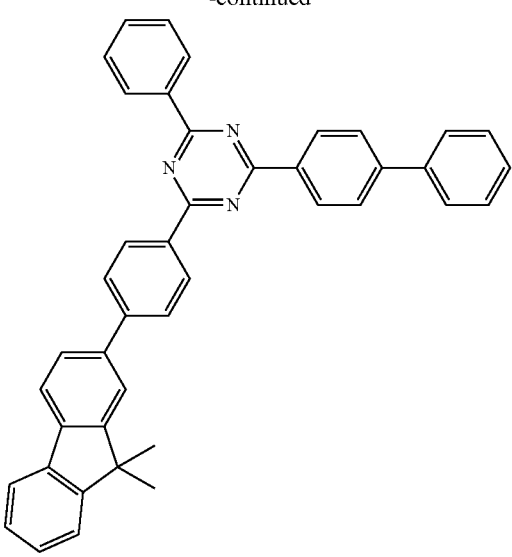
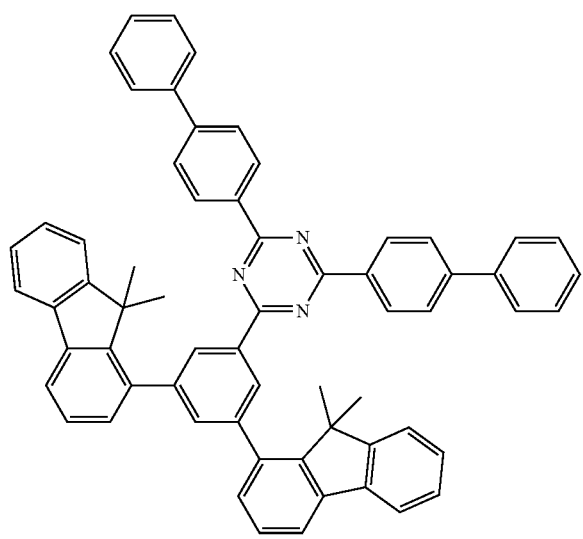
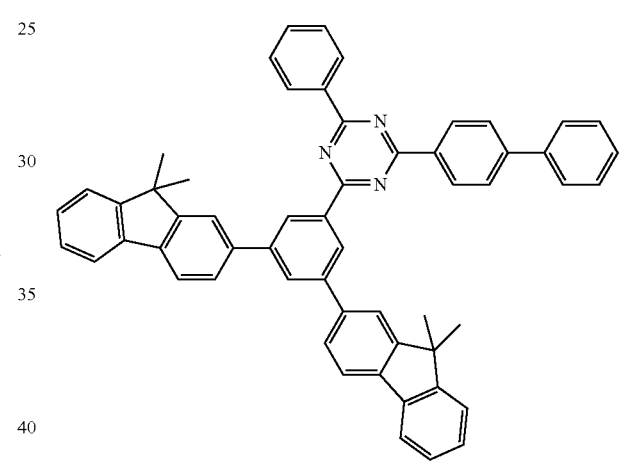
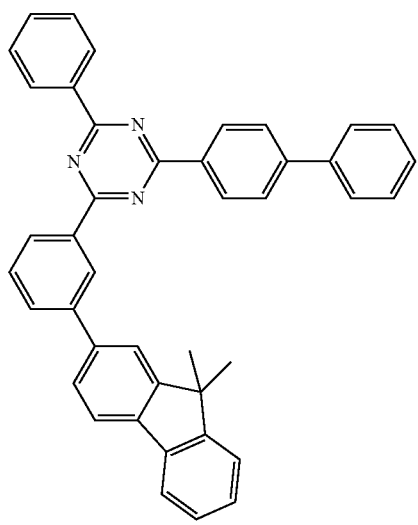
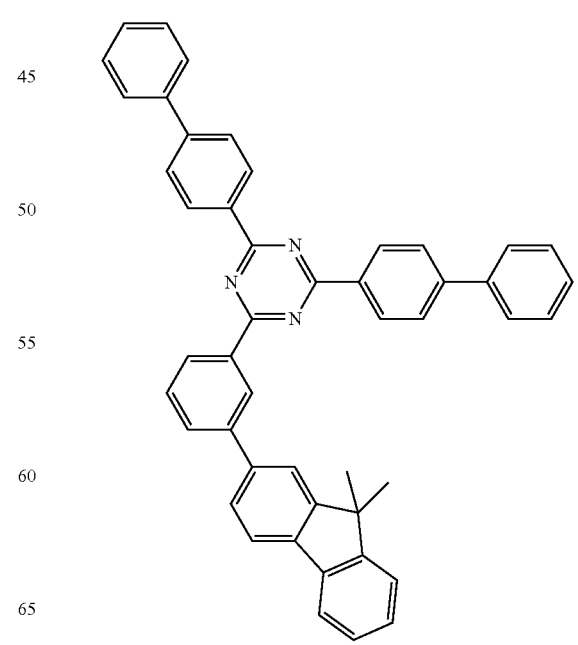

169
-continued
170
-continued
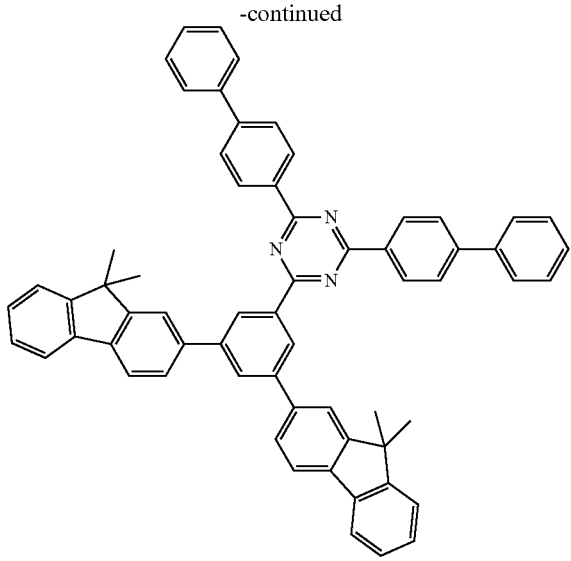
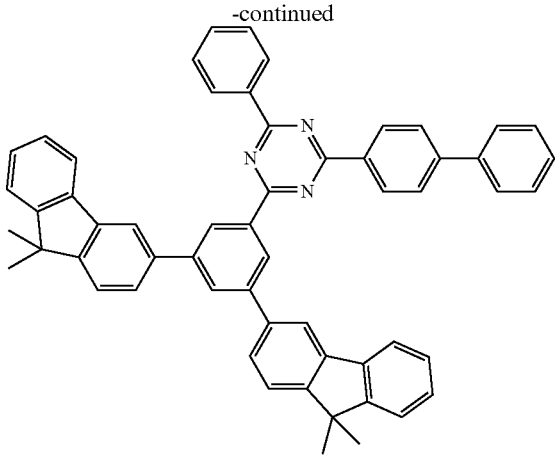
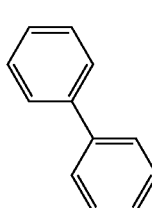
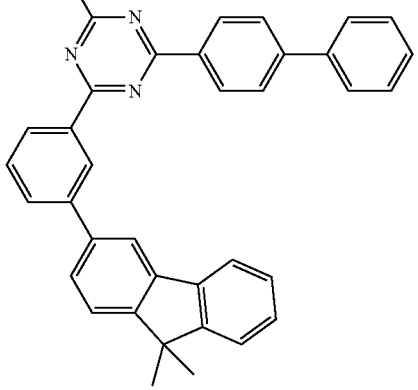
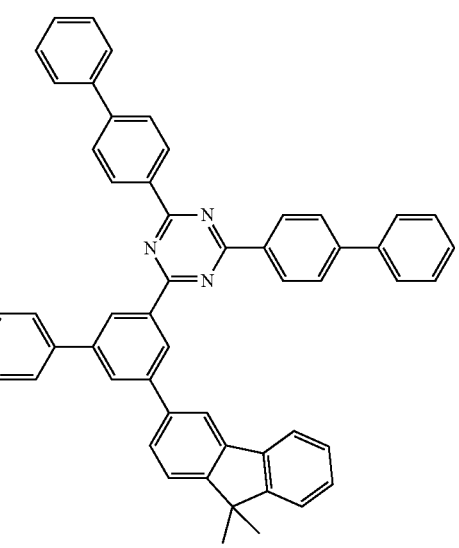

171
-continued
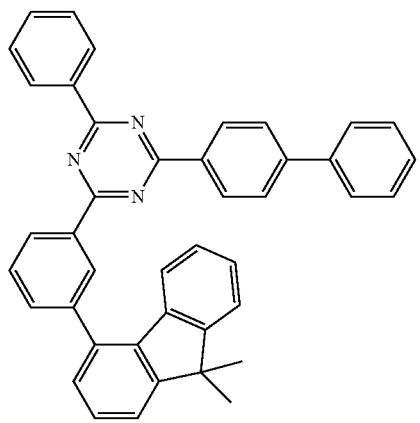
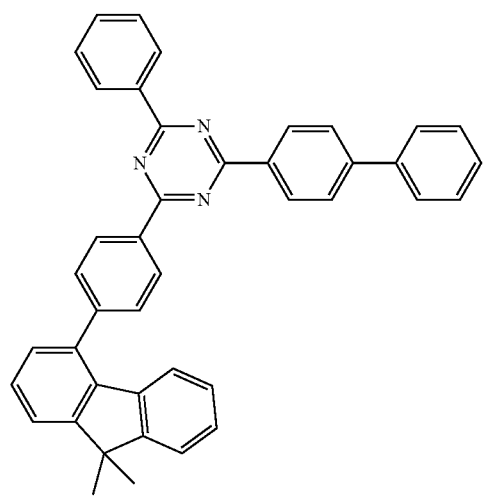
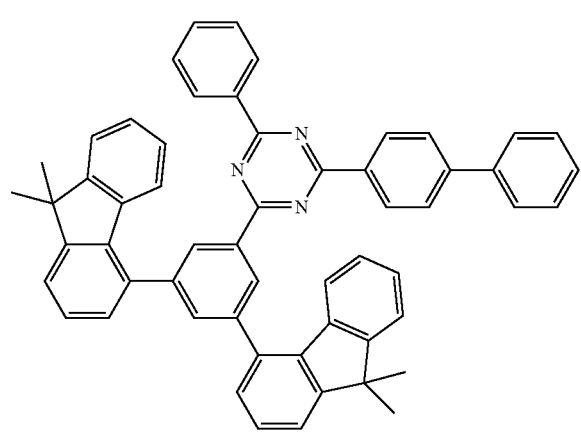
172
-continued
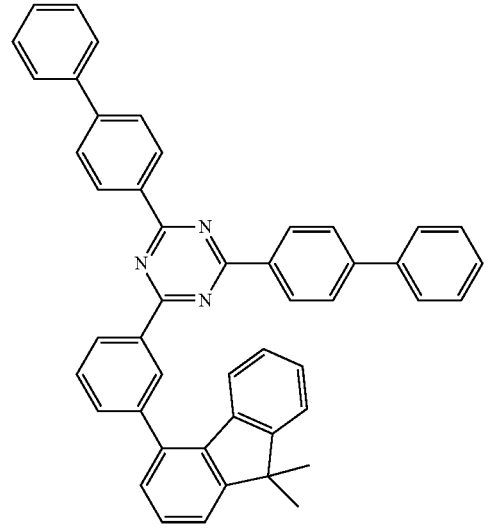
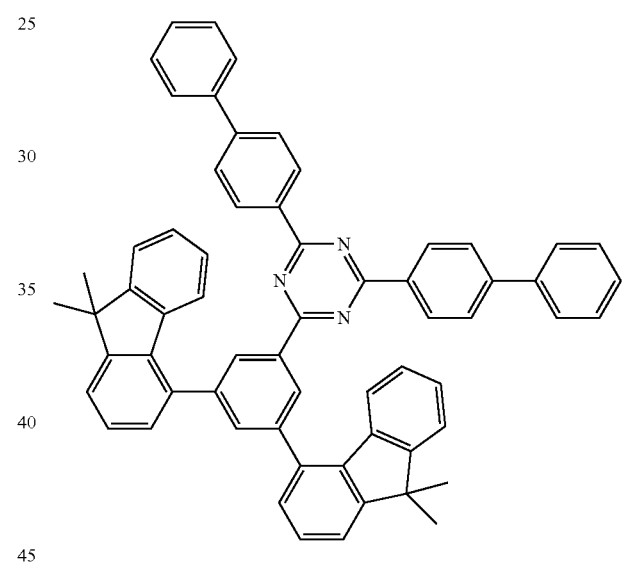
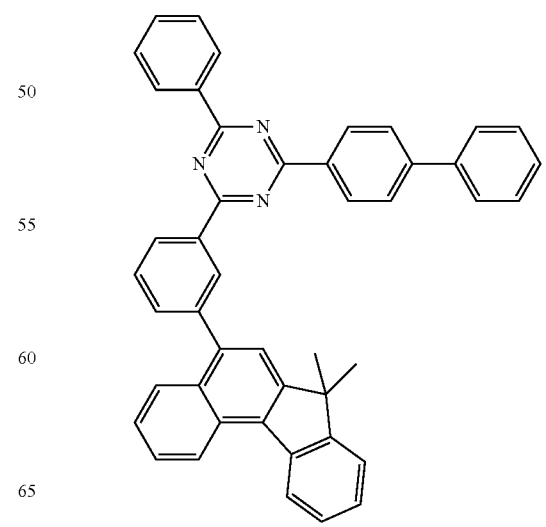

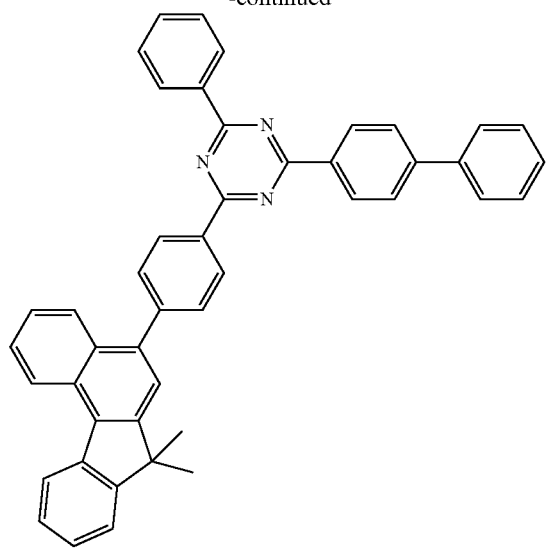
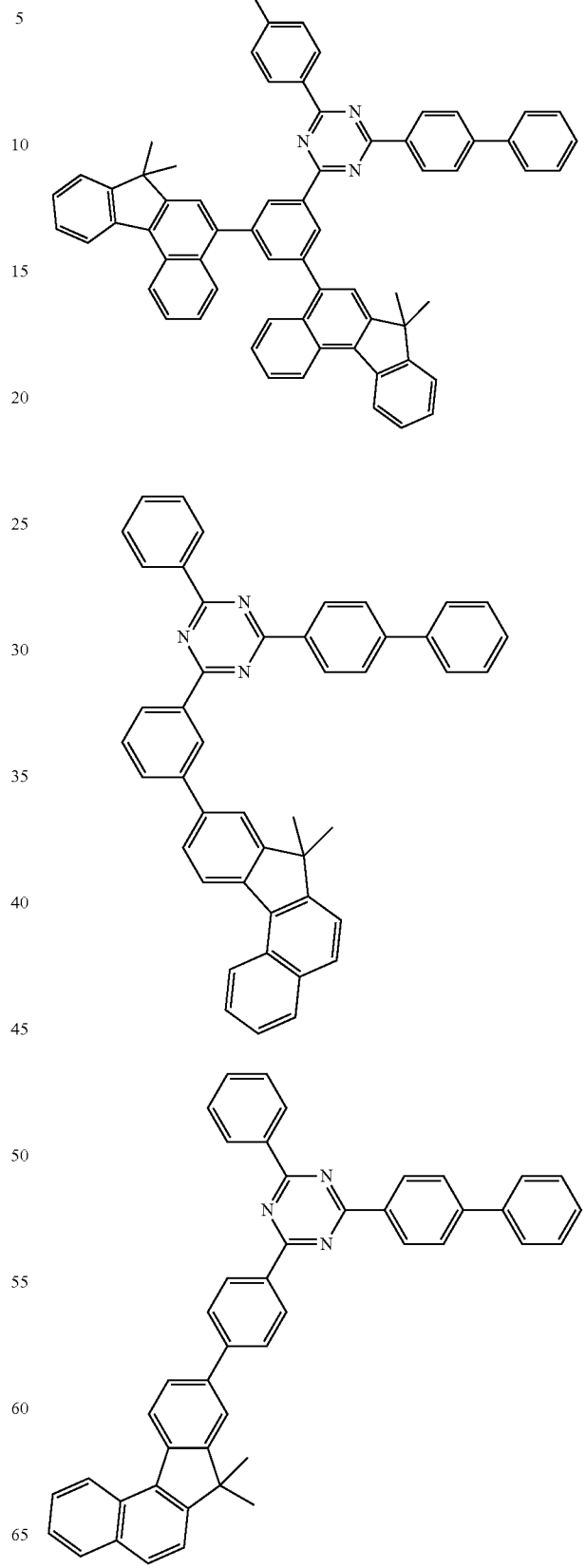

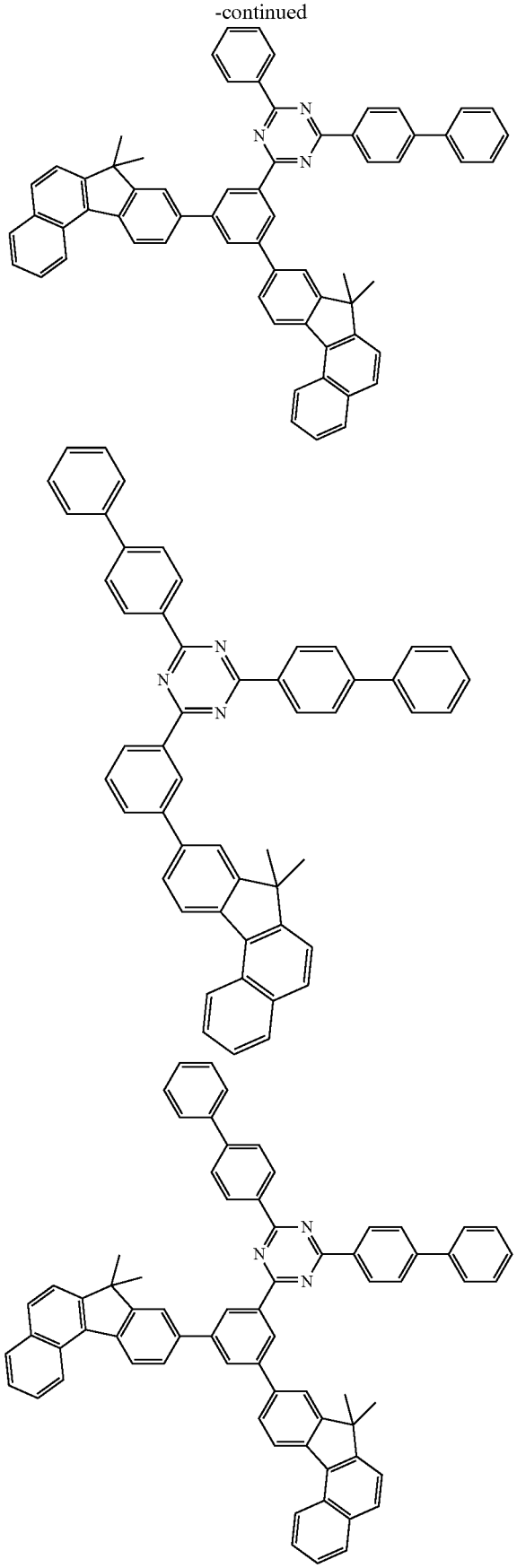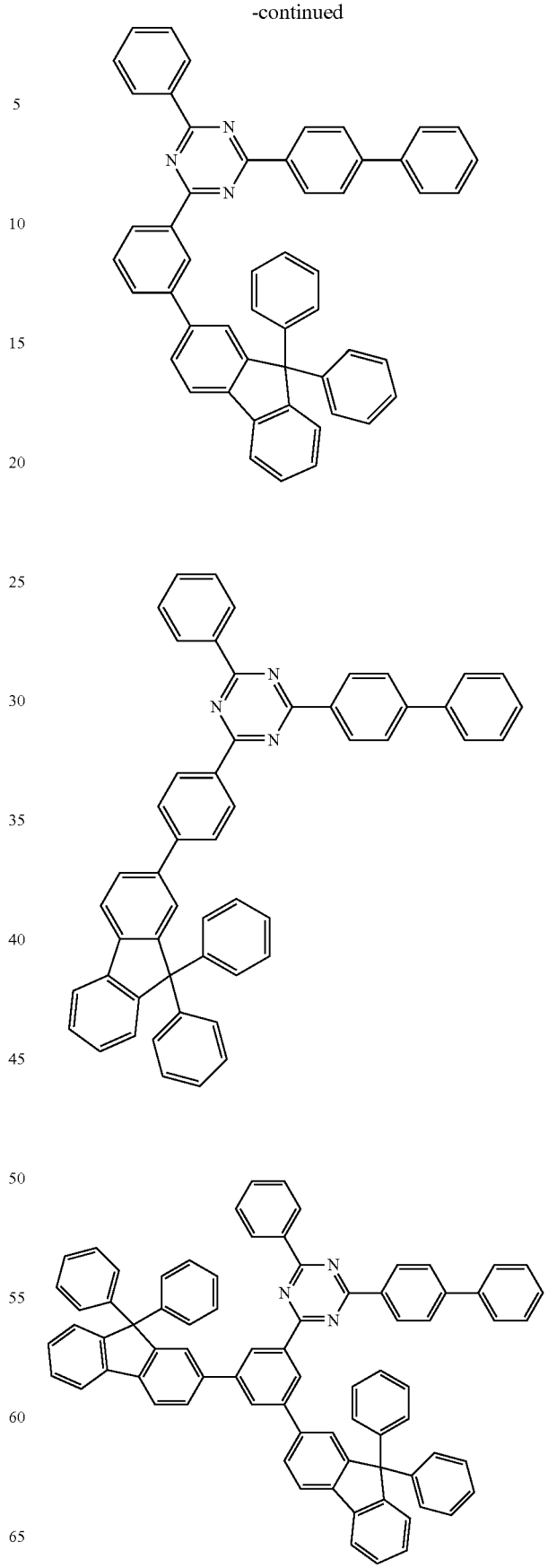

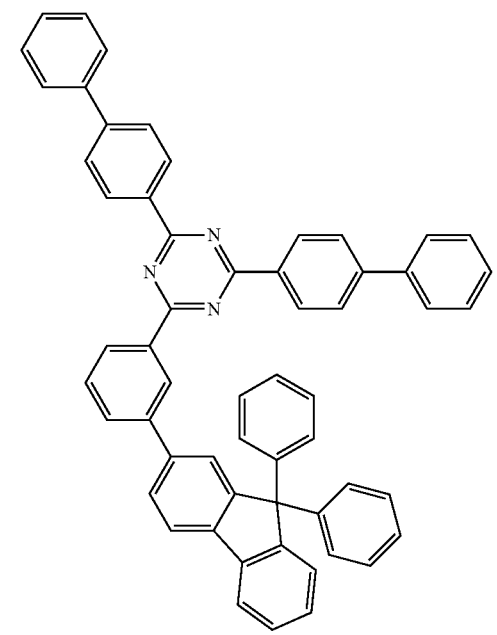
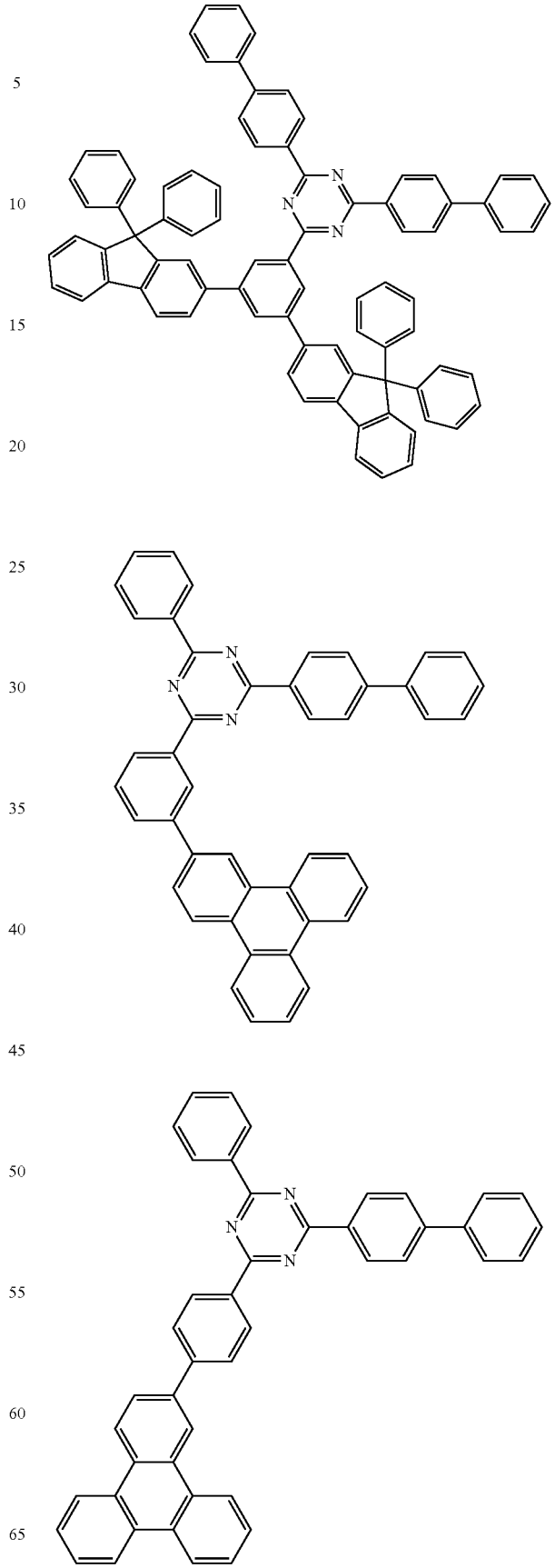

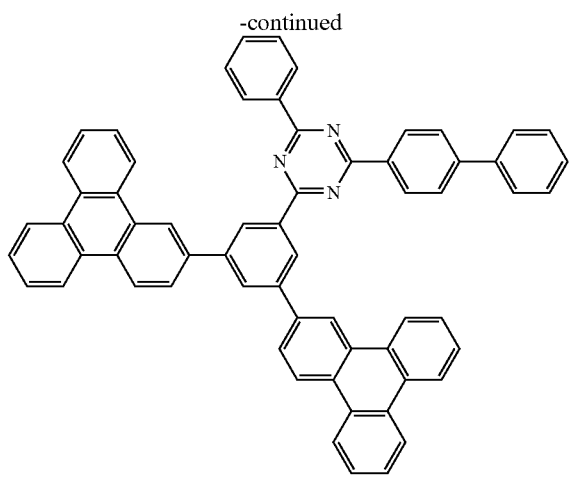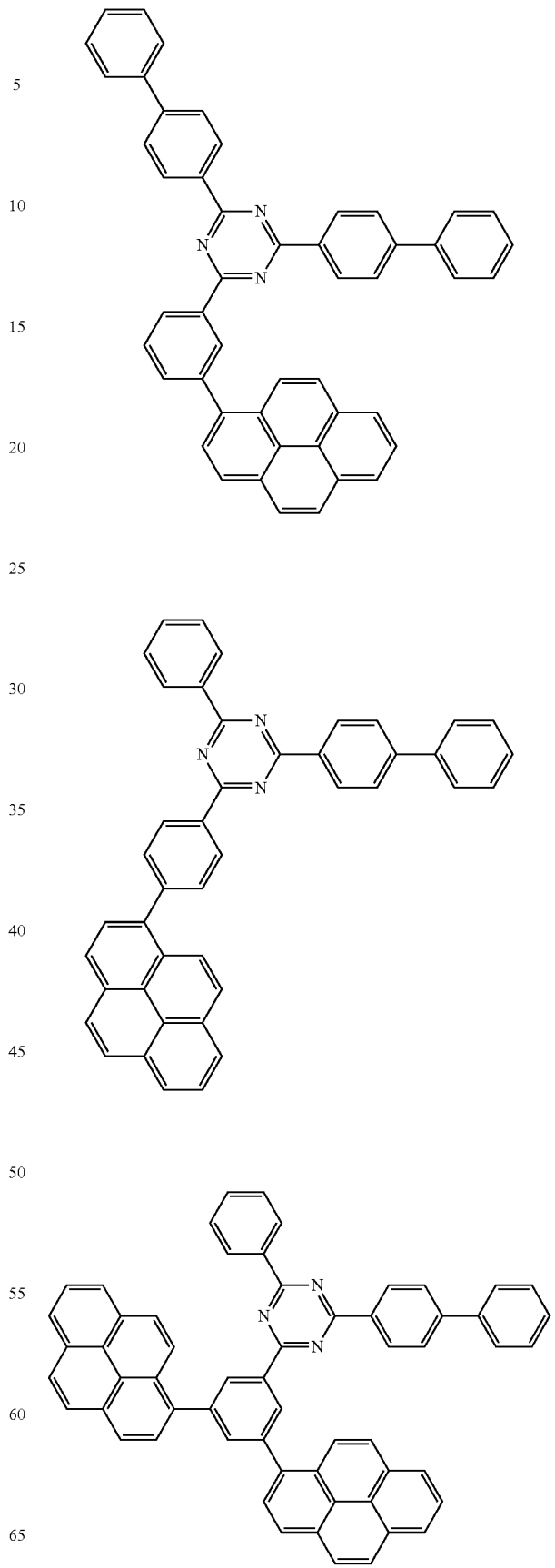

181
-continued
182
-continued
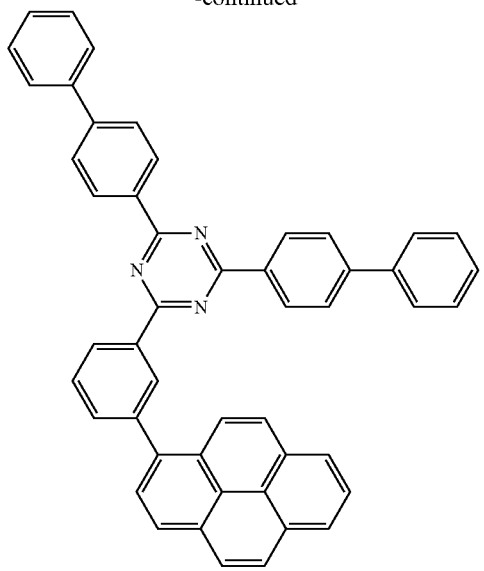
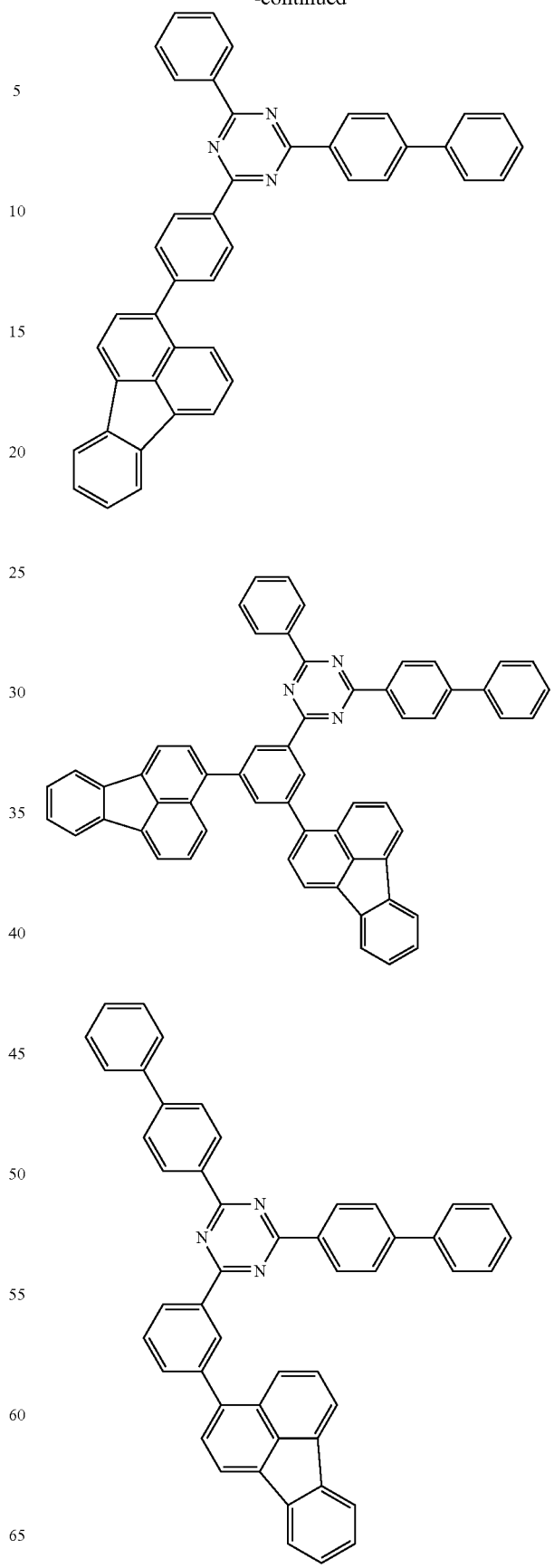

183
-continued
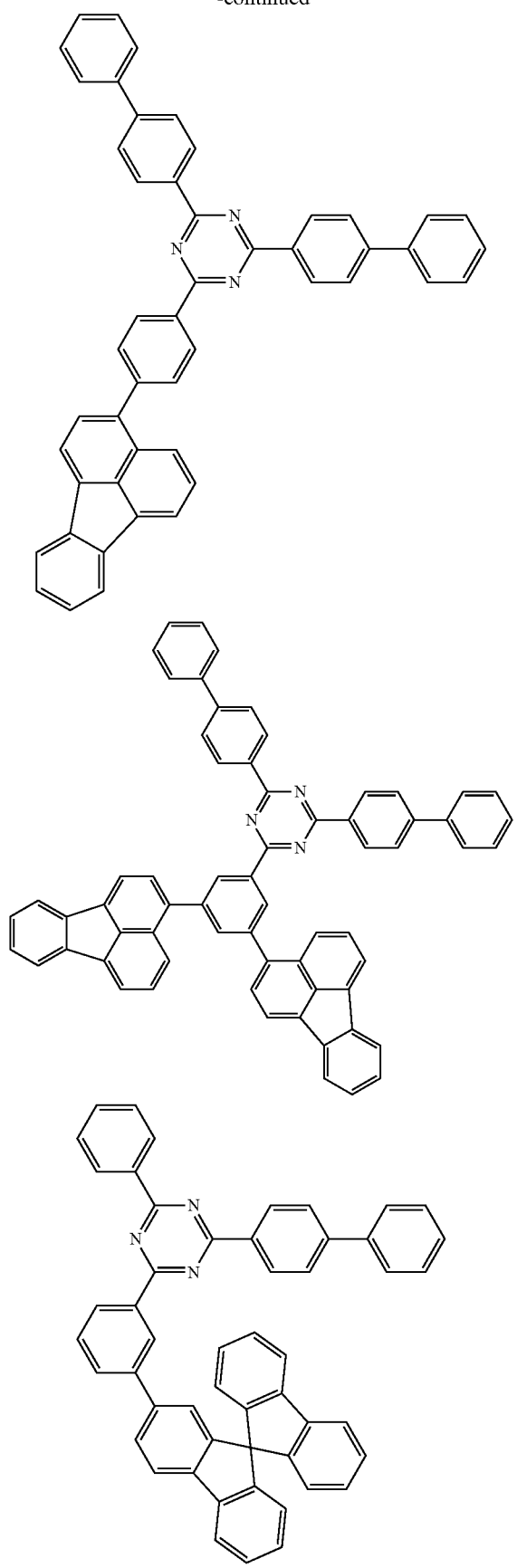
184
-continued
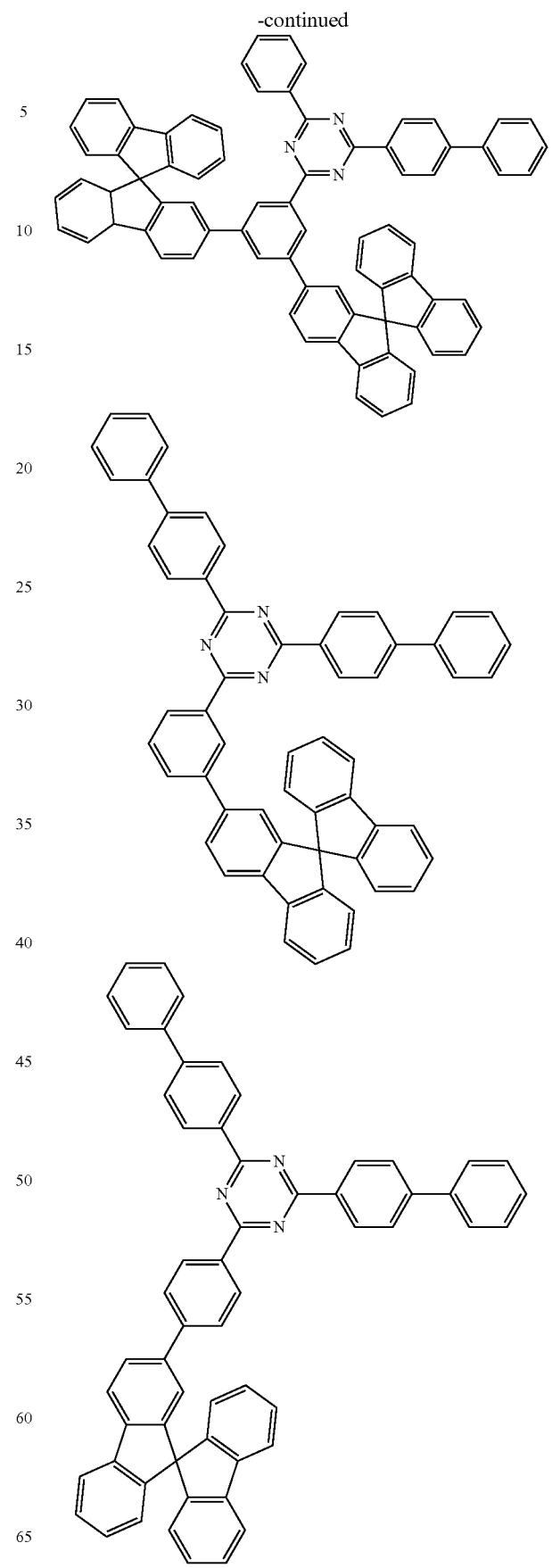

-continued
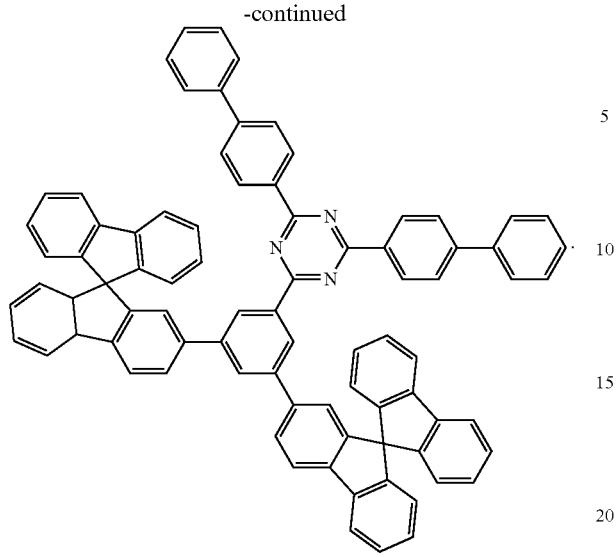
* * * * *